United States Patent [19]

Koenck et al.

[11] Patent Number: 4,709,202

[45] Date of Patent: * Nov. 24, 1987

[54] BATTERY POWERED SYSTEM

[75] Inventors: Steven E. Koenck; David C. Hacker, both of Cedar Rapids, Iowa

[73] Assignee: Norand Corporation, Cedar Rapids, Iowa

[*] Notice: The portion of the term of this patent subsequent to Jun. 19, 2001 has been disclaimed.

[21] Appl. No.: 876,194

[22] Filed: Jun. 19, 1986

Related U.S. Application Data

[60] Division of Ser. No. 797,235, Nov. 12, 1985, which is a continuation-in-part of Ser. No. 612,588, May 21, 1984, Pat. No. 4,553,081, which is a continuation-in-part of Ser. No. 385,830, Jun. 7, 1982, Pat. No. 4,455,523.

[51] Int. Cl.$^4$ ............................................. H02J 7/00
[52] U.S. Cl. ....................................... 320/43; 320/35; 320/39; 320/48; 340/636
[58] Field of Search .................. 320/2, 35, 39, 43, 48; 340/636

[56] References Cited

U.S. PATENT DOCUMENTS

| | | | |
|---|---|---|---|
| 3,771,132 | 11/1973 | Biewer | 340/365 |
| 3,823,388 | 7/1974 | Chadima et al. | 340/365 |
| 4,001,550 | 1/1977 | Schatz | |
| 4,127,803 | 11/1978 | Etienne | 320/2 |
| 4,140,957 | 2/1979 | Rapp | 320/2 |
| 4,203,103 | 5/1980 | Osada | 340/636 |
| 4,277,837 | 7/1981 | Stuckert | 364/900 |
| 4,308,492 | 12/1981 | Mori | 320/35 |
| 4,455,523 | 6/1984 | Koenck | 320/48 |
| 4,553,081 | 11/1985 | Koenck | 320/39 |

OTHER PUBLICATIONS

Norand Corporation Specification Sheet for Norand 101-XL Portable Data System (two sides), 1978.
Norand Corporation Brochure re Norand "Sprint 100" Portable Order Entry Terminal (Four Sides), 1979.
Norand Corporation Specification Sheet for Norand 101XL "Alpha-1" Portable Data System (two sides), 1980.

*Primary Examiner*—Patrick R. Salce
*Assistant Examiner*—Anita M. Ault
*Attorney, Agent, or Firm*—Neuman, Williams, Anderson & Olson

[57] ABSTRACT

In an exemplary embodiment, a battery conditioning system monitors battery conditioning and includes a memory for storing data based thereon; for example, data may be stored representative of available battery capacity as measured during a deep discharge cycle. With a microprocessor monitoring battery operation of a portable unit, a measure of remaining battery capacity can be calculated and displayed. Where the microprocessor is permanently secured to the battery so as to receive operating power therefrom during storage and handling, the performance of a given battery in actual use can be accurately judged since the battery system can itself maintain a count of accumulated hours of use and other relevant parameters. Where an embodiment includes a main battery and a backup battery, the voltage of each may be individually measured, and each may be conditioned. Battery capacity of each may be measured. In a unique low voltage sensing circuit applicable to power sources generally, an automatic voltage regulator may itself sense a low power condition without requiring additional precision components. As an example only, such detected low power condition may be utilized to effect switch over to a backup battery or other auxiliary power supply.

80 Claims, 19 Drawing Figures

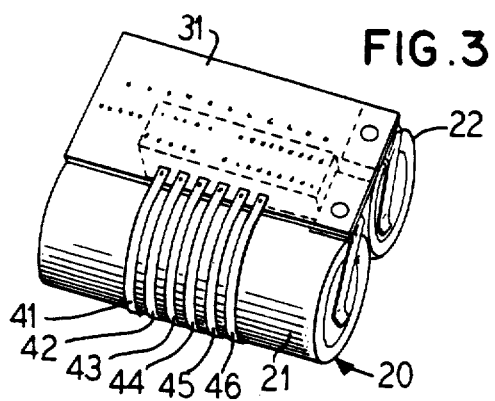
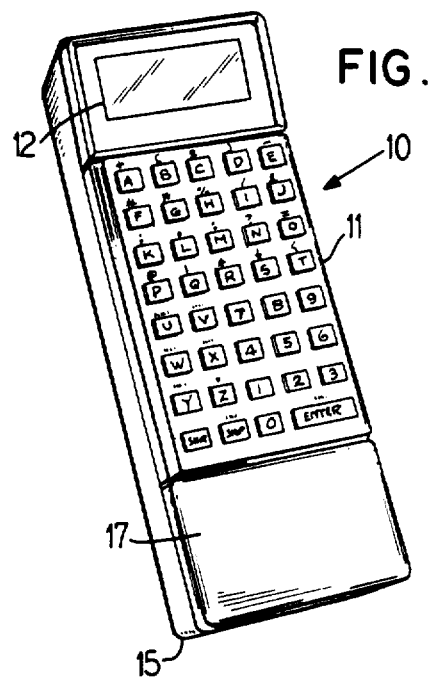
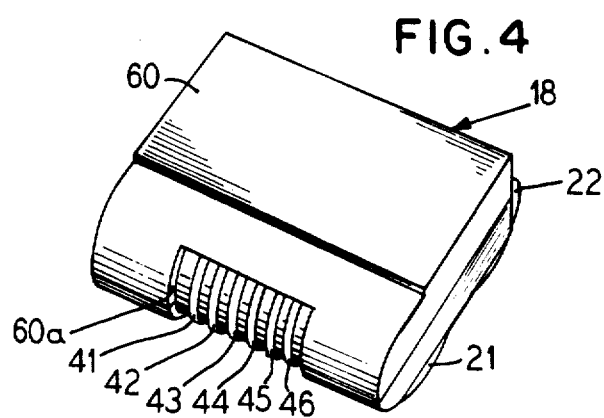
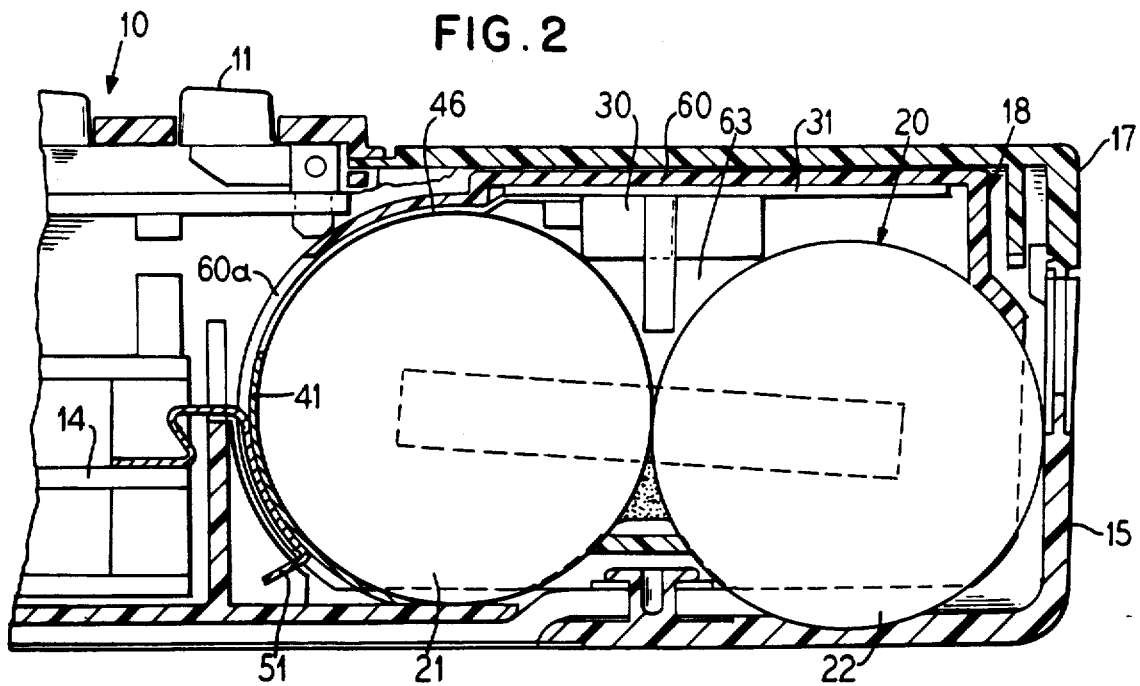

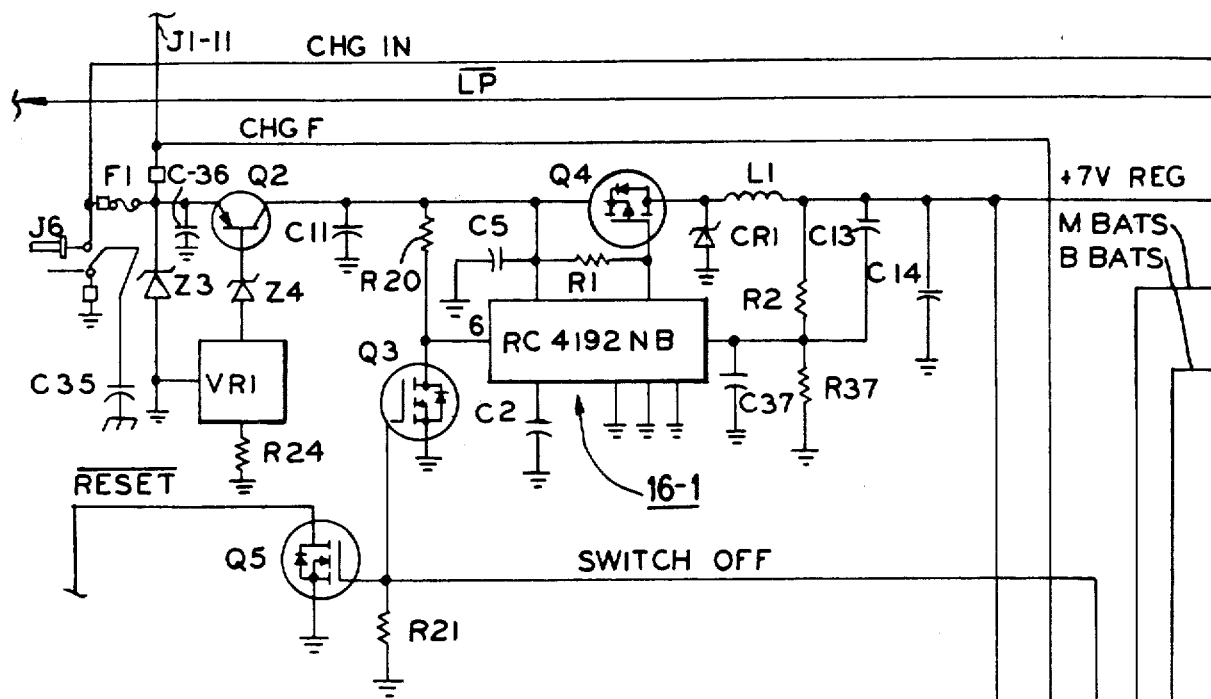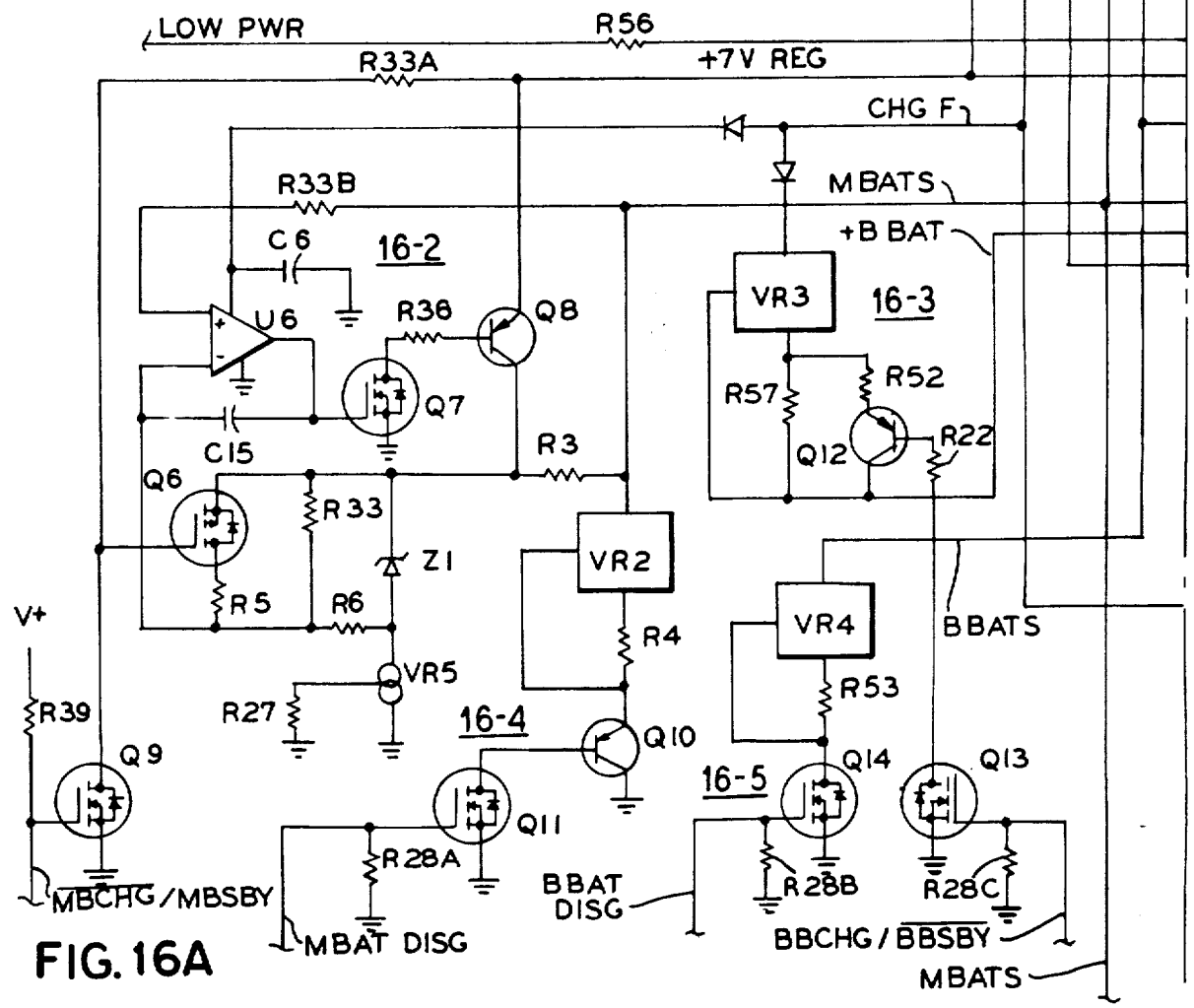
FIG. 16A

BATTERY POWERED SYSTEM

This application is a division of Ser. No. 797,235 filed 11/12/85; which is a continuation-in-part of Ser. No. 612,588, filed May 21, 1984, now U.S. Pat. No. 4,553,081, issued Nov. 12, 1985; which in turn is a continuation-in-part of Ser. No. 385,830 filed June 7, 1982, now U.S. Pat. No. 4,455,523, issued June 19, 1984. The disclosure of these patents is hereby incorporated by reference in their entirety.

BACKGROUND OF THE INVENTION

The present invention relates to portable battery powered systems and particularly to a battery system for portable devices capable of optimizing the performance of a rechargeable electrochemical storage medium while at the same time maximizing its useful life.

Portable computerized systems are presently being extensively utilized in a wide range of applications. For example, such systems may be utilized in delivery vehicles which are to be away from a central warehouse or the like for a major part of each working day. Recharging operations may take place in locations subject to extremes of temperature. It is particularly crucial to avoid an equipment failure where a portable device is a vital link to the completion of scheduled tasks at remote locations and the like. In such circumstances a loss of adequate battery power can be just as detrimental as any other malfunction.

SUMMARY OF THE INVENTION

It is a basic objective of the present invention to provide a portable battery powered system of increased reliability and useful life.

An important feature of the invention resides in the provision of a portable system wherein the user can obtain a relatively accurate indication of the battery energy remaining available for use at any time during a portable operating cycle. Further, the user can be automatically alerted when battery capacity diminishes to a selected value, or when battery output voltage is at a selected marginal level.

For the sake of recharging of a battery system as rapidly as possible without detriment to an optimum useful life span, battery parameters including battery temperature can be monitored during a charging cycle and the battery charging current can be adjusted accordingly.

Since a battery may deteriorate when subjected to repeated shallow discharge and recharging cycles, according to the present invention, a count of such shallow charge cycles may be automatically maintained throughout the operating life of the battery system, such that deep discharge cycles may be effected as necessary to maintain desired performance standards.

Furthermore, according to another highly significant feature of the invention, automatically operating battery monitoring and/or conditioning circuitry may be secured with the battery pack for handling as a unit therewith. The monitoring circuitry may receive its operating power from the battery pack during storage or handling such that a total history of the battery pack may be retained for example in a volatile memory circuit where such type of memory otherwise provides optimum characteristics for a portable system. The conditioning circuitry may have means for effecting a deep discharge cycle, and concomitantly with the deep discharge cycle, a measure of actual battery capacity may be obtained. From such measured battery capacity and a continuous measurement of battery current during portable operation, a relatively accurate "fuel gauge" function becomes feasible such that the risk of battery failure during field operation can be essentially eliminated. The performance of a given type of battery in actual use can be accurately judged since the battery system can itself maintain a count of accumulated hours of use, and other relevant parameters.

In a simplified system currently in use, the conditioning system is incorporated in the portable utilization device such that the programmed processor of the utilization device may itself automatically effect a deep discharge conditioning cycle and/or a deep discharge capacity test. The deep discharge cycle may be effected at a controlled rate, such that the time for discharge from a fully charged condition to a selected discharge condition may itself represent a measure of battery capacity. Instead of directly measuring battery current during use, the programmed processor may maintain a measure of operating time and/or elapsed time during portable operation, so as to provide an indication of remaining battery capacity. A time measure of operating time may be utilized to automatically determine the time duration of the next charging cycle. When both a main battery and a backup battery are present, the operating time of each may be individually accumulated, and used to control the time duration of the respective recharging operations.

Additional features of a preferred commercial system include individual charging and discharging circuits for a main battery and a backup battery for reliable conditioning and operation of the backup battery independently of the state of the main battery. Desired parameters such as main battery voltage, backup battery voltage, ambient temperature (e.g. in the main battery case or in the battery compartment), and charging voltage may be obtained by means of an integrated circuit analog to digital converter, which thus replaces several comparators and many precision costly components of a prior implementation.

A feature generally applicable to voltage regulated power supplies resides in utilizing a regulator signal which departs markedly from its normal range as input voltage falls below a prescribed value. Such regulator signal may be utilized to switch to a different power source automatically, and/or to generate a suitable low power signal for external circuits, e.g. for controlling the issuance of a user-discernable low power warning. In a preferred implementation an operational amplifier supplies a current control signal which controls one or more current flow paths to maintain a desired regulated output voltage. A common saturation signal from the operational amplifier may result from a low power condition of any of several input sources which are connected to respective selectively activated regulator circuits. Where desired, a plurality of regulator circuits may be shifted from one setpoint voltage value to another by switching of the input circuitry of the operational amplifier, and the saturation signal will then represent a low power condition in relation to the other selected setpoint voltage value. The second regulated output voltage value may, for example, be desired in conjunction with a "power down" mode of battery powered equipment (e.g. CMOS dynamic memory circuits).

The invention will now be described, by way of example and not by way of limitation, with reference to the accompanying sheets of drawings; and other objects, features and advantages of the invention will be apparent from this detailed disclosure and from the appended claims.

BRIEF DESCRIPTION OF THE DRAWINGS

FIG. 1 is a somewhat diagrammatic perspective view of a portable battery powered device which may incorporate a battery system in accordance with the teachings and principles of the present invention;

FIG. 2 is a somewhat diagrammatic enlarged longitudinal sectional view showing the battery compartment section and adjacent portions of the portable device of FIG. 1, with a battery pack assembly disposed in the battery compartment in operative coupling relationship with a central processing unit of the portable device for purposes of power supply to the central processing unit and for purposes of transmission of data and command signals;

FIG. 3 is a somewhat diagrammatic perspective view of a battery system in accordance with the teachings and principles of the present invention;

FIG. 4 is a perspective view similar to FIG. 3 but illustrating the battery system enclosed in a protective casing, to form a complete battery pack assembly for insertion into the battery compartment of the portable device, as a unit;

FIG. 16A shows a portion of an electric circuit diagram for illustrating preferred implementations of a direct current to direct current converter, a main battery charging circuit, a backup battery charging circuit, and main and backup discharge circuits for such commercial implementation;

DETAILED DESCRIPTION

Figure 5:
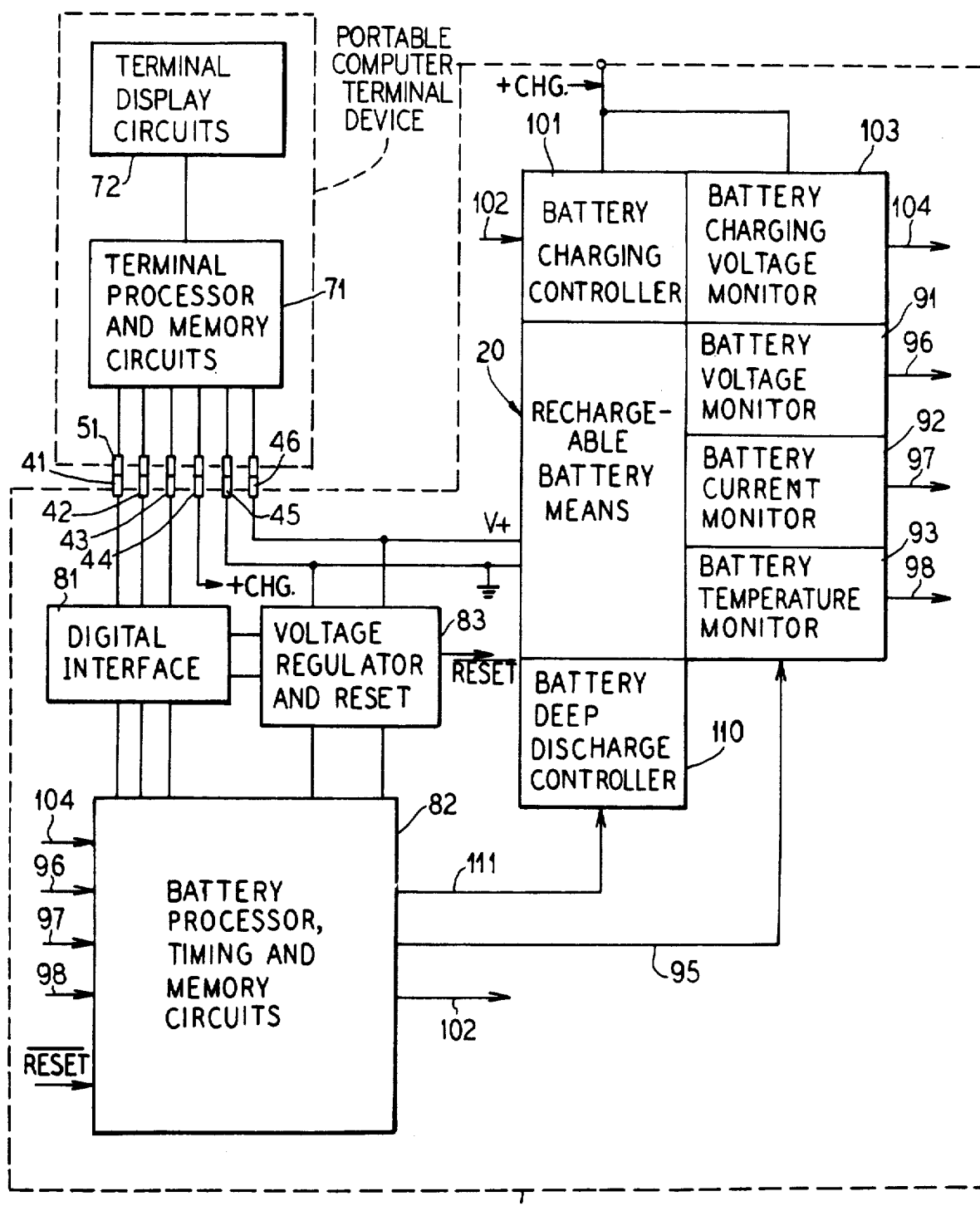
FIG. 5 shows a block diagram for explaining the cooperative relationship of the electronic parts of the particular portable computer terminal device and battery system shown in FIGS. 1 through 4, by way of example and not by way of limitation.

FIG. 1 is a perspective view of a portable battery powered device to which the present invention may be applied. The device is generally indicated by reference numeral 10 and is of a size to be conveniently held in one hand while a keyboard generally indicated at 11 is manually actuated by means of one or more fingers of the other hand. Characters entered by means of the keyboard 11 are displayed on a panel 12 under the control of a microprocessor located generally as indicated at 14 in FIG. 2. At an end 15 of the portable device a battery receiving means or compartment is provided. Access to the battery compartment is obtained via a removable cover element 17. By unlatching and opening the cover element 17, a battery pack assembly such as indicated at 18 in FIG. 4 may be inserted into or removed from the battery compartment.

By way of example, the battery pack assembly 18 may be comprised of rechargeable nickel-cadmium battery cells such as indicated at 21 and 22 in FIG. 2. By way of example, four nickel-cadmium cells may supply a nominal output voltage of five volts and have a rated capacity of about 2.2 ampere-hours. By way of example, the central processing unit 14 of the portable device 10 may require an operating voltage of five volts plus or minus ten percent, so that a voltage regulator would be associated with the central processing unit so as to ensure an actual supply voltage within the range from 4.5 volts to 5.5 volts. The size and weight of the portable device together with the battery pack assembly 18 is such that the complete portable battery powered system can be held in one hand while the keyboard 11 is being operated with the fingers of the other hand.

In a typical use of the portable device 10, it is contemplated that the decice may be used in an outdoor environment so as to be subject to a wide temperature range and relatively intensive daily use for example eight to ten hours per day. The battery pack assembly 18 is to be so designed as to have a maximum useful life even in such a stringent environment, thereby to ensure the maximum utility and reliability of the overall portable system as represented in FIG. 1.

For the sake of ensuring optimum reliability and usefulness of the overall system of FIG. 1, the battery pack assembly 18 includes digital processing circuitry 30 capable of data communication with the central processing unit 14 of the device 10. To this end, in the illustrated embodiment, as indicated in FIG. 3, the battery means 20 including the rechargeable battery cells carries therewith a printed circuit board 31 having flexible electrically conductive straps 41 through 46 which automatically make firm and reliable electrical contact with connector strips such as indicated at 51 of the terminal device 10. Two of the conductive straps of the set 41-46 may be connected with the opposite polarity terminals of the battery means 20 so as to supply battery voltage to the regulator means of the central processing unit 14. The remaining straps of the set 41-46 may serve to provide a communication channel between a battery processor unit of the processor circuitry 30 and the central processor unit 14 of the terminal device 10.

Referring to FIG. 4, the battery pack assembly 18 may include an insulating casing part 60 which has an aperture at 60a in FIG. 4 for exposing the conductor straps 41 through 46 for resilient pressure engagement with respective cooperating terminal connectors such as indicated at 51 in FIG. 2. As indicated in FIG. 2, the dimensions of the battery compartment of the device 10 are closely matched to the dimensions of the battery pack assembly 18 so that the battery pack assembly 18 can only be fitted within the battery compartment in such a way that the straps 41 through 46 are in firm engagement with the respective terminal connectors such as 51.

From FIGS. 2, 3 and 4, it will be understood that the processor circuitry 30 including the conductive straps 41-46 is secured with the battery means 20 for removability from the battery compartment as a unit. Thus the battery pack assembly 18 has self-contained processor circuitry as indicated at 30. As will be explained hereinafter, this processor circuitry 30 is electrically coupled with the battery means 20 so as to receive operating power therefrom both while the battery means forms part of the portable system 10 and while the battery means is separate from the portable unit. Thus, even where the processor circuitry 30 is provided with a memory requiring a constant supply of power, data is not lost from the memory upon removal of the battery means from the portable device 10. Still further as will be hereinafter explained the processor circuitry 30 including its memory may be operable with a battery voltage substantially less than that required by the central processor unit 14, so that data is not lost from the memory of the processing circuitry of the battery pack assembly even where the battery means has been discharged so as to have a relatively low output voltage below the minimum required operating voltage for the central processing unit 14. In this way, the battery memory means is enabled to retain an operating history of a particular rechargeable battery pack over the entire life of such battery pack, while on the other hand the processor circuitry 30 is designed so as to require a minimum space beyond the outline configuration of the rechargeable battery cells themselves. In FIG. 2, it will be observed that the casing 60 is relatively closely spaced to the periphery of the battery cells such as 21 and 22 in comparison to the cross sectional dimensions of such battery cells, and that the processor circuitry 30 is of a width dimension as viewed in FIG. 2 so as to at least partially fit within a nitch such as indicated at 63 between the two sets of battery cells. Still further, such processor circuitry 30 is selected so as to provide an essentially minimal power drain on the battery means 20, such that the battery means may be stored for long periods of time without loss of the data stored in the battery memory means. For example, the processor circuitry 30 including its associated memory means may require only a few percent of the current required by the processing system of the portable unit 10. For example, a shelf life of from one to two months for the battery memory means is feasible.

Description of FIG. 5

FIG. 5 illustrates an overall exemplary circuit diagram for the embodiment of FIGS. 1 through 4. In FIG. 5, reference numeral 71 indicates a terminal processor component including central processing unit 14 and associated memory circuits. Component 72 in FIG. 5 represents terminal display circuits which may be associated with the display screen 12 of FIG. 1. Terminal connectors such as 51 are also diagrammatically indicated and are shown as being electrically connected with the flexible straps 41 through 46, respectively, of the battery pack assembly.

In FIG. 5, the battery pack or rechargeable battery means is again generally designated by reference numeral 20, and the positive and negative output terminals of the battery means 20 are indicated as being connected with the terminal processor and memory circuits component 71 via electrically conductive straps 45 and 46.

Reference numeral 81 in FIG. 5 designates a digital interface component which serves for the coupling of the terminal processor of component 71 with a battery processor of component 82 of the battery pack assembly 18. Simply for the sake of example, communication between the battery processor of component 82 and the terminal processor of component 71 is indicated as taking place via three conductors which include respective conductive straps 41 through 43 of the battery pack assembly 18, FIG. 4. Further details of an exemplary digital interface circuit for implementing component 81 will be given in relation to a more detailed electric circuit diagram to be described hereinafter. For the sake of correlation with the detailed circuit to be later described, reference numeral 83 designates a voltage regulator and reset circuit. Component 83 serves to supply a regulated operating voltage to the component 82 as well as to circuits of the digital interface component 81 in a specific preferred implementation of the present invention to be described hereinafter. Component 82 in such specific example includes a memory which requires a continuous operating voltage in order to maintain a continuous history of the battery means 20. The reset circuitry of component 83 is adapted to supply a RESET signal which serves to indicate that the memory means has had its operating voltage interrupted.

Components 91, 92 and 93 in FIG. 5 represent battery monitoring means operatively coupled with the battery means 20 for the purpose of obtaining quantitative measures of respective battery parameters. Where the respective parameter sensing means of components 91, 92 and 93 supply analog signals, digital to analog converter means may be associated with the monitor circuitry for the purpose of obtaining the quantitative parameter measurements in digital form. In a particular preferred arrangement to be hereafter described in detail, the battery processor of component 82 may supply digital reference signals via the line 95, and the digital reference value may be converted into a common analog reference signal for matching with the respective analog measurement values of components 91, 92 and 93. In this particular embodiment, comparator circuits may be included in components 91, 92 and 93 for comparing the respective analog measurement signals with the common analog reference value in a predetermined order, the logical output signals from the comparator means being supplied via lines 96, 96 and 98 to the processor means for signaling when the digitally generated analog reference signal has reached a level exceeding the analog measurement value being compared therewith. The digital measurement values so determined may be utilized as a basis for updating battery condition information in the memory of component 82.

A battery charging voltage input is indicated by the symbol "+CHG". Battery charging current is supplied to the rechargeable battery means 20 via a battery charging current path which is controlled by a battery charging controller circuit 101 which may receive a digital battery charge control signal via line 102 in FIG. 5. According to a preferred embodiment to be described in detail hereafter, the battery charging current path further includes a battery current sensing means which forms part of component 92. The arrangement is preferably such that the battery current measured by component 92 during a charging operation does not include any charging current which may be supplied to the terminal device including components 71 and 72 in FIG. 5. Thus the battery processor of component 82 during a charging operation receives from component 92 a quantitative measure of actual charging current supplied to the battery means itself. A battery charging voltage monitor 103 is operatively coupled with the battery charging voltage input "+CHG" and is operative to supply a quantitative measure of battery charging voltage to the processor circuitry of component 82. For example, in a preferred arrangement, the digital reference value supplied by line 95 in FIG. 5 is utilized periodically to generate an analog reference value for comparison with the analog reading of battery charging voltage of component 103. In this case, a comparator circuit of component 103 signals via output line 104 when the analog reference value exceeds the currently occurring analog value of the battery charging voltage. Thus, during a battery charging cycle, the battery processor of component 82 is supplied with battery operating information from which an optimum battery charging current can be selected. In particular, by sensing battery temperature during the battery charging operation, it is possible to provide a battery system which is adaptable to operation under a wide range of environmental conditions while yet assuring optimum efficiency in carrying out a battery recharging operation.

For further assuring the optimum conditioning and maximum operating life of the battery system, FIG. 5 illustrates a battery deep discharge controller component 110 as being electrically connected with the battery means and being controlled by an input line 111 for effecting a deep discharge conditioning of the battery means 20 at suitable times during the operating life of the battery means. In accordance with the teachings of the present invention, during the deep discharge cycle of the battery means, battery current is continuously measured by the battery current monitoring component 92 so as to enable the battery processor and memory circuits of component 82 to derive a quantitative measure of the available capacity of the battery means. In a relatively simple determination of battery capacity, the battery means 20 may be first fully charged, and then subject to a deep discharge cycle wherein the battery means is discharged at a predetermined rate until such time as the battery means 20 exhibits a battery output voltage of a predetermined value, for example, four volts where components 71 and 72 of the terminal device require a minimum operating voltage of say 4.5 volts. By way of example if the battery means has a nominal rated capacity of 2.2 amp hours, the battery may be discharged at a rate of 220 milliamperes (battery capacity C divided by ten). In this case a deep discharge cycle would be completed within not more than about ten to twelve hours. (See FIG. 8 which represents the discharge characteristic of one nickel-cadmium cell.)

Charge current is coupled to the battery pack via conductive strap 44 of FIG. 5.

Figure 6:
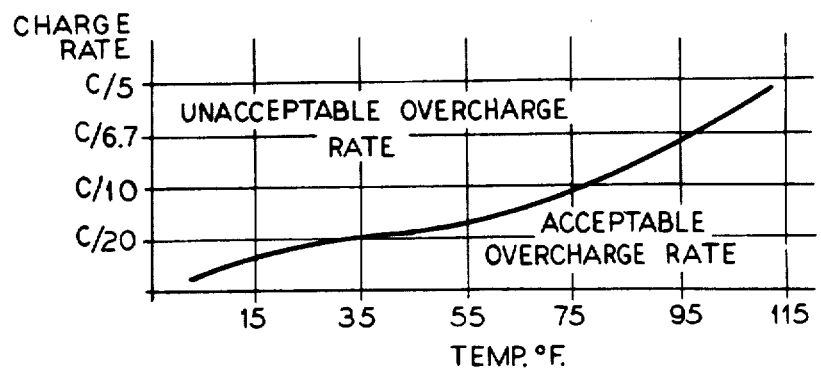
FIG. 6 shows a typical plot of permissible continuous overcharge rate as a function of temperature, for a particular type of rechargeable electrochemical energy storage cell, by way of example and not by way of limitation.
Figure 7:
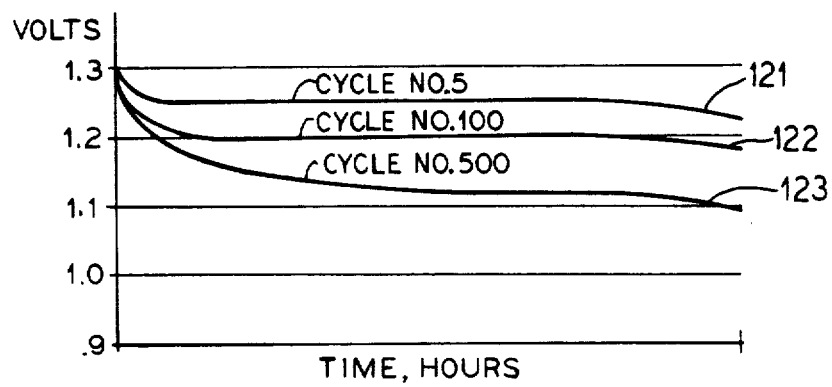
FIG. 7 is a plot of the effect of repetitive shallow cycling for the particular energy storage medium also represented by the plot of FIG. 6.

Description of FIGS. 6 and 7

By way of background, FIG. 6 is a plot illustrating maximum charge rate as a function of temperature. It will be observed that at relatively low temperatures, the permissible charging rate is relatively low. Thus a battery system adaptable to a wide range of environmental conditions, and yet utilizing a maximum charging rate is achieved when the charging rate can be adjusted according to quantitative measurement of battery temperature during the charging cycle.

Specifically for the case of a nickel-cadmium battery pack overcharging is the point at which the majority of charge current generates oxygen at the positive electrode rather than increasing the state of charge of the cell. This point occurs at approximately the 75% state of charge level. As oxygen is generated, the internal pressure of the cell increases, which ultimately determines the amount of overcharge the cell can withstand. The maximum allowable rate is a strong function of cell temperature. This is due to the fact that the generated oxygen must re-combine with cadmium at the negative electrode to prevent oxygen build-up and hence internal pressure increase. The rate of re-combination is dictated by cell temperature due to the viscosity of the electrolyte and the rate of the chemical reaction at the negative electrode. If the allowable overcharge rate for a given cell temperature is exceeded, the cell pressure may exceed the pressure relief valve safety level, causing venting and potentially expelling electrolyte, which drastically reduces cell life.

FIG. 7 illustrates the effect of repetitive shallow cycling on the output voltage of a given cell of a nickel-cadmium battery pack. Curves 121, 122 and 123 show the variation in output voltage over an operating cycle for respective increasing numbers of shallow operating cycles. Specifically curve 121 shows the variation in output voltage over time in hours for shallow discharge cycle number 5, while curve 122 represents the corresponding variation at shallow cycle number 100 and curve 123 shows the result at cycle number 500. Not only does repetitive shallow discharge produce a voltage depression effect as illustrated in FIG. 7, but this type of operation of the battery pack also causes a gradual and consistent degradation of cell capacity.

Figure 8:
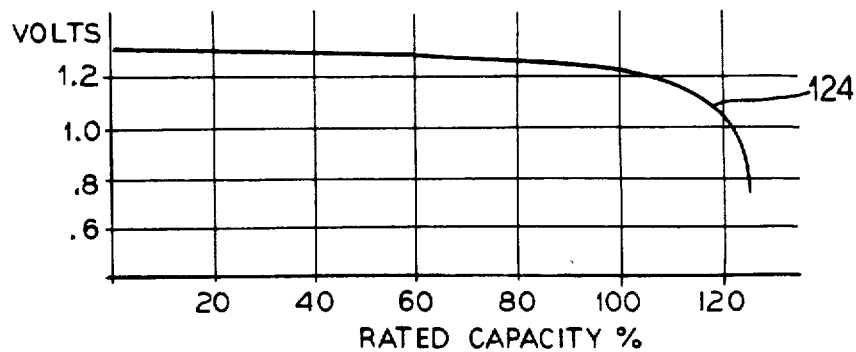
FIG. 8 is a plot of discharge characteristics for the particular energy storage medium also represented by the plots of FIGS. 6 and 7.

Description of FIG. 8

FIG. 8 illustrates the discharge characteristic for a nickel-cadmium cell. A deep discharge of the cell is considered to have taken place at region 124 where the output voltage begins to decrease relatively rapidly. A deep discharge cycle may be considered to have been effected when the cell voltage falls to a value of one volt, for example. A deep discharge, at a normal rate of battery usage, say battery capacity divided by twenty (C/20), might require more than twenty hours of portable operation without a recharging cycle.

Figure 9A:
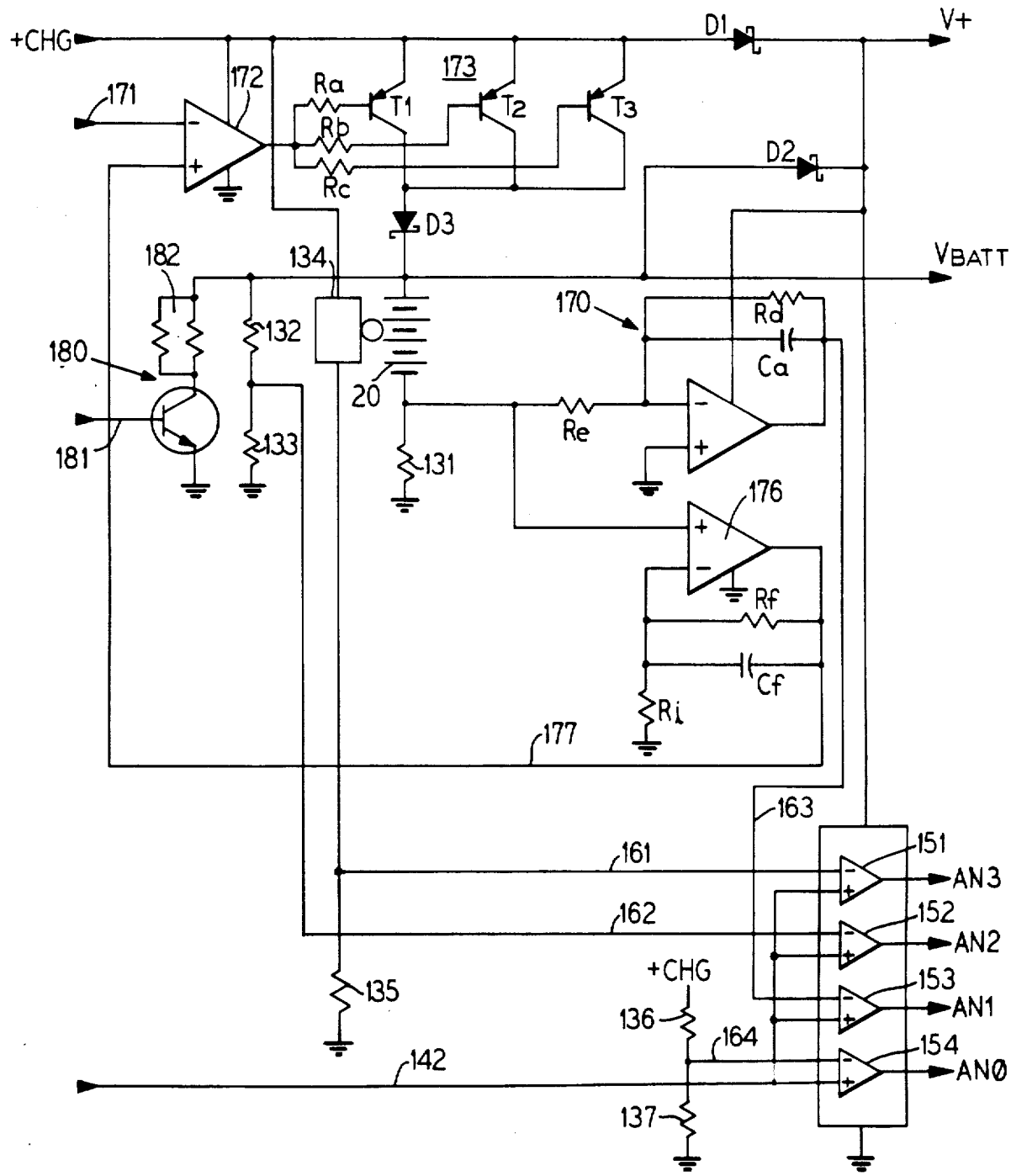
FIGS. 9A and 9B show a specific circuit implementation in accordance with the block diagram of FIG. 5, by way of example and not by way of limitation.
Figure 9B:
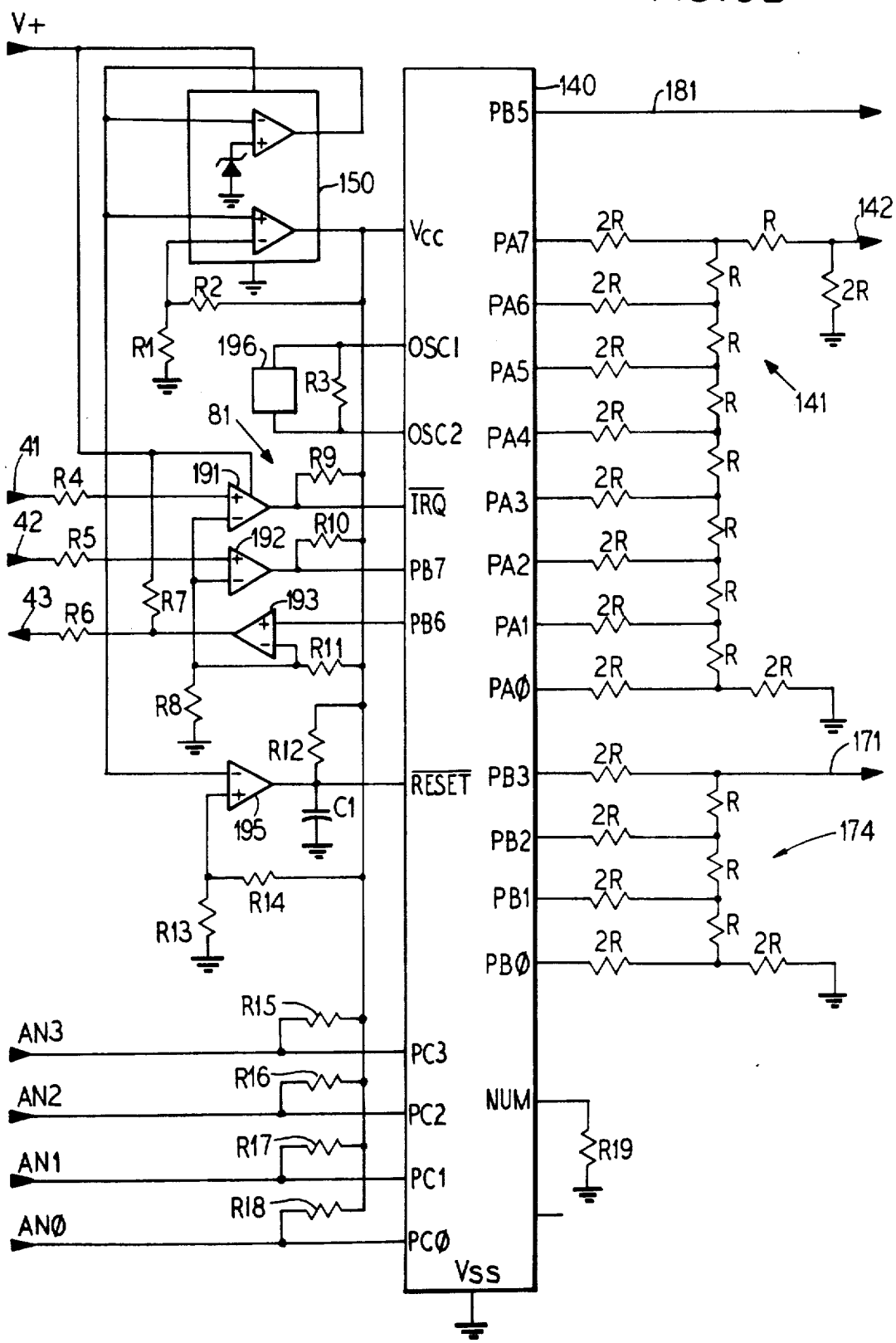

Description of FIGS. 9A and 9B

FIGS. 9A and 9B illustrate a more detailed circuit implementation in accordance with the block diagram of FIG. 5. In FIG. 9A the battery pack is schematically indicated at 20 and is shown as having a precision resistance element 131 permanently in series therewith for the purpose of sensing battery current during charging and discharging operations. By way of example, element 131 may have a resistance value of one-tenth ohm with a precision of one percent. The battery pack 20 also has associated therewith a precision voltage sensing arrangement comprising resistance elements 132 and 133. The resistance value of elements 132 and 133 in series is sufficiently high so that only a negligible battery current flows in this voltage sensing circuit. A battery temperature sensing transducer 134 is shown as being physically disposed in heat transfer relation to the battery pack 20. A precision resistance element 135 is shown in series with the transducer 134 for the purpose of supplying a voltage representative of battery temperature during a charging operation.

For the purpose of sensing charging voltage during a battery charging operation, precision resistance elements 136 and 137 are illustrated as being connected with the battery charging voltage input "+CHG". The resistance values of the voltage divider are selected such that the voltage across resistance element 137 will accurately represent the charging voltage during a battery charging operation. Analog to digital converter means is associated with the respective battery parameter sensing elements so as to convert the measurements into digital form. In the particular circuit embodiment illustrated in FIGS. 9A and 9B, this conversion operation is carried out with the use of programmed processor circuitry 140, FIG. 9B. The processor circuitry 140 controls an eight-bit R/2R ladder network 141 having an analog output at 142. The analog output line 142 is connected to comparators 151 through 154 shown in FIG. 9A and supplies a common analog reference voltage to the non-inverting inputs of these comparators. The inverting inputs 161 through 164 of the comparators 151 through 154 are coupled with the respective battery parameter sensing circuits. In a specific implementation, the processing circuitry 140 is implemented with a power supply voltage of three volts which may be obtained from a very accurate stable voltage reference supply/amplifier device 150. By utilizing a voltage reference as the power source for the processing circuitry 140, the output ports associated with the ladder network provide an accuracy comparable to that of a conventional digital to analog converter. In the particular embodiment illustrated there is a ninth bit in the most-significant bit location of the ladder network 141. This is provided so as to adapt the ladder network output at 142 to the input common mode voltage range of the comparators 151 through 154. Under worst case conditions, the battery terminal voltage may reach 4.0 volts which limits the common mode input voltage to 2.5 volts, approximately. To achieve eight-bit resolution, the full digital to analog analog voltage range must be accommodated by the comparators 151 through 154. By configuring the digital to analog converter network 141 as a nine-bit ladder with the most significant bit a logic zero, the lower eight bits of the nine-bit ladder remain, giving a resultant digital to analog voltage range of:

$$0V. \leq D/A \text{ output} \leq \frac{255}{511} \; Vref. \; (=1.497 \text{ V})$$

$$V_{step} = \frac{Vref.}{511} = 5.87 \text{ mv/step, 256 steps}$$

so:
digital output 0 = 0 volts
digital output 255 = 1.497 volts

Figure 10:
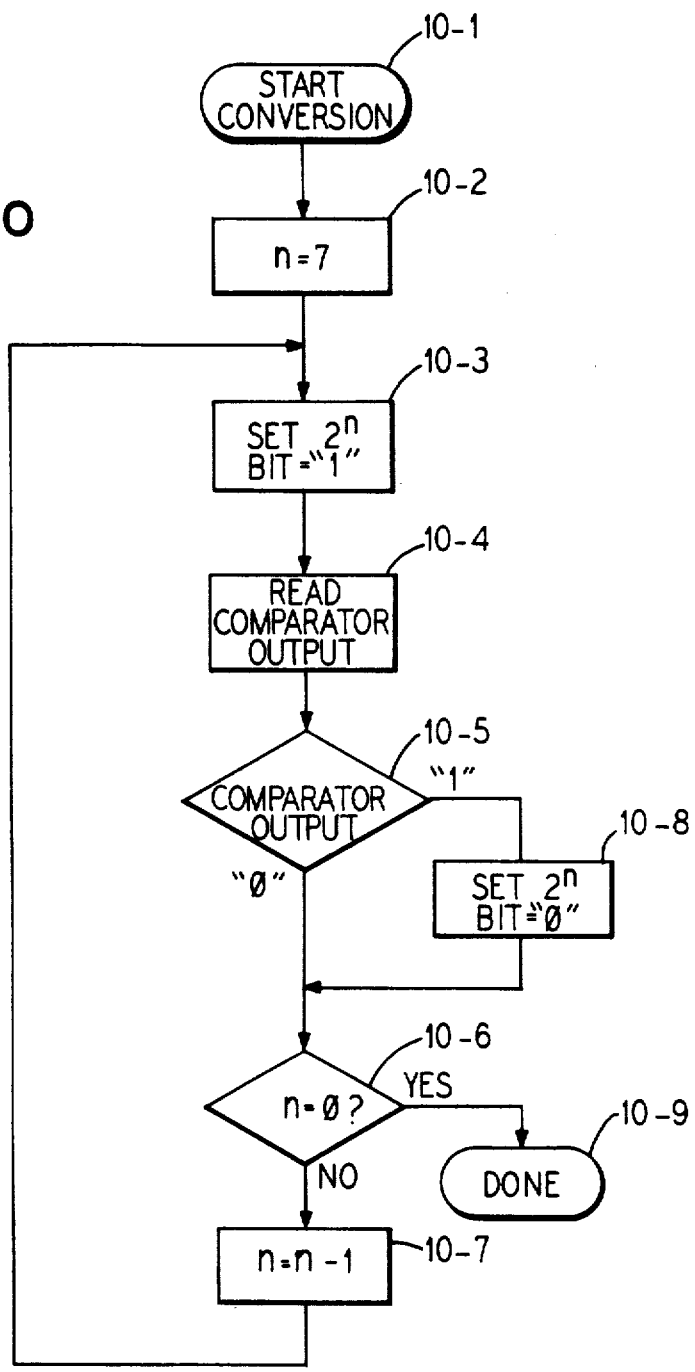
FIG. 10 is a flow diagram for illustrating an exemplary control program for carrying out analog to digital conversion of battery parameter values utilizing the particular exemplary circuit of FIGS. 9A and 9B.

With this digital to analog converter as a building block a successive approximation analog to digital converter can be implemented with the voltage comparators 151 through 154 FIG. 9A and a straightforward microprocessor algorithm (as represented in FIG. 10).

The successive approximation algorithm depends on the assumption that the analog voltage being measured does not change appreciably during the conversion sequence. The nature of the exemplary application inherently has characteristics of slowly changing parameters with the exception of the discharge current, which can change abruptly and significantly. The solution to this potential difficulty is a low-pass filter amplifier which serves to integrate or average any rapidly changing current fluctuations.

Since the analog to digital converter has a conversion range of 0 to 1.497 volts, the four analog signals to be measured must be scaled appropriately to yield a convenient step resolution by offering measurability over the necessary range of values. The scaling values and step resolutions may be selected as follows:

1. Channel 0: Charge voltage
   step resolution = 80 mv
   maximum range: 20.40 volts
2. Channel 1: Discharge current
   step resolution = 2 ma
   maximum range: 510 ma
3. Channel 2: Battery terminal voltage
   step resolution = 25 mv
   maximum range: 6.375 volts
4. Channel 3: Battery temperature
   step resolution = 2° K.
   maximum range: 509K = 236° C.

Particularly in the case of channel two it might be noted that a four-cell nickel-cadmium battery pack can have a terminal voltage that exceeds 6.375 volts, which is the maximum range of channel two. In the present example, however, no additional useful information would be provided if the battery processor could determine when battery voltage exceeded 6.375 volts.

As previously mentioned, battery discharge current is subject to rapid fluctuations. Accordingly, the channel one current monitor means includes an integration circuit as indicated at 170 in FIG. 9A. The integration circuit 170 has its input connected with the current sensing resistance element 131 and its output connected with input line 163 of comparator 153, FIG. 9A.

Referring to FIG. 9A, an implementation of the battery charging controller 101 of FIG. 5 comprises an analog control line 171 leading to an inverting input of a comparator 172 which controls a battery charging current regulating circuit 173. The battery charging current is controlled by the processor circuitry 140, FIG. 9B, with the use of an additional four bit R/2R ladder network 174. The ladder network 174 supplies an analog command signal via line 171 for controlling components 172 and 173. Thus, the analog command signal can have one of sixteen discrete voltage levels. The output voltage range is from zero volts to 15/16 times the reference voltage level or 2.81 volts, with steps of 187.5 millivolts.

An operational amplifier 176, FIG. 9A, is coupled with the battery current sensing resistor 131 and provides an amplification such that a voltage step of 187.5 millivolts at input 171 of comparator 172, FIG. 9A, is matched by a battery current step of thirty-two milliamperes in resistance element 131. Thus, for a battery current in element 131 of thirty-two milliamperes, a voltage at output line 177 of 187.5 millivolts is supplied to the non-inverting input of comparator 172. The minimum charge current level is theoretically zero; however, finite input offset voltages present in the amplifier 176 predict a potential zero level charge current of six milliamperes maximum. This is insignificant when it is recognized that the only time the zero level charge value will be selected is during the deep cycle function when much larger current levels will be drained from the battery.

In the illustrated battery charging current regulating circuit 173, three power transistors in parallel have separate base resistors for balancing unequal device parameters and ensuring equal current and power dissipation sharing between the devices. A major design consideration in the illustrated embodiment is the power dissipation of the current regulator 173 coupled with the heat associated with the battery pack 20 during the charging cycle, especially during the overcharge portion of the charge cycle which occurs after the battery reaches approximately seventy-five percent of its maximum charge capacity. To retain compatibility with existing charging circuits, the regulated charger 172, 173 must be capable of operating with input charge voltage levels of at least twelve volts. In some instances, the applied charge voltage might exceed eighteen volts. The dissipation is the regulator devices of circuit 173 is given by the equation:

$$P_d = (V_{CHG} - V_{BATT}) I_{CHG}$$

Given worst case conditions:
$V_{CHG} = 18$ volts
$V_{BATT} = 4$ volts
$I_{CHG} = 480$ ma $$P_d = (18-4)(0.48) = 6.72 \text{ watts}$$

It is clear that 6.72 watts exceeds the power dissipation capacity of even three transistors in regulator network 173, and would generate excessive heat within an enclosed unit even if the transistors could handle the charge voltage input. Since the battery voltage is known and the charge current level is selected by the processor circuitry 140, the resultant power dissipation can be directly controlled by the processor circuit 140. This means that essentially constant power operation of the transistors of network 173 can be achieved when high charge voltage conditions exist. If the charge voltage input is reduced to a more efficient level, higher charge currents are possible when conditions permit. The minimum charge voltage input that would still give proper constant current regulation is approximately 7.0 volts, which would result in minimum power dissipation.

According to the teachings of the present invention, the battery pack 20 is to be subjected periodically to a deep discharge cycle, in order that the battery pack can maintain its full rated capacity and exhibit maximum operating life. A suggested discharge cycle to meet this requirement is discharging the battery at a C/10 rate to a terminal voltage of 4.0 volts for a four-cell configuration. A discharge control circuit for this purpose is indicated at 180 in FIG. 9A, the control input 181 being controlled from the processor circuitry 140 as indicated in FIG. 9B.

A deep discharge of battery pack 20 would not normally occur in the typical usage contemplated for the illustrated embodiment since normally the battery pack and associated portable system is used less than fourteen hours per day, while the design operating time for the battery pack is typically twenty hours. Furthermore, most logic devices and LSI circuits such as those utilized to implement component 71 of FIG. 5, will not function at 4.0 volts. The illustrated embodiment performs the deep discharge function by switching a resistive load 182, FIG. 9A, across the battery 20 that causes current to be drained out at a predetermined rate, typically C/10. During the deep discharge cycle, not only is the battery conditioned, but further, according to the teachings of the present invention, the available capacity of the battery is measured. By measuring the available capacity of the battery, a battery "life history" can be maintained that has important diagnostic potential. If the available capacity begins to decrease past predetermined values, the user can be alerted, for example, via the terminal display circuits component 72, FIG. 5, before a fault or field failure occurs. The battery current sensor element 131 and integrator circuit 170 may be utilized to measure battery capacity during the deep discharge cycle.

In order to allow the battery to be discharged down to a deep discharge level corresponding to an output voltage of 4.0 volts, an auxilliary power source should be available to power the logic in the portable terminal device of FIG. 5 during the deep discharge cycle. A power regulator circuit may be built into the portable terminal device that regulates 5.0 volts from either the battery 20 or the charge voltage input terminal "+CHG", whichever is higher in potential. The net result of this power control arrangement is to completely remove the terminal load from the battery whenever the system receives power from a charger. For the case of a portable terminal device having data in a volatile memory, it is necessary that the charge voltage input not be interrupted during a deep cycle sequence. A message at the display 12, FIG. 1, can inform the user that the deep cycle sequence is in progress and that the terminal device should not be used until the cycle is completed. To minimize the impact of this operation on the user, the deep cycle function including a full discharge followed by a normal charge cycle will be initiated by the application program in the terminal device so that a convenient non-interferring time can be selected for this relatively long duration function, for example, over a weekend.

The key to utilizing the functional capabilities of the battery processor 140 is to provide for digital communication between the battery processor and the terminal processor circuitry. A digital interface 81 has been indicated in FIG. 5 for this purpose and exemplary detailed circuitry in FIG. 9B has been given the same reference numeral. The interface 81 may process the following three data signals:

1. BPCLK: Battery Processor Clock (from terminal)
2. BPWDATA: Battery Processor Write Data (from terminal)
3. BPRDATA: Battery Processor Read Data (from battery processor)

These three signals are protected from damage by static discharge by means of one hundred kilohm resistors in line with each input or output. The battery processor interface utilizes voltage comparators 191, 192 and 193 which are relatively immune to static damage. At the terminal, CMOS devices are used, therefore 4.7 volts Zener diodes are provided to further protect these more sensitive components. The voltage comparators 191, 192 and 193 perform the additional function of level conversion between the battery processor operating at 3.0 volts and the terminal logic operating at 5.0 volts. The open collector outputs of the comparators are pulled up by resistors connected to the appropriate power supply to ensure proper logic levels in either direction.

The communication protocol is based on the terminal processor controlling data transfers by issuing a clocking signal to the battery processor. The battery processor has the capability of requesting service by causing an interrupt to the terminal processor when it pulls the BPRDATA signal from its rest "1" condition to a "0". This signal has a resistor pull down on the terminal side of the interface, so an interrupt will automatically occur whenever the battery pack is removed from the terminal.

It is recognized that complete discharge of the battery can occur. In this case, information stored in the battery processor circuitry 140 will be lost but the system must be able to restore itself and properly recover and recharge the battery. To ensure such recovery, a voltage comparator 195 monitors the 3.0 volt power supply 150 and forces a $\overline{\text{RESET}}$ condition if the voltage supplied to the processor goes out of range. When the battery pack is again placed on charge, the battery processor circuitry 140 will restart and the control program will re-establish execution and control of the battery system.

Where the battery pack assembly 18 could be accidentally inserted upside-down, and reverse the electrical connections, to prevent damage or operational faults, the interface signals are shown as being arranged so that no high powered signals are connected to other high powered signals if reversed. All reversed connections terminate through the 100 kilohm protection resistors at the strap conductors 41–44, limiting currents to safe levels.

By way of example, processor circuitry 140 may be implemented by means of a single chip microprocessor such as the MC146805F2 which is a high performance CMOS derivative of the MC6805, with a reduced pin-out arrangement that allows packaging in the JEDEC standard twenty-eight pin leadless chip carrier. Features of this device include:

1. Operation at $V_{CC} = 3.0$ V
2. Low power standby "sleep" mode with self wake-up
3. External interrupt
4. Miniature package
5. CMOS port structure
6. On chip clock oscillator By way of example, a one megahertz crystal is indicated at 196 in association with the clock oscillator terminals of circuitry 140.

Description of FIG. 10

FIG. 10 illustrates a successive approximation algorithm for carrying out analog to digital conversion with respect to one of the battery parameters sensed by the circuitry of FIG. 9A.

By way of specific example, if a battery charging operation is to take place and if the charge voltage at "+CHG" is 14.385 volts, then the voltage at input 164 of comparator 154 will have a value of 1.050 volts. Thus, at the start of a conversion operation for obtaining a digital measurement of charge voltage, as represented at 10-1 in FIG. 10, the analog voltage at the reference input line 142 will be at zero volts, and the output of comparator 154, designated AN0 (channel 0) will be at a logical zero level.

As represented at block 10-2 in FIG. 10, for the case of an eight-bit digital to analog converter network 141 as previously described, a variable n is initially assigned a value seven. According to step 10-3, a logical one value is thus assigned to the highest order output port of processor 140. The result is that the reference line 142 receives an analog output voltage corresponding to $2^7$ or 128 voltage increments (about 0.751 volts). Since the analog reference value at line 142, FIG. 9A, is still less than the analog voltage at line 164, comparator 154 continues to supply a logical zero signal to the processor 140.

According to the block 10-4 of FIG. 10, the comparator output logic level is read by the processor, and according to decision block 10-5 where the comparator output is at a logical zero, processing continues via block 10-6 to block 10-7, whereby the variable n is assigned the new value six.

Thereupon, upon return to step 10-3, a logical one signal is produced at the second highest order output port of processor circuit 140, so that a total of 192 voltage increments is supplied at analog reference line 142 (a voltage of about 1.127 volts). If the voltage level at line 164, FIG. 9A, is 1.050 volts, then the voltage level at line 142 now exceeds the voltage level at line 164, and the output of comparator 154 is at a logical one level. Accordingly at the decision step 10-5, the program branches to block 10-8, whereby the bit with the weight of $2^6$ is set to a logical zero value. Then according to step 10-6 and step 10-7, the variable n is set to five, and according to step 10-3 the bit with the weight of $2^5$ is set to a logical one value. Accordingly, analog reference line 142 receives a voltage of 160 voltage units (0.939 volts). Since the analog reference level at line 142 is now less than the analog value at line 164, comparator 154 supplies a logical zero signal, and processing continues through steps 10-4, 10-5 and 10-6. Next according to step 10-7, the variable n is set to a value of four, and so on. When finally the bit having a weight of $2^0$ has been set by the procedure of FIG. 10, the program branches to 10-9, and the analog input value at 164, FIG. 9A, has been converted into a corresponding digital value which may be stored in the memory of component 140 for further processing.

Description of Tables A and B

On the following pages a Table A and a Table B pertaining to the battery processor component 82, FIG. 5, are set forth. In Table A, various suggested hexadecimal (HEX) codes are set forth which may be utilized in conjunction with the keyboard 11 (FIG. 1), for transmitting commands to the battery processor. In the case of hexadecimal codes 30 (HEX) through 35 (HEX), the requested battery information is transmitted by the battery processor via the digital interface 81, FIG. 5, for display on the terminal display screen 12, FIG. 1.

Table B illustrates the type of data which may be stored at respective memory locations of the memory circuits of component 82, FIG. 5. While the Tables are considered self-explanatory, a few comments on Table B are presented subsequent to the Tables:

TABLE A

BATTERY PROCESSOR: COMMAND FORMAT

| CODE (HEX) | FUNCTION | |
|---|---|---|
| 00 | Error recovery RESET | |
| 01 | Read STATUS (one byte returned) | |
| 02 | RESET ALL, Begin history | |
| 10 | Read analog channel 0 | |
| 11 | Read analog channel 1 | one byte returned |
| 12 | Read analog channel 2 | |
| 13 | Read analog channel 3 | |
| 20 | Set low reserve alert point (one byte sent) | |
| 21 | Set low voltage alert point (one byte sent) | |
| 22 | Set minimum capacity alert (one byte sent) | |
| 30 | Read fuel gauge (one byte returned) | |
| 31 | Read maximum available capacity (one byte returned) | |
| 32 | Read charge cycle count (two bytes returned) | |
| 33 | Read deep cycle count (two bytes returned) | |
| 34 | Read accumulated hours used (two bytes returned) | |
| 35 | Read use history indicator (four bytes returned) | |
| 40 | Initiate deep cycle function | |

TABLE B

BATTERY PROCESSOR: DATA DEFINITIONS

STATUS:

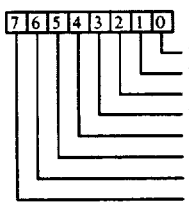

```
1 = COLD START, NO HISTORY
1 = CHARGE IN PROGRESS
1 = DEEP CYCLE IN PROGRESS
1 = LOW RESERVE CONDITION
1 = LOW VOLTAGE CONDITION
1 = IMPROPER CHARGE VOLTAGE
1 = CHARGE CYCLE INCOMPLETE
1 = MINIMUM CAPACITY ALERT
```

ANALOG VALUES

[7|6|5|4|3|2|1|0]  8-BIT VALUES SCALED BY BATTERY PROCESSOR AS FOLLOWS:

CH. 0: CHARGE VOLTAGE, 80 mV/STEP, 20.4 VOLTS MAX
CH. 1: DISCHARGE CURRENT, 2 ma/STEP, 510 ma MAX
CH. 2: BATTERY TERMINAL VOLTAGE, 25 mV/STEP, 6.375 VOLTS MAX
CH. 3: BATTERY TEMPERATURE, 2° K./STEP (ABSOLUTE)

LOW RESERVE ALERT POINT:

[7|6|5|4|3|2|1|0]

8-BIT VALUE, 1 ≦ LOW RESERVE ALERT POINT ≦ 99
DEFAULT VALUE: 20 = 14(HEX) (20% RESERVE)
SCALED BY BATTERY PROCESSOR AS % C REMAINING

TABLE B-continued

WHEN LOW RESERVE INTERRUPT GIVEN TO TERMINAL PROCESSOR

LOW VOLTAGE ALERT POINT:

[7|6|5|4|3|2|1|0]

8-BIT VALUE, 0 ≦ LOW VOLTAGE ALERT POINT ≦ 255
DEFAULT VALUE 190 = 0BE(HEX) (4.75 VOLTS)
SCALED BY BATTERY PROCESSOR AS 25 mV/STEP

MINIMUM CAPACITY ALERT:

[7|6|5|4|3|2|1|0]

8-BIT VALUE, 0 ≦ MINIMUM ALERT ≦ 255
10 ma - HR/STEP, 2550 ma - HR MAX.
DEFAULT VALUE: 0 (ESSENTIALLY DISABLED)
WHEN MAXIMUM AVAILABLE CAPACITY (AS MEASURED BY DEEP CYCLE FUNCTION) DECREASES TO THIS LEVEL,
AN INTERRUPT ALERT IS GIVEN TO THE TERMINAL PROCESSOR.

MAXIMUM AVAILABLE CAPACITY (C):

[7|6|5|4|3|2|1|0]

8-BIT VALUE, 0 ≦ C ≦ 255
10 ma - HR/STEP, 2550 ma - HR MAX.
MEASURED AND SET DURING DEEP CYCLE DISCHARGE FUNCTION
DEFAULT VALUE: 100 = 64(HEX)

CHARGE CYCLE COUNT:

BYTE 1 (MS) [7|6|5|4|3|2|1|0]

BYTE 0 (LS) [7|6|5|4|3|2|1|0]

16-BIT VALUE, INITIALIZED TO 0
COUNTS OF CHARGE CYCLES INITIATED

DEEP CYCLE COUNT:

BYTE 1 (MS) [7|6|5|4|3|2|1|0]

BYTE 0 (LS) [7|6|5|4|3|2|1|0]

16-BIT VALUE, INITIALIZED TO 0
COUNTS NUMBER OF DEEP DISCHARGE-RECHARGE CYCLES

ACCUMULATED HOURS:

BYTE 1 (MS) [7|6|5|4|3|2|1|0]

BYTE 0 (LS) [7|6|5|4|3|2|1|0]

16-BIT VALUE, INITIALIZED TO 0
COUNTS ACTUAL HOURS OF USE DELIVERING CURRENT

USE HISTORY INFORMATION:    (4 BYTES)

BYTE 3 [7|6|5|4|3|2|1|0]

8-BIT VALUE, COUNTS NUMBER OF TIMES OVER VOLTAGE ON CHARGE EXPERIENCED

TABLE B-continued

BYTE 2 | 7 | 6 | 5 | 4 | 3 | 2 | 1 | 0 |

8-BIT VALUE, COUNTS NUMBER OF TIMES TEMP EXCEEDED 45° C. DURING CHARGE

BYTE 1 | 7 | 6 | 5 | 4 | 3 | 2 | 1 | 0 |

8-BIT VALUE, AVERAGED DEPTH OF DISCHARGE DURING USE, % C

BYTE 0 | 7 | 6 | 5 | 4 | 3 | 2 | 1 | 0 |

8-BIT VALUE, CHANGE IN AVAILABLE CAPACITY FROM MAXIMUM OBSERVED

FUEL GAUGE:

| 7 | 6 | 5 | 4 | 3 | 2 | 1 | 0 |

8-BIT VALUE, 0 ≦ FUEL GAUGE VALUE ≦ 100 SCALED BY BATTERY PROCESSOR AS % C REMAINING

Referring to the STATUS word of Table B, for a new battery pack for example, for which no prior history has been recorded, bit zero of the STATUS word would be placed in a logical one condition representing a cold start of battery history. The remaining bits of the STATUS word could be at a logical zero level.

Various of the storage locations represented in Table B have default values which the locations receive in the absence of a particular selected value at the time of start up. For example, a LOW RESERVE ALERT POINT register would be set at a hexadecimal (HEX) value representing an alert point corresponding to a remaining capacity of the battery of 20% of its rated capacity. Thus, in the absence of a different setting, the battery processor would transmit an interrupt to the terminal processor (indicated at 71 in FIG. 5) when the battery had been discharged to such an extent that only a 20% reserve of capacity remained.

The CHARGE CYCLE COUNT of Table B, on the other hand, would be initialized to zero.

While the essential features of the invention will be fully understood from the foregoing description, it is proposed to include hereinafter certain further exemplary details concerning a specific implementation of an illustrative overall battery system. It should be understood, however, that the scope of the invention is defined by the claims hereof, and that specific details are given solely by way of example and not by way of limitation. An embodiment of the invention as defined in the claims is readily implemented by one of ordinary skill in the art without reference to the following elaboration.

Applicant would emphasize that the various features of the invention have substantial utility when practiced separately. For example, a non-rechargeable battery system with means for monitoring battery discharge current and automatically alerting the user when battery energy has been reduced to a selected value would have important utility independent of other features. A simplification of the disclosed portable system could be made by utilizing a non-portable system to insert a measured value of battery capacity into the memory of the battery system after each deep discharge cycle. For example the deep discharge and charging cycles might be controlled by a separate non-portable computer system at a central charging station. This computer system might be capable of communication with the memory of the battery system for inserting an accurate actual measurement of battery capacity. For the case of a central computer controlled charging station, the central computer could interrogate the memory of the battery system for relevant battery history and then selectively determine a suitable charging voltage and charging current. At selected times, the central computer could determine that the battery should be fully charged and then deep discharged to measure its actual capacity.

Figure 11:
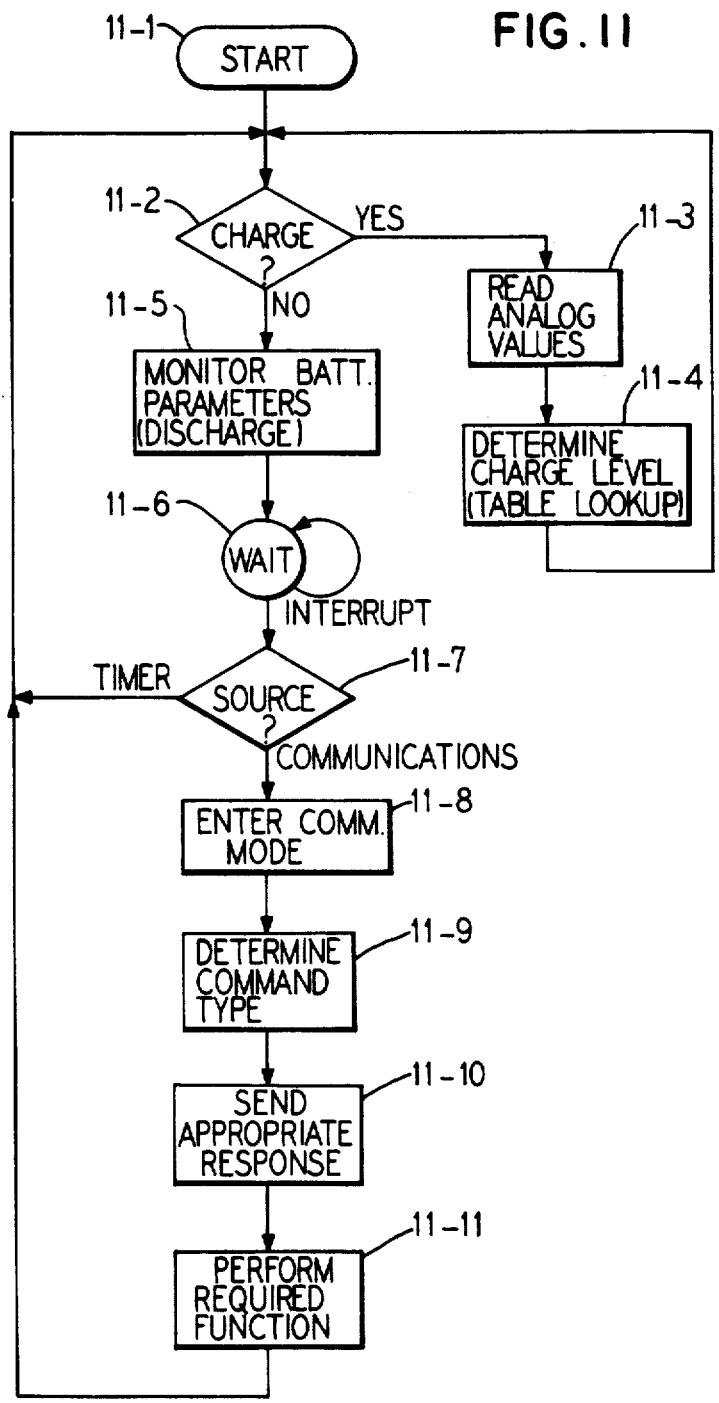
FIG. 11 is a flow diagram illustrating the general battery processor control program utilized in conjunction with simplified system currently in use.

Description of FIG. 11

FIG. 11 is a flow chart showing the general control program for the battery processor. During start of the system as represented by block 11-1 various storage locations of the memory of component 82, FIG. 5, may be initialized.

With respect to decision block 11-2, the battery processor, for example, may interrogate the battery charging voltage monitor 103, FIG. 5, to determine if a charging voltage is present. If a charging voltage is present, control branches as indicated at 11-3 and 11-4 to obtain the optimum value of battery charging current. Otherwise as represented by blocks 11-5 and 11-6, the battery processor effects the monitoring of battery parameters so as to update the battery information of Table B at suitable intervals.

As represented by decision block 11-7, upon receipt of an interrupt, the battery processor determines if the source of the interrupt signal was the battery processor timer, in which case control returns to decision block 11-2. On the other hand if the source of the interrupt signal was a communication from the keyboard 11 of terminal device 10, processing continues as indicated at 11-8. The respective command types pursuant to blocks 11-9 through 11-11 correspond to the respective code groups of Table A. Following execution according to block 11-11, the control program returns to block 11-2.

Description of Tables C and D

Exemplary circuit components and resistance and capacitance values for FIGS. 9A and 9B are shown in the following TABLES C AND D.

TABLE C (FIG. 9A)

| | |
|---|---|
| Comparator 172 | LM10B |
| Transistors $T_1$, $T_2$, $T_3$, | ZTX750 |
| Resistors $R_a$, $R_b$, $R_c$ | 2.2 kilohms, each |
| Schottky Diodes $D_1$, $D_2$, $D_3$ | 1N5819 |
| Circuit 180 | Darlington NPN |
| Resistors 182 | 47 ohms, ½ watt, each |
| Resistor 132 | 32.4 kilohms, 1% |
| Resistor 133 | 10 kilohms, 1% |
| Transducer 134 | AD 590 |
| Battery 20 | 2.2 ampere hour |
| | four cells × ½ D |
| | Polytemp Nickel-Cadmium |
| Resistor 131 | .1 ohm, 1% |
| Amplifier of 170 | CA 3260 |
| Resistor $R_d$ | 29.4 kilohms, 1% |
| Capacitor $C_a$ | .1 microfarad |
| Resistor $R_e$ | 1 kilohm, 1% |
| Amplifier 176 | CA 3260 |
| Resistor $R_f$ | 57.6 kilohm, 1% |
| Capacitor $C_f$ | .1 microfarad |
| Resistor $R_i$ | 1 kilohm, 1% |
| Resistor 135 | 2.94 kilohm, 1% |
| Resistor 136 | 127 kilohms, 1% |
| Resistor 137 | 10 kilohms, 1% |

TABLE C-continued
(FIG. 9A)

| | |
|---|---|
| Comparators 151–154 | LM 339 |

TABLE D
(FIG. 9B)

| | |
|---|---|
| Voltage Regulator 150 | LM10B |
| Resistor $R_1$ | 10 kilohms, 1% |
| Resistor $R_2$ | 140 kilohms, 1% |
| Crystal 196 | 1 megahertz |
| Resistor $R_3$ | 10 megohms |
| Resistors $R_4, R_5, R_6, R_8$ | 100 kilohms each |
| Resistor $R_7$ | 20 kilohms |
| Comparators 191–193 | LM 339 |
| Resistors $R_9, R_{10}, R_{11}$ | 100 kilohms each |
| Comparator 195 | LM 339 |
| Resistor $R_{12}$ | 100 kilohms |
| Capacitor $C_1$ | .1 microfarad |
| Resistor $R_{13}$ | 10 kilohms, 1% |
| Resistor $R_{14}$ | 127 kilohms, 1% |
| Resistors $R_{15-18}$ | 100 kilohms, each |
| R Resistance Values | 100 kilohms, 1%, each |
| 2R Resistance Values | 200 kilohms, 1%, each |
| Resistor $R_{19}$ | 10 kilohms |
| Processor Circuit 140 | MC 146805F2 |

Figure 12:
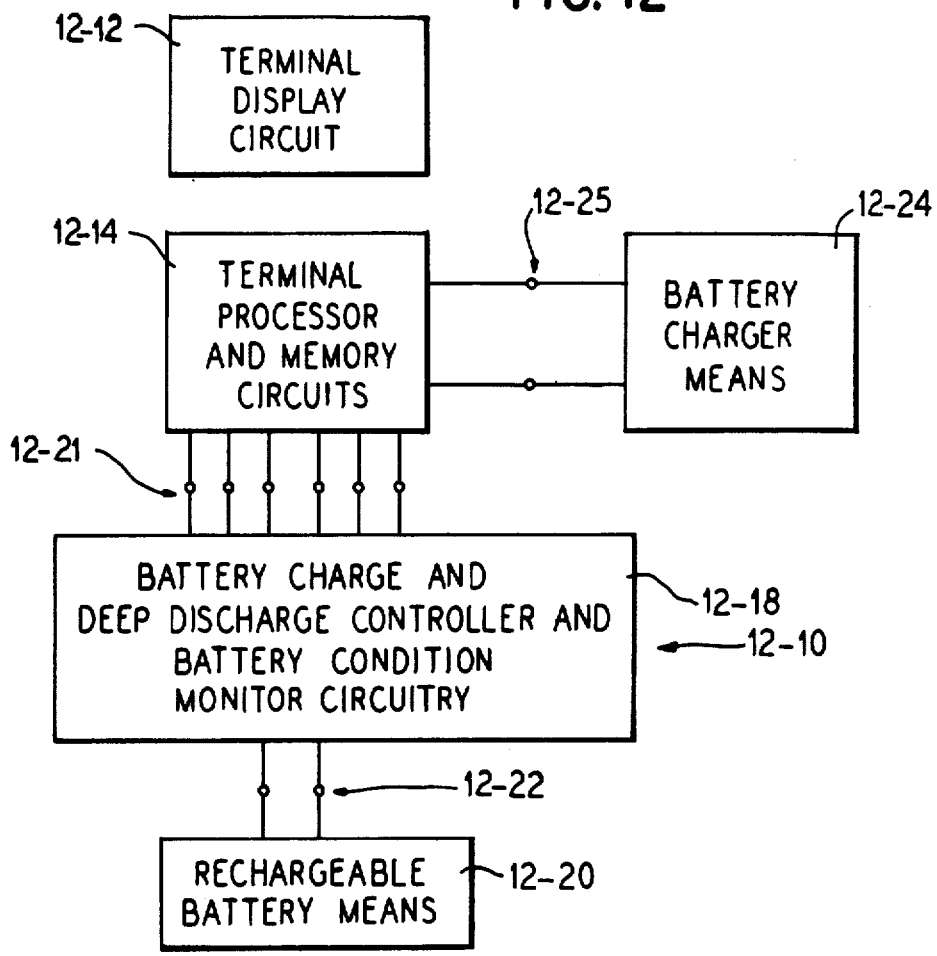
FIG. 12 is a block diagram of a simplified portable battery powered device in accordance with the present invention associated with a battery charger means, and also serves to illustrate a stationary battery conditioning system for spare battery packs.

Description of FIG. 12

FIG. 12 illustrates a simplified embodiment of a portable battery powered system in accordance with the present invention. Reference numeral 12-10 represents a portable utilization device which may have the same appearance and characteristics as described for the device 10 shown in FIG. 1. Thus the device 12-10 may have a terminal display circuit 12-12 associated with a display region such as indicated at 12 in FIG. 1 and may include processor and memory circuits 12-14 including a microprocessor located generally as indicated at 14 in FIG. 2. Battery charge and deep discharge controller and battery condition monitor circuitry 12-18 could correspond with the circuitry previously described in FIGS. 5, 9A and 9B, with the difference that the circuitry is permanently associated with the portable device 10 and is located in a space adjacent to space 14 of FIG. 2 rather than being a permanent part of the battery pack as indicated in FIGS. 3 and 4. Thus, in the embodiment of FIG. 12 a rechargable battery means is indicated at 12-20 and may comprise four nickel-cadmium cells supplying a nominal output voltage of five volts and having the characteristics previously described including those indicated in FIGS. 6, 7 and 8. In the simplified embodiment of FIG. 12, however, the rechargable battery means 12-20 is readily detachable from the circuitry 12-18 so as to be removable and replaceable without disturbing circuitry 12-18. By way of example circuitry 12-18 may be installed on a separate board which fits within the housing of the device 10 of FIG. 1 in the same way as the microprocessor board located at 14 in FIG. 2. In FIG. 12, small circles have been applied to represent a quick disconnect coupling between components 12-14 and 12-18. Thus, the terminal conductors of components 12-14 may be readily disconnected at 12-21 from the circuitry 12-18 and connected instead to output devices such as indicated at 51 in FIGS. 2 and 5, so that components 12-12 and 12-14 may be readily adapted to cooperate with the battery system of FIGS. 3 and 4 including the circuitry of FIGS. 9A and 9B.

For the simplified embodiment of FIG. 12, conventional spring type coupling has been indicated at 12-22 between circuitry 12-18 and battery means 12-20, so that a conventional battery pack is automatically coupled with the circuitry 12-18 when inserted into the portable device 12-10. By way of example, device 12-10 may correspond essentially to a portable data terminal of Norand Corporation identified as the NT 121 data terminal, modified to include component 12-18 and receiving a conventional nickel cadmium battery pack by means of a releasable coupling at 12-22 corresponding to that utilized in the commercial device. In the commercial system, the battery pack may be charged by coupling of component 12-24 to a battery charger means such as indicated at 12-24, for example by means of a plug and socket coupling indicated at 12-25. Component 12-14 when associated with a battery charger means may supply a charging voltage output (+CHG) as indicated in association with terminal 44 in FIG. 5, while component 12-14 may receive battery output voltage (V+, ground) from the battery means 12-20 via circuitry 12-18, as indicated in association with terminals 45 and 46 in FIG. 5. In an embodiment corresponding to that previously described, circuitry 12-18 would correspond to components 81, 82, 83, 91, 92, 93, 101, 103 and 110 of FIG. 5, for example. In a simplified specific embodiment, component 12-18 may utilize circuitry such as illustrated in FIG. 13.

Figure 13:
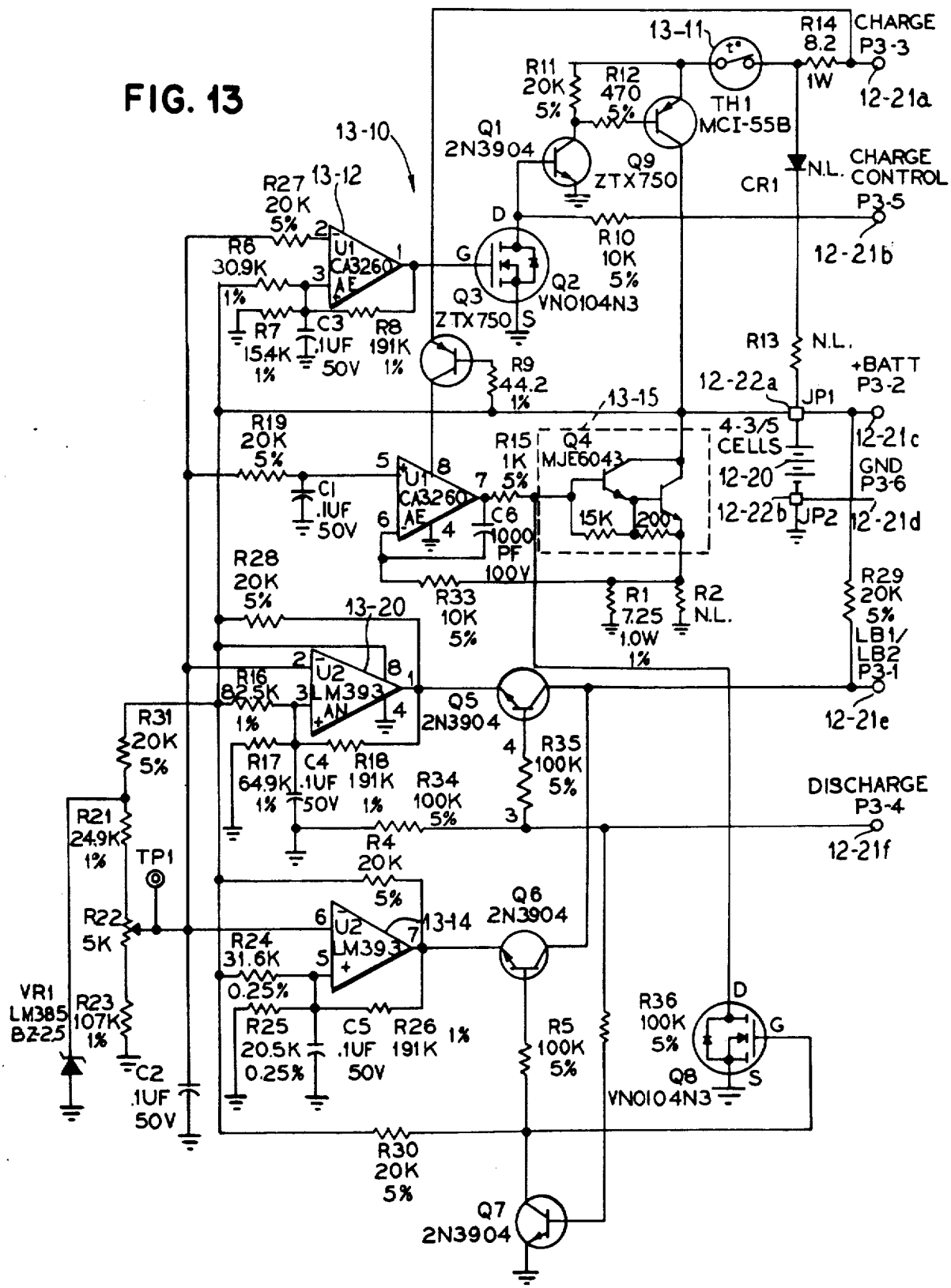
FIG. 13 shows a specific implementation of the battery charge and deep discharge controller and monitor circuitry which is represented as a labeled rectangle in FIG. 12.

Description of FIG. 13

FIG. 13 illustrates a specific battery charge and deep discharge controller and battery condition monitor circuit corresponding to component 12-18 of FIG. 12. The circuit 13-10 of FIG. 13 may be implemented as a printed circuit board for insertion into the previously mentioned model 121 portable data terminal such as illustrated in FIG. 1. For the sake of correlating the circuit of FIG. 13 with the illustration of FIG. 12, the terminals at the right hand side in FIG. 13 have been designated 12-21a through 12-21f to indicate there correlation with the quick disconnect coupling indicated at 12-21 in FIG. 12 between components 12-14 and 12-18.

For the specific commercial device previously identified, terminal 12-21a receives charging current of 0.66 amperes from a constant current circuit of component 12-14 which in turn is energized from battery charger means 12-24. Terminals 12-21a is thus designated by the notation "CHARGE".

Terminal 12-21b at the right in FIG. 13 receives a logical control signal from component 12-14. For example, with terminal 12-21b in a high potential condition, the charging current through transistor Q9 is at a value corresponding to rated capacity in ampere hours divided by 8.3 hours (C/8.3 amperes). With terminal 12-21b at a low logical potential level, the charging current has a value of full capacity divided by 100 (C/100). Switch 13-11 provides over temperature protection and may operate at a temperature 55 degrees centigrade.

Comparator 13-12 may sense an over-voltage condition and may receive a reference input of 2.000 volts at its upper inverting input.

Terminal 12-21b is designated by the legend "CHARGE CONTROL" and may be controlled from the programmed processor of component 12-14.

Battery 12-20 has been indicated in FIG. 13 operatively engaged with coupling elements which are indicated at 12-22a and 12-22b. The battery 12-20 is coupled by a terminal 12-21c and 12-21d with the component 12-14 for supplying operating power to the portable device during normal operation thereof.

Terminals 12-21e and 12-21f are utilized to effect an automatic deep discharge cycle. When terminal 12-21f is at a logical low potential state, terminal 12-21e provides a signal LB1 which in the high logical potential condition represents a low battery condition as sensed by comparator 13-14.

When terminal 12-21f is at a logical high potential condition, transistor Q7 is turned on, so as to activate the constant current discharge circuit including component 13-15. By way of example, the discharge of battery 12-20 may be at a rate of full capacity divided by five hours (C/5 amperes). During discharge operation, comparator 13-20 is active and provides a logical high potential signal (LB2) when a discharge value of battery potential, for example 3.8 volts, has been detected. For the specific battery referred to, comparator 13-12 may be activated at a voltage value of 6.2 volts, and then be reset when battery voltage is reduced to a value of 5.4 volts. Comparator 13-14 may be activated at a low battery voltage value of 4.65 volts, and be reset when the battery 12-20 has been charged above a voltage value of 5.4 volts. Comparator 13-20 may be activated at a discharge voltage value of 3.8 volts and then be reset when the battery 12-20 has been recharged to a voltage value above 5.4 volts, for example.

Terminal 12-21e is designated with the legend "LB1/LB2) and the terminal 12-21f is labeled with the legend "DISCHARGE".

By way of example, it will be apparent that the system of FIG. 12 may serve as a stationary battery conditioning system for removably receiving spare battery packs. Such a system could correspond to that illustrated in FIG. 1, but with the housing of device 10 permanently fastened to a stationary supporting frame. Conveniently, a removable cover such as 17 could be replaced by a quick access lid with a simple hinge, or the battery space for a conventional battery pack could be simply left open. Of course, a corresponding circuit could be made with heavier parts of the like specifically for stationary operation.

Figure 14:
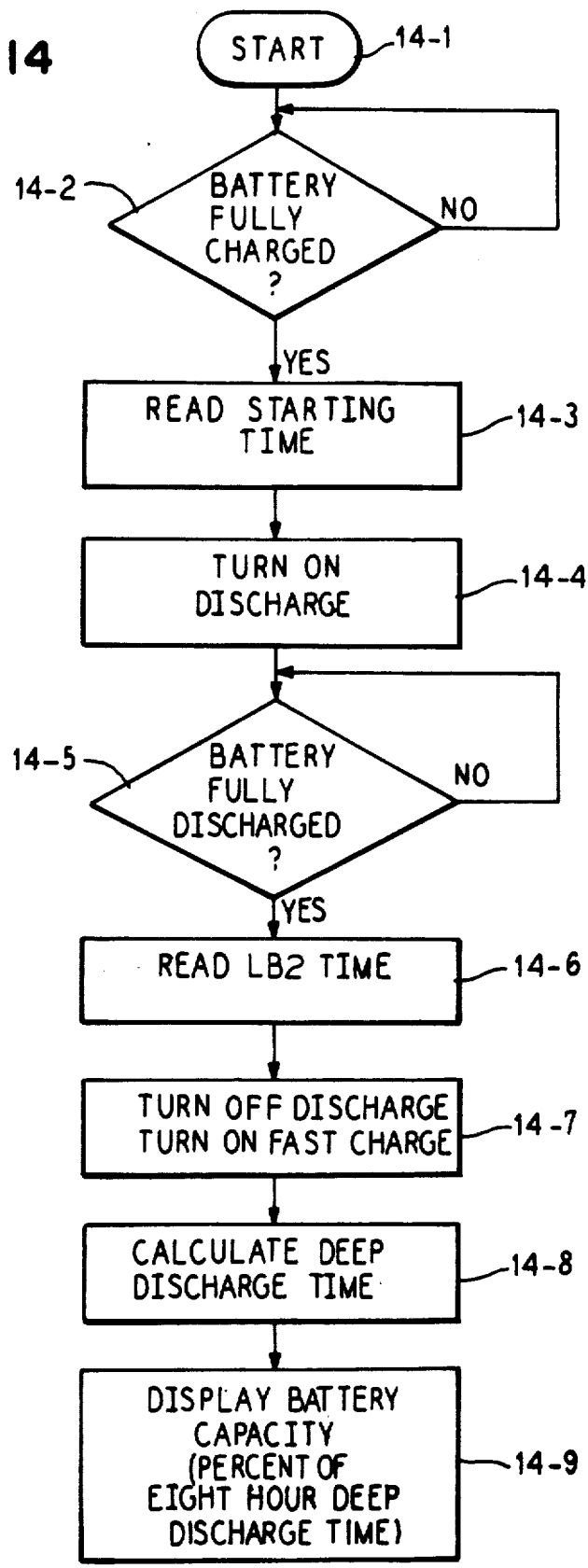
FIG. 14 is a flow diagram indicating the operating means for effecting an automatic discharge cycle with the specific circuitry of FIG. 13.

Description of FIG. 14

FIG. 14 illustrates exemplary automatic operation of the system of FIGS. 12 and 13 in conducting a test of battery capacity. When a portable system 12-10 is plugged into battery charger means 12-24, a deep discharge and recharge of the battery may be carried out. Such a procedure should be performed at least once a month to maintain the storage capacity of the battery. With the battery 12-20 fully recharged, a capacity measurement function as indicated in FIG. 14 may be performed when convenient. In the illustrated embodiment, the result of the capacity test is an indication of a percentage equal to the discharge time observed during a deep discharge cycle divided by eight hours. A value exceeding eighty percent may indicate that the batteries are still functioning adequately.

Referring to FIG. 14, a capacity test may be initiated by pressing the ENTER KEY, FIG. 1, in response to the prompt CAPACITY TEST? appearing at the display 12. By way of example, this prompt may appear once a conditioning discharge of the battery has been completed. Alternatively, selection of the capacity test function may automatically cause the battery to be discharge and fully charged before the actual capacity test steps of FIG. 14 are automatically carried out. In this case, step 14-2 might read: BATTERY DEEP DISCHARGED AND FULLY RECHARGED?

In the illustrated embodiment, step 14-2 may correspond with waiting until a battery charge timer indicates full charge by decrementing to zero from 780 minutes.

Once the battery is fully recharged, the operating system reads the current time as a starting time for the deep discharge cycle.

According to step 14-4, component 12-14 supplies a logical high potential signal to terminal 12-21f, FIG. 13 to initiate a further deep discharge cycle.

In executing step 14-5, the operating system of component 12-14 monitors terminal 12-21e of FIG. 13 for a logical high potential signal indicating that the battery has been discharged to a discharge level of for example 3.8 volts.

According to step 14-6, when a logical high potential signal appears at terminal 12-21e, the current time is read from a clock of component 12-14 as the "LB2 TIME".

By step 14-7, a logical low potential signal is supplied to terminal 12-21f to turn off the discharge circuit, and a logical high potential signal is supplied to terminal 12-21b to initiate a fast recharge of the battery.

For step 14-8, the processor of component 12-14 obtains the difference between the LB2 TIME and the starting time, as a measure of the time required for the deep discharge cycle. Where with a battery in good condition the deep discharge cycle requires eight hours, the calculation of step 14-8 obtains the percentage value of the observed deep discharge time in comparison to a discharge time of eight hours.

Pursuant to step 14-9, component 12-14 may cause the calculated deep discharge time to be displayed at the display means 12 of FIG. 1. For example, if the observed deep discharged time were six hours, the display might show: "BATT PERCENT=75".

An outline of a battery discharge subroutine (PSBAT1P) for the commercial model 121 portable data terminal is set forth on the following pages, followed by a program listing of this subroutine.

Description of an Exemplary Computer Program for an Embodiment According to FIGS. 12-14

A battery discharge program has been written and is in use for the model 121 portable data unit which has been described in connection with FIGS. 12-14 of the present drawings.

The system as represented in FIG. 12, comprises operating means including a NSC-800 processor and real time clock, automatically operating according to FIG. 14 under the control of the subroutine which is known as PSBAT1P. A copy of user guide specification for this subroutine is as follows:

Copy of User Guide Specification for the Subroutine PSBAT1P

SUBROUTINE: PSBAT1P

This subroutine has no parameters. In order to access it, it must be declared in the EXTERNALS section of a program, and then linked to the program, according to the conventions of the development system.

General Description

PSBAT1P is a PL/N battery discharge subroutine written for the NT121 data terminal. This subroutine performs two functions:
(1) It performs a deep discharge and recharge of the terminal.
(2) It measures the storage capacity of the NICAD batteries by timing the time required to discharge the batteries when fully charged.

The capacity test takes twice as long to execute as the simple discharge and recharge function. This is because the batteries must be discharged and charged before the actual capacity test can be performed. The result of the capacity time is a percentage equal to the discharge time divided by eight hours. A value exceeding 80% indicates the batteries are still functioning adequately.

The deep discharge and charge function should be performed at least once a month to maintain the storage capacity of the batteries. The capacity measurement function may be performed when convenient.

It is required that the NT121 remain on charge while the subroutine is executing. If it is taken off charge, an error message will be displayed and program execution will stop. Volatile data in the 121 will be maintained during the deep discharge provided that the unit is not taken off charge while in the low battery mode.

Power-up

When IPSDISP has been called from a main program the following message will be seen in the display:
Prompt:
 BATT. DISCHARGER
 IPSDISP Vx.x
Action:
 Press <ENTER> to proceed or press <SKIP> to halt program execution and return to the monitor program.
Prompt: EXIT PROGRAM?
Action:
 Press <ENTER> if it is desired that program execution is to be terminated or press <SKIP> to proceed.
Prompt: CAPACITY TEST?
Action:
 To measure the capacity of the batteries, press <ENTER>. Press <SKIP> if this is not desired.
Prompt: CURR TIME:hhmmss
Action:
 The current time is displayed in HHMMSS format. If no change in the time is desired just press <ENTER>. Otherwise enter the desired time in HHMMSS format. No mod checks are performed on this newly entered time. Make sure that the unit is on charge. This test will terminate if the 121 is removed from and not placed back on charge within 30 seconds.
Prompt: RCHRG TIME:nnnnn
 This prompt will appear only when the capacity test has been selected. The contents of the battery charge timer will be displayed and updated every 5.5 seconds until its value is zero (full charge). The value of the RTC will be read and stored. This test will terminate if the 121 is removed from and not placed back on charge within 30 seconds.
Prompt: DISCHARGING.
 This prompt indicates the 121 is currently discharging its batteries. This will continue until LB2 becomes active (batteries discharged). The LOW BATT flag on indicates that the unit is discharging and the blinking SHIFT flag indicates the unit is active. This test will terminate if the 121 is removed from and not placed back on charge within 30 seconds.
Prompt: RECHARGING.
 This prompt indicates that the 121 has reached LB2. The value of the RTC is then read and saved. The unit will start to charge its batteries until LB1 becomes inactive (not low battery). The blinking SHIFT flag indicates the unit is active. When LB1 becomes inactive the RTC is then read and saved. This test will terminate if the 121 is removed from and not placed back on charge within 30 seconds.
Prompt: S TIME: hhmmss
Action:
 The 121 no longer checks if it is on charge. It is the user's responsibility to ensure that the unit remains on charge until the LOW BATT flag is turned off in order for the batteries to fully benefit from this test. The time stored at the beginning of the test is displayed in HHMMSS format. Press <ENTER> to proceed.
Prompt: LB2 TIME: hhmmss
Action:
 The time where LB2 became active is displayed. Press <ENTER> to proceed.
Prompt: LB1 TIME: hhmmss
Action:
 The time where LB1 became inactive is displayed. Press <ENTER> to continue.
Prompt: % CAPACITY: nnn
Action:
 This prompt will appear only if the capacity test was selected. It is a percentage of:

(time taken to discharge the batteries from a full charge)/eight hours.

Press <ENTER> to proceed.
 When either the capacity or conditioning tests are executing and the 121 is removed from charge the following message will be displayed.
Prompt: CHARGER!
Action:
 If the unit is placed back on charge within 30 seconds the test will continue. If it is not an error message will be displayed.
Prompt: TEST ABORTED.
Action.
 Press <ENTER> to proceed to the 'EXIT PROGRAM?' prompt.

Introduction to the Listing of the Subroutine PSBAT1P

The following listing has the heading:

"PSBAT1P: 121 BATTERY DISCHARGE & CYCLE PLN VER 2.8 03/23/84
12:41: 49", and is generally outlined as follows:
0-5 "$ PSBAT1P; 121 BATTERY DISCHARGE & CYCLE
SUBROUTINE PSBAT1P
VERSION 0016"
6-28 HISTORY
07/07/83 Under this data a
 first programmer -continued

| | |
|---|---|
| | is shown as author of a program entitled "121 BATTERY DISCHARGE PROGRAM" |
| 07/13/83 | "REMOVED THE CODE THAT ALLOWED THE USER TO MODIFY THE BATTERY CHARGE TIMER." |
| 08/01/83 | Under this data a second programmer has the note: "PSBAT1P CREATED" |
| 11/21/83 | On November 21, 1983, there is a notation by a third programmer COPY FILE PCURCNP CHANGED, THIS CODE WAS FIXED TO REFLECT THE CHANGES. REMOVED PROGRAM HEADER," |
| 03/23/84 | On March 23, 1984, a fourth programmer makes the following entry into the program history: "MODIFIED SO THAT THE SYSTEM DRIVER IS NOT NEEDED. IT WAS ONLY USED TO DETERMINE WHEN FULL CHARGE WAS ACCOMPLISHED. THIS IS NOW DONE BY DETERMINING IF THE INTERPRETER IS CURRENTLY CHARGING THE BATTERIES. IF NOT, TEST TO SEE IF IT IS BECAUSE THE CHARGE POWER HAS BEEN REMOVED. IF IT HAS NOT, THEN THE PRECHARGE IS COMPLETE. THE DISPLAY OF TIME NOW INCREMENTS BY TENTHS INSTEAD OF DECREMENTS BY MINUTES." |
| 29–33 | EXTERNALS NUMERIC FUNCTION INPUT |
| 34–45 | PSBAT1P PROGRAM CONSTANTS |
| 46–72 | PCINCNP INPUT CONTROL ATTRIBUTES |
| 74–101 | PCHRCNP CHARACTER AND KEY DEFINITIONS |
| 102–152 | PCKBCNP KEYBOARD OPEN MODES, GET AND PUT CONTROL OPTIONS |
| 153–200 | PCURCNP URTIO GET AND PUT CONTROL |
| 207–200 | PCKBCMP REQUIRED IF 'INPUT' FUNCTION AND/OR 'PRINT' SUBROUTINE ARE LINKED WITH APPLICATION |
| 227–249 | PCLKFDP CLOCK FD AND BUFFER |
| 306–341 | PROCEDURE BATT TEST |
| 342–421 | PROCEDURE DEEP DISCHARGE |
| 422–449 | PROCEDURE PLUG IN CHARGER |

Excerpts of Detailed Listing of Subroutine PSBAT1P

A copy of the listing (except for locations 1–33 which are adequately indicated in the proceding section) is as follows:

```
34     0   $ PSBAT1P PROGRAM CONSTANTS
35_    0     CONSTANTS
36     0
37     0       VER                    = 'V1.5'
38_    0       TRUE                   = 1
39     0       FALSE                  = 0
40     0       MINUS_ONE              = 65535
41     0       SPACE                  = 32
42     0       UNDERSCORE             = 95
43     0       HI_VALU                = 255
44_    0       NULL                   = 0
45     0
46     0   $
47     0
48     0       ;BEGIN COPY LIBRARY - PCINCNP
49     0
50     0       ;**************************************************
51     0       ;
52     0       ;   'INPUT' CONTROL ATTRIBUTES
53     0       ;
54     0       ;**************************************************
55     0       .
56     0       E   = 0       ;ENTER ONLY
57     0       S   = 1       ;SKIP ALLOWED
58     0       F   = 2       ;FUNCTION ALLOWED
```

```
59    0    A     =. 8       ;AUTO-ENTRY ALLOWED
60    0    V     = 36       ;VIEW WITHOUT DATA ENTRY
61    0    VD    = 68       ;VIEW WITH UPDATE AFTER A DELETE
62    0    VDO   = 20       ;VIEW WITH OPTIONAL UPDATE
63    0    SCR   = 128      ;SCROLL
64    0    T     = 256      ;PROMPT ON THE TOP LINE
65    0    B     = 512      ;PROMPT ON THE BOTTOM LINE
66    0    H     = 1024     ;HOME THE CURSOR AND CLEAR DISPLAY
67    0    L     = 2048     ;ALLOW SEARCH
68    0    N     = 4112     ;CLEAR INPUT FIELD ON ENTER ONLY
69    0    TB    = 8192     ;PROMPT ON TOP, INPUT ON BOTTOM
70    0    RTD   = 16384    ;RETURN ON DELETE/CLEAR AND CHRCNT = 0
71    0    RTF   = 32768    ;RETURN ON CONTROL KEY
72    0         '
73    0    ;END COPY LIBRARY - PCINCNP
74    0  $
75    0
76    0    ;BEGIN COPY LIBRARY - PCHRCNP
77    0
78    0    ;**************************************************
79    0    ;
80    0    ; CHARACTER AND KEY DEFINITIONS
81    0    ;
82    0    ;**************************************************
83    0
84    0    BEL        = CHAR (7)       ;BEEP
85    0    BS         = CHAR (8)       ;BACKSPACE
86    0    LF         = CHAR (10)
87    0    CR         = CHAR (13)
88    0    CRLF       = CR & LF
89    0    SP         = CHAR (32)      ;SPACE
90    0    HT         = CHAR (9)       ;HORIZONTAL TAB
91    0
92    0    FUNC_KEY   = 6
93    0    SKIP_KEY   = 27
94    0    ENTER_KEY  = 13
95    0    UP_KEY     = 8
96    0    DOWN_KEY   = 10
97    0    SRCH_KEY   = 12
98    0    DEL_KEY    = 127
99    0    CLR_KEY    = 21
100   0         '
101   0    ;END COPY LIBRARY - PCHRCNP
102   0  $
103   0
104   0    ;BEGIN COPY LIBRARY - PCKBCNP
105   0
106   0    ;**************************************************
107   0    ;
108   0    ; KEYBOARD OPEN MODES, GET AND PUT CONTROL OPTIONS
109   0    ;
110   0    ;**************************************************
111   0
112   0    KB_NAME    = 'KBDIO1'
113   0
114   0    ;OPEN MODES
115   0
116   0    KB_KEY_CLICK   = 1     ;OPEN WITH KEY CLICK ON
117   0    KB_SHIFT_LOCK  = 2     ;OPEN WITH SHIFT LOCK ON
118   0    KB_OFF_CURSOR  = 4     ;OPEN WITH CURSOR OFF
119   0
120   0    ;GET CONTROL
121   0
122   0    KB_CHRCNT  = 1     ;GET NUMBER OF CHARS INPUT
123   0    KB_KEY     = 2     ;GET LAST KEYPRESS
124   0    KB_LCD     = 3     ;GET LCD ATTRIBUTES
```

```
125   0
126   0      ;PUT CONTROL
127   0
128   0      KB_PARTIAL    = 768        ;PARTIAL FORMATTING
129   0      KB_FULL       = 769        ;FULL FORMATTING
130   0      KB_AUTO       = 770        ;AUTO ENTRY ON
131   0      KB_NOAUTO     = 771        ;AUTO ENTRY OFF
132   0      KB_NOENTRY    = 772        ;NO DATA ENTRY REQUIRED
133   0      KB_ENTRY      = 773        ;DATA ENTRY REQUIRED
134   0      KB_ABORT      = 774        ;ALLOW CONTROL KEYS TO EXIT INPUT
135   0      KB_NOABORT    = 775        ;DON'T ALLOW
136   0      KB_BUZZER     = 1033       ;TURN ON DISPLAY BUZZER
137   0      KB_OFFBUZZER  = 1034       ;TURN OFF DISPLAY BUZZER
138   0      KB_CURSOR     = 1280       ;TURN CURSOR ON
139   0      KB_NOCURSOR   = 1281       ;TURN CURSOR OFF
140   0      KB_HOME       = 1282
141   0      KB_CLEOL      = 1283       ;CLEAR TO END OF LINE
142   0      KB_CLEOP      = 1284       ;CLEAR TO END OF PAGE
143   0      KB_SWAP       = 1285       ;SWAP KEY TABLES
144   0      KB_CLICK      = 1286       ;KEY CLICK ON
145   0      KB_NOCLICK    = 1287       ;KEY CLICK OFF
146   0      KB_LOCK       = 1288       ;LOCK KEYBOARD
147   0      KB_UNLOCK     = 1289       ;UNLOCK KEYBOARD
148   0      KB_BINARY     = 1290       ;SEND BINARY DATA TO PORT
149   0      KB_WIDTH      = 1291       ;SET CHARACTERS PER ROW
150   0      KB_LENGTH     = 1292       ;SET NUMBER OF ROWS
151   0
152   0      ;END COPY LIBRARY - PCKBCNP
153   0  $
154   0
155   0      ;BEGIN COPY LIBRARY - PCURCNP
156   0
157   0      ;*************************************************
158   0      ;
159   0      ;  URTIO GET AND PUT CONTROL
160   0      ;
161   0      ;*************************************************
162   0
163   0      ;GET CONTROL
164   0
165   0      UR_CHRCNT     = 1          ;CHARACTERS RETURNED BY LAST IN
166   0      UR_KEY        = 2          ;LAST CHARACTER RETURNED
167   0      UR_SIGNALS    = 5          ;EIA/BATTERY SIGNALS
168   0
169   0      ;PUT CONTROL
170   0
171   0      UR_BAUD       = 2048       ;SET BAUD RATE
172   0      UR_PARITY     = 2050       ;SET PARITY
173   0      UR_DATA       = 2051       ;SET NUMBER OF DATA BITS
174   0      UR_STOP       = 2052       ;SET NUMBER OF STOP BITS
175   0      UR_ROUTE      = 2053       ;SET IO ROUTING
176   0      UR_SET        = 2054       ;ACTIVATE THE IO PINS
177   0      UR_RESET      = 2055       ;DEACTIVATE
178   0      UR_TIME1      = 2060       ;1ST CHARACTER WAIT TIME
179   0      UR_TIME2      = 2061       ;INTERCHARACTER WAIT
180   0
181   0      ;PINS
182   0
183   0      UR_DTR        = 1
184   0      UR_RTS        = 2
185   0      UR_RCT        = 4
186   0      UR_TXD        = 8
187   0      UR_SCAN       = 16
188   0      UR_BACKUP     = 32         ;BACKUP BATTERY
189   0      UR_CHRG_CNTL  = 64         ;TRICKLE = 0, FULL = 1
190   0      UR_DISCHARGE  = 128        ;DISABLED = 0 (LB1), ENABLED = 1 (LB2)
191   0      UR_DSR        = 256
192   0      UR_CTS        = 512
193   0      UR_RCR        = 1024
```

```
194     0       UR_RXD              = 2048
195     0       UR_PROXIMITY        = 4096
196     0       UR_CROSSOVER        = 8192
197     0       UR_LOWBATT          = 16384   ;LB1/LB2
198     0       UR_CHARGE           = 32768   ;CHARGER PLUGGED IN = 1
199     0
200     0       ;END OF COPY LIBRARY - PCURCMP
201     0               CHARGE_CNTL         = 64    ;FAST/TRICKLE CHARGE
202     0               DISCHARGE           = 128   ;DEEP DISCHARGE
203     0  $ PSBATIP PROGRAM FD'S AND BUFFERS
204     0
205     0       COMMON VARIABLES
206     0
207     0       ;BEGIN COPY LIBRARY - PCKBCMP
208     0
209     0       ;**********************************************************
210     0       ;
211     0       ;   FIXED COMMON AREA
212     0       ;
213     0       ;   - REQUIRED IF 'INPUT' FUNCTION AND/OR 'PRINT' SUBROUTINE ARE
214     0       ;     LINKED WITH APPLICATION
215     0       ;
216     0       ;**********************************************************
217     0
218     0       FD              KBD
219     0       01  KEY         BINARY BYTE   ;HOLDS MOST RECENT KEYPRESS
220     0       01  CHRCNT      BINARY BYTE   ;HOLDS NUMBER OF CHARS INPUT
221     0       FD              PRT (56)      ;53 CHARS + 3 FOR NEW PROTOCOL SUPPORT
222     0  ,    FD              PRT           ;OLD PROTOCOL
223     0
224     0       ;END COPY LIBRARY - PCKBCMP
225     0
226     0
227     0       ;BEGIN COPY LIBRARY - PCLKFDP
228     0
229     0       ;**********************************************************
230     0       ;
231     0       ;   CLOCK FD AND BUFFER
232     0       ;
233     0       ;**********************************************************
234     0
235     0       FD                      CLK
236     0       01  CLKBUF
237     0           05  TIME
238     0               10  HOURS               PIC 99
239     0               10  MINS                PIC 99
240     0               10  SECS                PIC 99
241     0           05  SHOW_TIME REDEFINES TIME    PIC X(6)
242     0           05  DATE
243     0               10  YEAR                PIC 99
244     0               10  MONTH               PIC 99
245     0               10  DAY                 PIC 99
246     0           05  SHOW_DATE REDEFINES DATE    PIC X(6)
247     0           05  DAY_OF_WEEK             PIC 9    ;SUNDAY = ONE
248     0
249     0       ;END COPY LIBRARY - PCLKFDP
250     0       01  ASCNCLK REDEFINES CLKBUF    PIC 9(6)
251     0
252     0       LOCAL VARIABLES
253     0
254     0       FD  URT
255     0       FD  SYS
256     0
257     0       01  KBD_BUFFER                  PIC X(32)
```

```
258   0
259   0     01  KBD_SAVE                        PIC X(32)
260   0   $ PSBAT1P PROGRAM PROGRAM VARIABLES
261   0
262   0     01  PROG_VARIABLES
263   0         05  RESPONSE                    PIC 9
264   0         05  DSP_SIZE                    BINARY BYTE
265   0         05  KK                          BINARY BYTE
266   0         05  M                           BINARY WORD
267   0         05  BATT_PERCENT                PIC ZZ9
268   0         05  STRT_TIME                   PIC 9(6)
269   0         05  RSTRT_TIME REDEFINES STRT_TIME
270   0             10  HRS                     PIC 99
271   0             10  MINS                    PIC 99
272   0             10  SECS                    PIC 99
273   0         05  LOW_TIME                    PIC 9(6)
274   0         05  RLOW_TIME REDEFINES LOW_TIME
275   0             10  HRS                     PIC 99
276   0             10  MINS                    PIC 99
277   0             10  SECS                    PIC 99
278   0         05  END_TIME                    PIC 9(6)
279   0         05  CURR_EIA                    BINARY WORD
280   0         05  SAVE_EIA                    BINARY WORD
281   0         05  RSAVE_EIA REDEFINES SAVE_EIA
282   0             10  SAVE_HIGH               BINARY BYTE
283   0             10  SAVE_LOW                BINARY BYTE
284   0         05  BATT_TIME                   PIC ZZNVN
285   0         05  DEBOUNCE_CHARGER            BINARY BYTE
286   0   $ PSBAT1P PROGRAM MASTER_CONTROL
287   0   ;   OPEN DRIVERS, FILES AND INIT ERROR PROCEDURES
288   0
289   0     PROCEDURE INIT
290   0       ;OPEN(KBD,KBD_BUFFER)'KBDIO1',KB_KEY_CLICK + KB_OFF_CURSOR
291   0                                                       ;OPEN DRIVERS CURSOR OFF
292   0       ;GETCTL(KBD) DSP_SIZE, KB_LCD              ;LED OR LCD DISPLAY?
293   0       ;PUTCTL(KBD) 16, KB_WIDTH,  DSP_SIZE/16, KB_LENGTH   ;LINE_LENGTH 16 CHAR ROW
294   0       OPEN(CLK,CLKBUF)'CLKIO1'
295   6       OPEN(URT)'URTIO1'
296  12       PERFORM MASTER_CONTROL
297  14     END; END INIT
298  15   $
299  15     PROCEDURE MASTER_CONTROL
300  15   ;
301  15       WHILE (INPUT(H+S,'BATTERY TEST?')) DO
302  24         PERFORM BATT_TST
303  26       ENDWHILE
304  28   ;   STOP
305  28     END; END MASTER_CONTROL
306  29   $
307  29     PROCEDURE BATT_TST
308  29   ;
309  29   ;       THIS PROCEDURE ALLOWS THE USER TO SELECT THE BATTERY
310  29   ;       CAPACITY TEST OR NOT.  IF THE CAPACITY TEST IS CHOSEN
311  29   ;       THIS PROCEDURE WILL WAIT UNTIL THE BATTERY CHARGE
312  29   ;       TIMER HAS REACHED FULL CHARGE (DECREMENTED TO ZERO
313  29   ;       FROM 780 MINUTES) BEFORE DISCHARGING IS INITIATED.
314  29   ;
315  29       M = INPUT(H+S,'CAPACITY TEST?')
316  38       GET(CLK)                              ;READ START TIME
317  40       RESPONSE = INPUT(VDO+H,'CURR TIME!',ASGNCLK)
318  50       IF CHRCNT <> 0 THEN PUT(CLK)
319  55   ;*
320  55   ;*   CHARGE TILL BATTERY TIMER = 0 FOR CAPACITY TEST.
321  55   ;*
322  55       IF M THEN
323  58         DEBOUNCE_CHARGER = 10
324  62         REPEAT
325  62           GETCTL(URT) CURR_EIA, UR_SIGNALS
326  66           IF (CURR_EIA AND CHARGE_CNTL) THEN
327  72             OUT(KBD)(KB_HOME)'RCHRG TIME!',BATT_TIME
328  81             WAIT 60                          ;WAIT FOR TIMER
329  84             BATT_TIME = BATT_TIME + 0.1
330  90             DEBOUNCE_CHARGER = 10
331  94           ELSEIF NOT(CURR_EIA AND UR_CHARGE) THEN
```

```
332    103              PERFORM PLUG_IN_CHARGER
333    105            ELSE
334    107              DEBOUNCE_CHARGER = DEBOUNCE_CHARGER - 1
335    112            ENDIF
336    112          UNTIL DEBOUNCE_CHARGER = 0
337    116        ENDIF
338    116        GETCTL(URT) SAVE_EIA, UR_SIGNALS
339    120        IF NOT(SAVE_EIA AND UR_CHARGE) THEN PERFORM PLUG_IN_CHARGER
340    129        PERFORM DEEP_DISCHARGE
341    131     END;
342    132   $
343    132     PROCEDURE DEEP_DISCHARGE:
344    132     ;
345    132     ;       M IS AN INPUT FLAG THAT INDICATES CAPACITY TEST OR NOT.
346    132     ;       THIS PROCEDURE WILL DISCHARGE TILL LB2 (DISCHARGED),
347    132     ;       THEN RECHARGE TILL NOT LB1 (NOT LOW BATTERY),
348    132     ;       TOGGLE THE SHIFT FLAG TO SHOW ACTIVITY.
349    132     ;
350    132     ;       ALLOW THE INTERPRETER TIME TO DO ITS THING.
351    132     ;       IPHONA WILL SET CHARGE_CNTL (FAST CHARGE) WHEN LB2 IS REACHED.
352    132     ;
353    132     ;       WHEN NOT LB1 IS REACHED DISPLAY THE START TIME,
354    132     ;       LB2 TIME, AND NOT LB1 TIME. IF THE CAPACITY TEST WAS
355    132     ;*      CHOSEN THE BATTERY CAPACITY WILL THEN BE CALCULATED
356    132     ;       ON AN 8 HOUR BASE AND THEN DISPLAYED TO THE USER.
357    132     ;       BATTERY CAPACITY WILL NOT EXCEED 100 PERCENT.
358    132     ;
359    132        GET(CLK)                                    ;READ STARTING TIME
360    134        STRT_TIME = ASGNCLK
361    137     ;*
362    137     ;*  TURN ON DISCHARGE, TURN OFF FAST CHARGE FOR MAINS & BACKUP.
363    137     ;*
364    137        PUTCTL(URT) DISCHARGE, UR_SET,
365    137     &              UR_BACKUP+CHARGE_CNTL, UR_RESET ;TURN ON DISCHARGE
366    147        OUT(KBD)(KB_HOME)'DISCHARGING.'
367    156        REPEAT
368    154          'WAIT 55
369    157          PUTCTL(KBD) KB_LOCK
370    161          GETCTL(URT) CURR_EIA, UR_SIGNALS
371    165          IF NOT (CURR_EIA AND UR_CHARGE) THEN
372    172            PERFORM PLUG_IN_CHARGER
373    174     ;*
374    174     ;*  RECOVER FROM IPHONA AFTER TAKEN OFF WALL CHARGER
375    174     ;*
376    174            PUTCTL(URT) DISCHARGE, UR_SET,
377    174     &                  UR_BACKUP+CHARGE_CNTL, UR_RESET
378    184            GETCTL(URT) CURR_EIA, UR_SIGNALS
379    188          ENDIF
380    188          WAIT 10
381    191          PUTCTL(KBD) KB_UNLOCK
382    195        UNTIL (CURR_EIA AND UR_LOWBATT) OR (CURR_EIA AND CHARGE_CNTL)
383    206     ;*
384    206     ;*  LB2 REACHED (BATTERIES DISCHARGED)
385    206     ;*
386    206        GET(CLK)                                    ;READ LB2 TIME
387    208        LOW_TIME = ASGNCLK
388    211     ;*
389    211     ;*  TURN OFF DISCHARGE, TURN ON FAST CHARGE FOR MAINS & BACKUP.
390    211     ;*
391    211        PUTCTL(URT) DISCHARGE, UR_RESET,
392    211     &              UR_BACKUP+CHARGE_CNTL, UR_SET
393    221        OUT(KBD)(KB_HOME)'RECHARGING.'
394    228        REPEAT
395    228          WAIT 55
396    231          PUTCTL(KBD) KB_LOCK
397    235          GETCTL(URT) CURR_EIA,UR_SIGNALS
398    239          IF NOT(CURR_EIA AND UR_CHARGE) THEN PERFORM PLUG_IN_CHARGER
399    240          WAIT 10
400    251          PUTCTL(KBD) KB_UNLOCK
```

```
401  255      UNTIL ( NOT (CURR_EIA AND UR_LOWBATT))
402  262   ,*
403  262   ,*   NOT LB1 REACHED (BATTERIES OUT OF LOW BATT)
404  262   ,*
405  262      GET(CLK)                                      ;READ NOT LB1 TIME
406  264      END_TIME = ASONCLK
407  267      RESPONSE = INPUT(H+V,'S TIME:',STRT_TIME)
408  267  & +          INPUT(V,'LB2 TIME:',LOW_TIME)
409  267  & +          INPUT(V,'LB1 TIME:',END_TIME)
410  295      IF M THEN                                     ;WAS THIS CAPACITY TEST?
411  298         IF RSTRT_TIME.HRS > RLOW_TIME.HRS THEN
412  298  &        RLOW_TIME.HRS = RLOW_TIME.HRS + 24
413  309         BATT_PERCENT = (((RLOW_TIME.HRS * 3600) + (RLOW_TIME.MINS * 60)
414  309  &             + RLOW_TIME.SECS) - ((RSTRT_TIME.HRS * 3600)
415  309  &             + (RSTRT_TIME.HRS * 60) + RSTRT_TIME.SECS))
416  309  &             / 288       ;288 = 100/(8HRS * 3600)
417  337         IF BATT_PERCENT > 100 THEN
418  337  &        BATT_PERCENT = 100
419  347         RESPONSE = INPUT(H+V,'X CAPACITY:',BATT_PERCENT)
420  357      ENDIF
421  357    END;
422  358    $
423  358    PROCEDURE PLUG_IN_CHARGER
424  358    ;
425  358    ;  THIS PROC IS EXECUTED WHEN THE TERMINAL IS TAKEN OFF
426  358    ;  CHARGE WHILE IT IS TRYING TO CHARGE/DISCHARGE.
427  358    ;  AN ERROR MESSAGE IS DISPLAYED AND THE USER HAS 30 SECONDS
428  358    ;  TO PLACE THE UNIT BACK ON CHARGE UNTIL THE TEST IS ABORTED.
429  358    ;
430  358      KBD_SAVE = KBD_BUFFER                          ;SAVE DISPLAY
431  361      KK = 5                                         ;GIVE 30 SECONDS TILL ABORT
432  364      REPEAT
433  364         OUT(KBD)(KB_HOME)'CHARGER ',BEL
434  374         WAIT 60                                    ;GIVE TIME TO UPDATE DISPLAY
435  377         KK = KK - 1
436  382         GETCTL(URT) CURR_EIA, UR_SIGNALS
437  384      UNTIL ((KK = 0) OR (CURR_EIA AND UR_CHARGE))
438  395      IF KK = 0 THEN
439  399         PUTCTL(URT) SAVE_LOW, UR_SET,
440  399  &             UR_DIR+UR_RTS+UR_RCT+UR_TXD+UR_SCAN+DISCHARGE+
441  399  &             UR_BACKUP+CHARGE_CNTL, UR_RESET
442  408                                                    ;RESTORE ORIGINALS
443  408         PUTCTL(KBD) KB_UNLOCK
444  412         RESPONSE = INPUT(E,'TEST ABORTED.' & BEL)
445  423         RETURN MASTER_CONTROL
446  426      ENDIF
447  426      KBD_BUFFER = KBD_SAVE                          ;RESTORE BUFFER
448  429      PUT(KBD)                                       ;REDISPLAY
449  431    END;
450  432
451  432
452  432  END INIT; END OF PROGRAM PSDAT1P

0  ERROR DIAGNOSTICS IN PSDAT1P    ( 0 ERROR,  0 WARNING )
     432  BYTES OF MODULE CODE STORAGE,   147 BYTES OF DATA STORAGE
      10  LITERALS GENERATED IN MODULE,   203 BYTES OF DATA AND POINTERS
      25  VARIABLES ACCESSED IN MODULE,   125 BYTES OF FIELD DEFINITIONS
     805  TOTAL BYTES IN OBJECT FILE

2936  WORDS OF COMPILER SPACE USED, 20000 WORDS AVAILABLE FOR ALLOCATION
```

Description of Functions and Features of an Embodiment Such as Shown in FIGS. 12-14

At the time of development of the circuit of FIG. 13, a preliminary summary of available functions and features of the system of FIGS. 12 and 13 was prepared. A copy of excerpts from an edited version of this summary, directed to the commercial Model 121 data terminal unit utilizing the circuit of FIG. 13, is found hereafter.

Preliminary Summary of Present Functions and Features of the 121, Semi-Intelligent Battery Controller The 121 Battery Controller coupled with existing real time clock and NSC-800 CPU integrates a maximum number of features with minimum circuit duplication for an extremely versatile yet low cost solution.

The controller is designed to match the NICAD-Battery characteristics with the 121 requirements and is software and user adjustable to match the customers changing needs.

The most outstanding features of this 121 battery controller combination are as follows:

**Conditioning Charge

The periodic use of this feature virtually eliminates the memory effect of voltage depression and extends normal battery sevice life @ 1 year. This is accomplished by a controlled deep discharge of both the main batteries and backups. Followed by a normal recharge for 12 hours then automatically switch to stand by charge.

**Capacity Test

The capacity of main and backup batteries can be measured to precisely indicate battery condition and determine when a conditioning charge is necessary or when batteries should be replaced. This is done by a full recharge (12 hours) followed by a controlled timed constant current deep discharge at a C/5 rate, where the capacity is measured by the NSC-800 processor and is displayed as % of full capacity available, followed by a regular charge.

*Charge Efficiency Test

Can be used to find optimum charge rate, charge time, or an indicator of poor battery performance. This test is performed by deep discharging the batteries followed by a timed constant current charge and a timed constant discharge, then the CPU calculates charge efficiency. A normal recharge cycle follows.

*Normal Recharge

A complete recharge is accomplished in 12 hours. At a constant current rate at C/8.3, recharge is controlled by the CPU and initiated by plugging unit into charger.

**Over-Charge Protection

This feature prevents over-charge if unit is continually plugged in and out from a charger such as in route accounting. In addition, when the unit is unplugged from a charger, the CPU will increment an elapsed time counter by a constant of two minutes for every minute off charge, until a maximum of 12 hours has been incremented, (six hours of real time). When returned to charger the CPU will decrement from the incremented amount to determine charge time. Maximum charge time of 12 hours is set whenever the unit has been turned off.

*Fuel Gauge Feature

From a full charge, (when the charge counter is at ∅), the 121 can calculate operating time remaining. This is done by incrementing a counter by a constant for operating time and a constant for standby time to find the amp-hour drained from a fully charged battery pack.

*Variable Recharge Rate

A wide range of charge rates and times are under CPU control. Fast charge models could be made available with a resistor charge and appropriate software.

**Standby Holding Charge

This feature keeps the batteries at full charge ready for use by charging them at a C/100 rate. Control by the CPU.

**Charge Indicator

A positive indication of unit being plugged into charge is displayed regardless of on/off switch. Controlled by CPU.

*Remote control and diagnostics can be performed or telecom of battery parameters.

Battery testing and conditioning can be performed without an onsite inspection.

*Self Diagnostic Battery Testing Capability

Production—During manufacturing, units can be programmed to cycle batteries several times and measure their capacity to identify defective units before they leave the plant.

Field Test—Battery condition can be easily checked by Field Service.

User Test—The customer can check the condition of his batteries.

**Temperature Protection Over-Under

Over and under temperature protection is an integral part of the battery pack reducing possible abuse and promoting longer battery life. Units will taper back charge rate at low temperature below 10° C. and cut back to trickle rates at high battery temperature above 55° C.

**Low Battery Indicator

Tells user when batteries must be recharged to prevent loss of memory data, giving the user a minimum of 30 minutes standby operation until recharge.

**Deep Discharge Indicator

During a discharge the controller tells CPU when batteries are completely discharged.

*All functions and features excluding (internal) temperature protection are under software control and thus can be modified for optimum performance throughout life.

**Battery pack hardware can accommodate 1/2D cells with only resistor changes from the 3/5C pack.

**The software and functions are the same with 1/2D or 3/5C cells so as to allow the changing of different packs if desired at a later date without changes internal to the 121 hardware or software.

**The present 121 design with the semi-intelligent battery controller remains hardware compatible with the "smart" battery pack.

Beyond this, the complete cost of all parts of the customer replaceable 121 semi-intelligent battery controller is less than $27 including four 3/5C cells. This is based on 100p quantities. Production quantities would represent a parts cost reduction.
*May be included for further reliability and functionality.
**Required features for reliable operation in all applications.

Definition of 121 Battery Pack Control Lines

Charge Control (P 3-5)
CHARGE CONTROL,
Standby charge
Rate c/100
CHARGE CONTROL,
Full charge
Rate C/8.3
Discharge (P 3-4)
DISCHARGE,
Discharge is disabled
LB1 is activated
DISCHARGE,
Discharge is enabled at a −c/5 rate
LB2 is now active
LB1/LB2 (P 3-1)
LB1 is the low battery detect of 4.65 volts and is reset high at 5.4 V.
LB1, indicates low battery
LB1, not low battery
LB2 is the discharged detect of 3.8 volts and is reset high at 5.4 V.
LB2, indicates main and backups are completely discharged
LB2, not discharged
+BATT (P 3-2)
Normally +5 volts from 4 cell battery
−BATT (P 3-6)
Ground line
CHARGE
Is a constant current charge limited to 0.66 amp on the CPU board.

121 Semi-Intelligent Battery Controller

Operational Sequence of Required Features

CHARGE COUNTER
Is a software function to simplfy battery pack operational description.
(1) Charge counter enables the charge control
Charge counter>0, charge control high
Charge counter=0, charge control low
(2) Counter is decremented by real time to zero when charge control is high.
(3) Counter is incremented by two times real time up to a maximum of 12 hours whenever unit is taken off charge while turned on.
(4) If the unit is turned off and not plugged in to charge, then on power up, counter will set to 12 hours.
(5) Counter is set to 12 hours when LB1 or LB2 is present.
(6) Discharge sets counter to zero.
NORMAL RECHARGE/OVER CHARGE PROTECTED
(1) When unit is plugged into charger and charge counter is zero.
(2) Charge control will always be low if not plugged in to charge.

STAND-BY CHARGE
(1) When unit is plugged into charger and charge counter is zero.
LOW BATT (DISPLAY)
(1) Will be displayed during LB1 or LB2
BATT RECHARGING (DISPLAY)
(1) When plugged into charge it will always be enabled in one of two modes.
(A) Will be on steady when charge counter is zero, signifying a full charge or that a user selectable function is complete.
(B) Will blink on and off when charge counter is not zero or user selectable function is in progress.
CHARGING FUNCTION AND STATUS (DISPLAY)
When the unit is turned off or on and plugged into charger if possible
(1) Indicate if a user selectable function is in progress and the time remaining to end of function.
(2) During normal recharge display the charge counter time such as

| TIME TO FULL RECHARGE XX:XX | and | FULL RECHARGE READY |
|---|---|---|

*CONDITIONING CHARGE
(1) Key in "CONDITIONING CHARGE"
(2) Discharge until LB2
(3) Display "CONDITIONING COMPLETE"
*CAPACITY TEST
(1) Key in "CAPACITY TEST"
(2) Charge until charge counter is zero
(3) Discharge until LB2
(4) Discharge time/s is the percent of full rated capacity
(5) Display "XXX % CAPACITY AVAILABLE"
*USER SELECTABLE BATTERY FUNCTIONS: These functions can only be started and performed while charger is plugged in with unit turned on. If charger is unplugged before function is complete, then cancel and display "TEST INVALID".

Description of an Embodiment Corresponding to FIGS. 12–14 for Conditioning Spare Battery Packs As previously explained the embodiment of FIGS. 12, 13 and 14 can represent a stationary battery conditioning system, for example for conditioning nickel cadmium battery packs of the Model 121 portable data terminal unit as described herein.

The following shows a copy of a preliminary summary of recommendations for a charger system to be used with spare battery packs for the Model 121.

The "smart" battery pack is shown by FIGS. 2, 3, 4, 5, 9A, 9B, 10 and 11 herein.

This report contains a preliminary summary of recommendations for a dual charger system to be used with spare NT121 battery packs.

Its intended use is to charge spare NT121 battery packs consistent with all functions and features of the NT121 controller combination to ensure equivalent life and reliability is achieved.

The applicable functions of the 121 battery charger are as follows:
Conditioning Charge
Capacity Test
Normal recharge
Over-charge Protection Variable Recharge Rate
Standby Charge
Charge Indicator
Low Battery Indicator
Deep Discharge Indicator
Software Control
Hardware Control
Hardware Compatible with Smart Battery Pack

Conditioning Charge

The periodic use of this feature virtually eliminates the memory effect of voltage depression and extends normal battery service life to one year. This is accomplished by a controlled deep discharge of both the main batteries and backups. This is followed by a normal recharge for 12 hours, then automatically switched to standby charge.

Capacity Test

The capacity of the battery pack can be measured precisely to indicate battery condition and can determine when batteries shoucl be replaced. This is done by a full recharge (12 hours) followed by a constant current deep discharge at a C/8 rate where the capacity is measured and displayed as a percent of full capacity or absolute capacity in amp hours. This is followed by a regular charge.

Normal Recharge

A complete recharge is accomplished in 12 hours at a constant current rate of C/8.3. Recharge is controlled by the CPU and initiated by the charge counter or the user.

Over-Charge Protection

This feature prevents over-charge and keeps the battery at a full charge. When the unit is unplugged from a power source, the CPU will increment an elapsed time counter by a constant of one minute for every 20 minutes off charge. Until a maximum of 12 hours has been reached (10 days of real time) when returned to a charge, the CPU will decrement from the incremented time to determine charge time. Maximum charge time of 12 hours is set whenever the batteries are removed from the holder.

Variable Recharge Rate

A wide range of charge rates and times are under CPU control. Fast charge models could be made available with a resistor charge and appropriate software.

Stand-by Holding Charge

This feature keeps the batteries at full charge ready for use by charging them at a C/100 rate. Control by the CPU.

Charge Indicator

A positive indication of unit being plugged into charge is displayed regardless of on/off switch. Controlled by CPU.

Full Charge Indication

To indicate to the user that the battery pack is fully charged and ready for use.

Low Battery Indicator

Indicates a dead battery. May not be required.

Deep Discharge Indication

Indicates a deep discharge is complete. May not be required.

Software Control

For ease of future modification if required.
Hardware Compatible with the "smart" battery pack.

Figure 15:
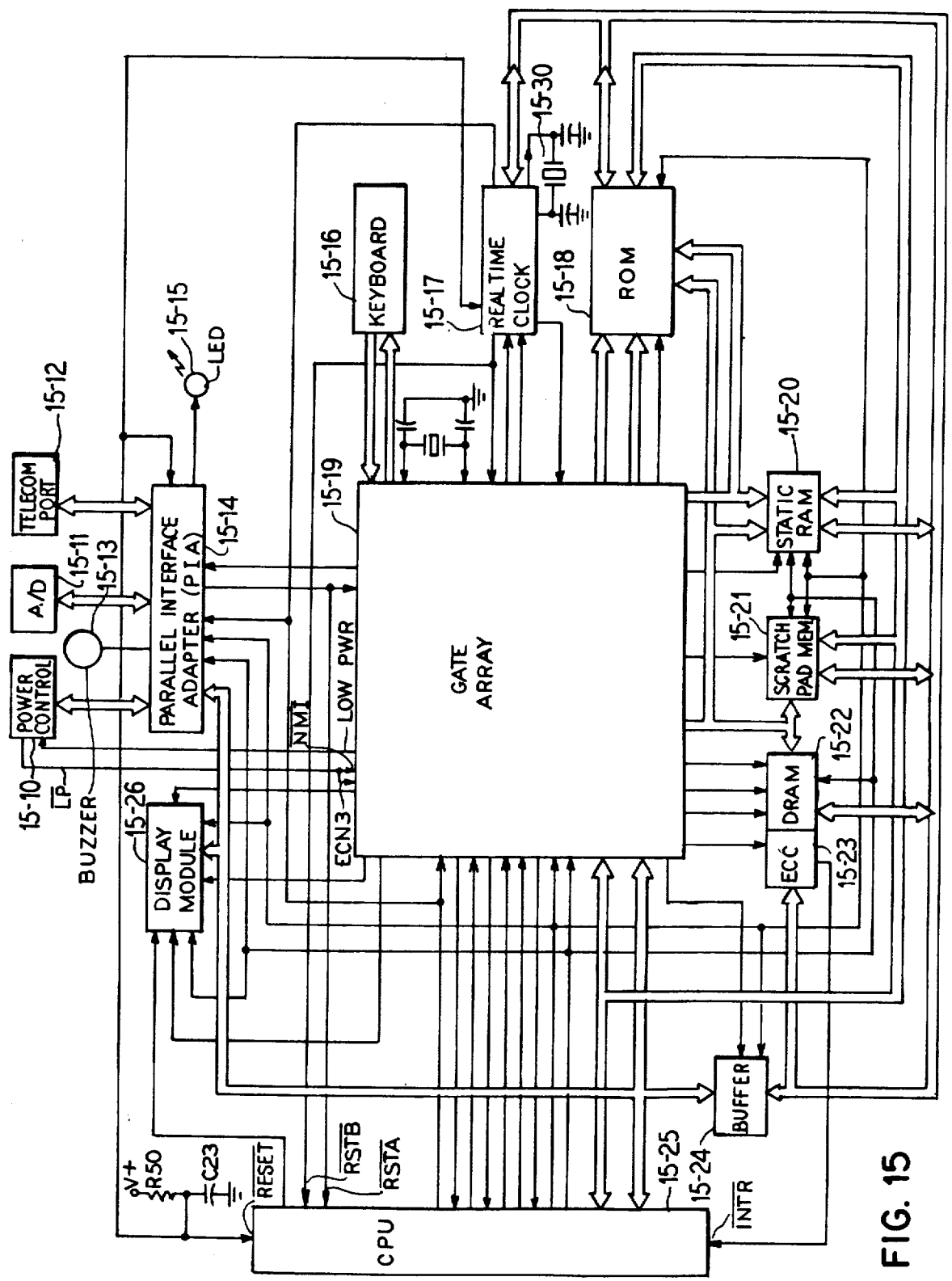
FIG. 15 shows a block diagram for illustrating an exemplary commerical implementation of the present invention.
Figure 16B:
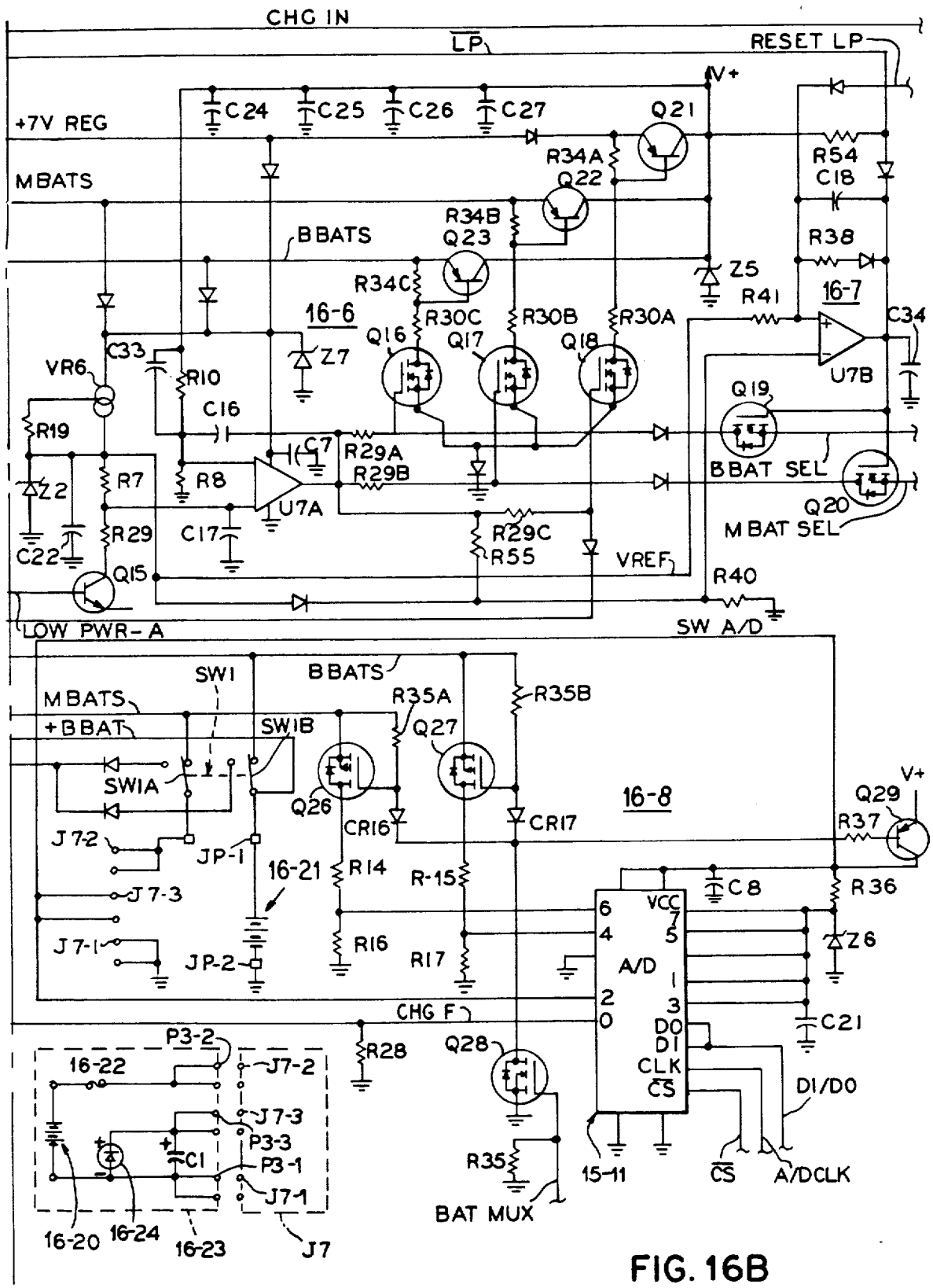
FIG. 16B shows a continuation of the electric circuit diagram of FIG. 16A to the right, and particularly illustrates preferred regulator circuitry, preferred low power detection circuitry, and the preferred association of an integrated circuit analog to digital converter means with a main battery means and a backup battery means, in accordance with a preferred commercial implementation of the present invention.

Description of FIGS. 15, 16A and 16B

The general block diagram of FIG. 12, the more specific block diagram of FIG. 5, and the block diagram of FIG. 15 are all considered applicable to a preferred commercial implementation of the present invention whose relevant electric circuitry is shown in greater detail in FIGS. 16A and 16B. (FIG. 5 would have the label for block 20 changed to read RECHARGEABLE MAIN AND BACKUP BATTERY MEANS; and would have labels for blocks 91 and 92 of MAIN BATTERY VOLTAGE MONITOR and BACKUP BATTERY VOLTAGE MONITOR in order to more precisely represent the specific implementation of FIGS. 16A and 16B.) The physical appearance of a portable data system corresponding to the preferred commercial implementation is essentially represented in FIG. 1, while the basic appearance of the main battery pack is essentially as represented in FIG. 4. As best seen in FIG. 16B, a departure from the embodiment of FIGS. 1 through 11 resides in the provision of a main battery means indicated diagramatically at 16-20 and a backup battery means indicated at 16-21, the backup battery means preferably also being a rechargeable battery with the same nominal output voltage. In the illustrated arrangement of FIG. 16B, the main battery is connected via contact SW1A of a manually operated switch SW1 to a conductor MBATS. A fuse 16-22 may be contained within the battery pack housing represented by the dash line 16-23. Further, a temperature sensor component 16-24 for measuring ambient temperature is preferably contained within the housing 16-23 containing the main battery 16-20.

The relevant signals and conductors of the system of FIG. 15 are designated with the same symbols as the corresponding signals and conductors in FIGS. 16A and 16B for convenience in correlating these figures. It will be understood, however, that the specific implementation for component 15-10 shown in FIGS. 16A and 16B is given by way of preferred example only, and not by way of limitation.

Referring to FIG. 15, the power control component 15-10 shown at the upper central part of the figure, may include the specific circuits of FIGS. 16A and 16B, as a preferred exemplary instance. Thus, component 15-10 preferably includes main battery means, standby battery means, a charge voltage input circuit, a main battery charging circuit, a backup battery charging circuit, individual main and backup battery discharge circuits, regulator circuitry including a charging voltage regulating circuit, a main battery voltage regulating circuit and a backup battery regulating circuit, and a low power detection circuit.

A tabulation of the components of FIG. 15 is as follows:

| | |
|---|---|
| 15-10 | Power Control circuitry (e.g. FIGS. 16A and 16B) |
| 15-11 | Analog to digital converter (e.g. type ADC0838CCN of National Semiconductor Corp. with differential configuration) |

| | |
|---|---|
| 15-12 | Telecom port for coupling e.g. to a modem and a printer |
| 15-13 | Buzzer (e.g. driven at 2048 hertz with approximately a twenty percent duty cycle) |
| 15-14 | Parallel Interface Adapter (e.g. type MC 146823 of Motorola, Inc.) |
| 15-15 | Red LED signal source (e.g. on keyboard 15-16 to indicate when the unit is plugged into a charger) |
| 15-16 | Keyboard (e.g. as shown at 11 in FIG. 1) |
| 15-17 | Real time clock (e.g. type 146818 driven by a 32.768 kHz crystal) |
| 15-18 | Read only memory (eg. Intel compatible NMOS EPROMS) |
| 15-19 | Gate array (e.g. type SCX 6224 of National Semiconductor Corp.) |
| 15-20 | Static random access memory (e.g. CMOS RAM for maximum battery life) |
| 15-21 | Scratch pad memory (e.g. a CMOS static RAM chip with address decoding in the gate array 15-19 or a dynamic random access memory with address decoding in the gate array 15-19) |
| 15-22 | Dynamic random access memory (e.g. with either seven bit or eight bit refresh) |
| 15-23 | Optional error correction circuit (ECC) |
| 15-24 | Optional CMOS RAM data bus buffer (e.g. a 74HCT245 bidirectional buffer with TTL compatible inputs for translating from NMOS/TTL levels from the dynamic random access memory 15-22 or from the NMOS electrically programmable read only memory 15-18 to the CMOS levels for the central processing unit 15-25). |
| 15-25 | Central processing unit (e.g. type NSC 800N high-performance low-power microprocessor of National Semiconductor Corp.) |
| 15-26 | Display module (e.g. a two line, 32-character alphanumeric LCD display, with a 64 character set and eight programmable characters) |

Description of a Specific Commercial Implementation of FIG. 15

An exemplary commercial embodiment in accordance with FIG. 15 is made up of four boards, a ROM board, a CPU board, a RAM board and a battery board, and also the LCD display module 15-26 and the keyboard module 15-16. The ROM, CPU, and RAM boards mate together via an eighty pin stake header system. The display module 15-26 is mounted on the CPU board and connects to the CPU 15-25 through a twenty-one ribbon cable. The keyboard 15-16 plugs into the ROM board via a seventeen pin stake header. The battery board connects to the CPU board via a six conductor pressure contact system such as indicated in FIG. 2 and FIG. 5 at 41, 51.

The CPU board contains all logic decoding for every device in the unit except for one three-to-eight decoder which is on the CMOS RAM board, and also contains power control circuitry such as shown in FIGS. 16A and 16B, interface circuitry for the communication port (component 15-12, FIG. 15) and components performing various other functions.

The central processing unit 15-25 in a specific implementation of FIG. 15 is of a type which combines the features of the Intel 8085 and the Zilog Z80 in P2CMOS technology. The CPU has direct addressing for 64K bytes of memory, 250 input/output devices, and five prioritized interrupts. The definition of the interrupts is given below.

NMI—DEBUG MONITOR
RSTA—PARALLEL INTERFACE ADAPTER
RSTB—REAL TIME CLOCK INTERRUPT
RSTC—KEYBOARD INTERRUPT
INTR—MEMORY ERROR

Upon power up, the NSC800 CPU is reset for approximately 150 miliseconds and then begins execution from ROM component 15-18 at addresss 000H. The processor frequency is programmable. The CPU clock can be stopped in a CMOS version to conserve power. Further details concerning the NSC800 can be found in National Semiconductor's "NSC800 Microprocessor Handbook".

The gate array component 15-19 is designed to minimize the number of integrated circuits in the unit and to maximize its flexibility. The gate array is a type 6224 chip which contains memory mapping registers that expand the total address capabilities of the NSC800. Other major features include a self-scanning keyboard circuit, logic decoding for all devices in the unit, and processor frequency control circuitry.

The parallel interface adapter chip on the CPU board contains three eight-bit programmable input/output ports A, B and C. Port A controls the battery charge/discharge functions, battery select functions, and power control for the analog to digital converter 15-11. Port B contains three bits for communication to the A/D converter 15-11, a buzzer port and four bits for telecommunications (via component 15-12). Port C has one bit for controlling LED light source 15-15 on the keyboard 15-16 to indicate that the charger is plugged in, and seven bits used for telecommunications (via component 15-12). The top four bits of Port C can also be programmed as interrupts which are brought into the NSC800 at the RSTA input. Reference may be made to Motorola's 146823 PIA specification for more details.

All digital integrated circuits are regulated at 4.65 volts for normal operation. The regulation circuit of component 15-10 is designed to run independently either from a charger, from a main battery, or from a backup battery. This is accomplished through PA0 and PA3 on the PIA chip 15-14. In the event that the regulated voltage falls below 4.65 volts, the signal $\overline{LP}$ (complement) from component 15-10 goes low and brings both the main and backup batteries on line. This signal ($\overline{LP}$) will also "wake up" the system through gate array 15-19 if it was previously in a low power mode. The processor component 15-25 can read the state of the line $\overline{LP}$ from a port of the gate array 15-19.

In the CMOS version, the 4.65 volt regulation circuit can be switched to regulate at 2.5 volts via the line LOW PWR which originates at the gate array 15-19 and shifts the reference voltage of the regulation circuit of component 15-10.

Component 15-11 comprises a serial, differentially configured analog to digital converter. The parameters measured are main battery voltage, backup battery voltage, charger voltage, and main battery temperature. This information is used by the processor 15-25 to control battery charge/discharge cycles and to alert the end user of low battery conditions.

The differential mode of component 15-11 effectively increases the resolution to nine bits (512 steps) from eight bits (256 steps) over a given range of measurement. However, in the differential mode, two channels are required per parameter to be measured as opposed to one channel in a single-ended mode. Each of the parameters and its associated channels are given below.

| PARAMETER | CHANNELS |
|---|---|
| CHARGE VOLTAGE | 0,1 |
| TEMPERATURE | 2,3 |
| BACKUP BATTERIES | 4,5 |
| MAIN BATTERIES | 6,7 |

One channel associated with each parameter is tied directly to the 2.5 volt reference (VR). These channels are 1, 3, 5 and 7. With this setup, the voltage span on channels 0, 2, 4 and 6 is two times VR (5.00 volts), or the supply voltage of the A/D converter 15-11, whichever is at a lower voltage. Since the supply to the A/D converter is regulated to 4.65 volts, it becomes the upper limit for all channels.

The A/D converter 15-11 is read serially on Port B of the PIA chip 15-14, and is powered up or down by a bit on Port A. When the A/D converter is powered down (PA6=0), the control lines to the A/D converter on Port B should be at logic zero (0).

A reading of the A/D converter commences by bringing a pin (PB0) of the PIA to a low state, and then supplying from a further pin (PB1) of the PIA a clock signal for clocking into the A/D converter the proper channel and mode (differential) (via PIA pin PB2). The clock signal to the A/D converter must have a 40/60 duty cycle minimum. Next, the A/D converter is reprogrammed to supply a channel reading to the PIA (at pin PB2).

If a 00H is read from a channel of the A/D converter, (such as channel 0) then the other channel of that pair must be read (channel 1 in this case). If both channels read zero, then the parameter is at the midpoint of its range.

In the ROM board, each ROM socket has associated jumpers to allow the use of 8K bytes, 16K bytes, 32K bytes, and 64K bytes Intel compatible NMOS EPROMs. Each ROM socket can also handle a SEEQ compatible 8K byte EPROM. In this mode, the particular ROM socket is set up as a 8K byte EPROM.

Each ROM in the commercial unit can be powered up or powered down under software control to conserve power. The ROMs must be NMOS type or be able to withstand being over-driven on all of the pins in the power down mode. Each ROM receives its power through a saturated switch which is controlled through the MMU registers in the gate array 15-19.

The real time clock 15-17 provides time-of-day functions for the commercial unit and also a 8192 Hz square wave for driving circuitry in the gate array 15-19 on the CPU board. A programmable interrupt is available from the real time clock to the RSTB input of the CPU 15-25. The real time clock chip 15-17 is driven by a crystal 15-30 and may be adjusted by means of a variable capacitor.

The buzzer circuit 15-13 on the ROM board is controlled by software through PB7 on the PIA chip 15-14 of the CPU board. Software should drive the buzzer 15-13 at 2048 Hz with approximately a twenty percent duty cycle (PB7=1). The buzzer signal is inverted by a PNP transistor that drives the charge jack (J6, FIG. 16A) to allow an external buzzer to be connected to the commercial unit.

An optional LED component 15-15 can be added to the keyboard 15-16. A transistor and current limiting resistors are added to the ROM board for controlling this LED. The transistor is turned on by making PC0=1 of the PIA chip 15-14 on the CPU board.

A 17 pin socket is provided on the ROM board for keyboard attachment. A backlight control signal is brought up to this socket in case an electroluminescent panel is used on the keyboard 15-16. The signals on this connector originate from the gate array 15-19 on the CPU board.

The DRAM board has two banks of RAM that accept 64K by one bit or 256K by one bit chips with either 7-bit or 8-bit refresh. Loading is customer dependent.

For maximum data integrity, an optional error correction circuit 15-23 can be loaded onto the RAM board. If the error correction circuit is loaded, then each bank of RAM of component 15-22 must also be loaded with four extra DRAMs to store the parity code. The circuit 15-23 will detect and correct all single bit errors and also alert the CPU component 15-25, in this case on the INTR interrupt.

The bidirectional buffer 15-24 is provided with TTL compatible inputs on the RAM board and is used to translate the data bus from NMOS/TTL levels from the DRAM component 15-22, and from the NMOS ROM component 15-18 of the ROM board to CMO levels for the CPU component 15-25 on the CPU board. Also, the buffer 15-24 unloads the data bus from the CPU component 15-25, which minimizes propagation delays to the gate array 15-19.

A 2K byte or 8K byte CMOS RAM chip forms component 15-21 and is loaded on the DRAM board to provide "scratch pad area" for the system software. Jumpers are included to switch between the 2K or 8K device. If an 8K byte device is loaded, 4K bytes of this are available. The address decoding for this chip 15-21 is done in the gate array 15-19.

An option in the commercial unit is a completely static CMOS RAM board as component 15-20. This provides maximum battery life for the customer. There are eight positions for 8K byte CMOS RAM chips for a total of 64K bytes maximum. Loading is customer dependent. Decoding is provided by a three to eight demultiplexer.

The same data bus buffer of component 15-24 is loaded on the CMOS RAM board and serves as a translator from NMOS EPROMs to CMOS levels for the CPU component 15-25.

The CMOS RAM board has the same option for scratch pad RAM as the DRAM board previously discussed.

The main battery pack (16-25, FIG. 16B) has a printed circuit board inside with a six conductor flex cable for mating to the CPU board. Also on this board is a LM35 temperature sensor 16-24 for monitoring battery temperature during charge cycles. A one microfarad capacitor (C1, FIG. 16B) is across the LM35 component 16-24 to filter out noise. The LM35 is read by the A/D converter 15-11 on the CPU board.

A custom LCD module for component 15-26 is available from Seiko and plugs into the CPU board. This module is temperature compensated for minus twenty degrees centrigrade to sixty degrees centrigrade operation. The module provides two by sixteen dot matrix display with self-scanning features. Also in the module are four annunciators that are controlled by a LCD driver chip on the CPU board.

The commercial unit is set up to handle a forty key keyboard configured as a five by eight matrix. At the present time, a 39 key and a 20 key option are available for keyboard component 15-16. A LED 15-15 may be loaded onto the keyboard to indicate various functions.

Detailed Description of FIGS. 16A and 16B

At the charge input (J6, FIG. 16A) on the CPU board, a circuit comprising components Q2, Z4 and VR1 prevents the voltage at the charge input from reaching the direct current to direct current converter circuit 16-1 unless the charge input voltage exceeds 7.5 volts. This charge input cutout circuit provides the following functions.

(a) The buzzer circuit on the ROM board can drive the charge line J1-11 with a two kilohertz, zero to five volts swing and thus allow double duty of the charge jack J6.

(b) The circuit limits the in-rush current to less than two amperes so as not to blow the one ampere fuse F1 at the charge input.

(c) The charge input circuit insures that the charge/discharge circuits 16-2, 16-3 and 16-4, 16-5 do not power up until the charge voltage exceeds the maximum battery voltages.

The input cutout circuit is comprised of pass transistor Q2, 6.2 volt Zener diode Z4, and regulator VR1. When charge input voltage reaches approximately 7.5 volts, Z4 conducts and turns on Q2, which saturates. The voltage regulator VR1 limits the current through Z4 and thus limits the gain of Q2.

The charger input voltage on the CPU board is regulated down to 7.2 volts by a switching direct current to direct current converter 16-1. This converter provides up to 750 milliamperes with a wide input voltage range of ten volts to twenty volts.

The regulated 7.2 volts of the DC/DC converter 16-1 feeds the linear V+ regulation circuit 16-6 (FIG. 16B) and the battery charge/discharge circuits. When the unit is turned off, (at switch SW1, FIG. 16B) pin 6 of the component RC 4192 NB in the circuit 16-1 is pulled low to keep the converter 16-1 powered down.

Incorporated onto the CPU board is circuitry to charge or discharge the main and backup batteries independently. These circuits maximize the life of the batteries and give the end user a means by which to measure the capacity of each battery set. The battery charge functions are controlled through port A of the PIA chip 15-14.

The main battery set indicated at 16-20 in FIG. 16B (at the lower left), which is rated at 2.2 amperes, is set up to charge at a 275 milliampere rate (C/8). This is accomplished by making PA4=0 and PA5=0 on the PIA chip 15-14. When the main batteries are charging, operational amplifier U6 (shown at the lower part of FIG. 16A at the left) is set up as a constant current source by forcing the collector of Q8 to 0.275 volt above the battery voltage. The floating voltage reference Z1 senses Q8 collector voltage and then effectively subtracts 0.275 volts across R33 which is then fed back to the inverting input of op-amp U6. The noninverting input of U6 closes the loop by sensing the main battery voltage. Constant current source VR5 limits the battery drain through Z1 which is especially important in the CMOS version of the commercial unit.

The main batteries can be made to discharge at a constant C/8 rate by making PA5=1 and PA4=1 of the PIA chip 15-14. This turns on Q10 and allows VR2 to act as a constant current sink.

The backup batteries indicated at 16-21 at the lower left part of FIG. 16B (rated at 225 milliampere hours) can be made to charge under software control at a C/8 rate by making PA1=1 and PA2=0 on the PIA chip 15-14. This saturates Q12, and VR3 acts as a constant current source to the backup batteries 16-21, FIG. 16B.

The backup batteries 16-21 can discharge at a constant current of C/8 by making PA2=1 and PA1=0 at the PIA component 15-14. This saturates Q14, allowing VR4 to act as a constant current sink.

Both the main and backup batteries will trickle charge at a C/100 rate if they are not in a charge or discharge cycle and the 7.2 volt DC/DC converter 16-1 is within regulation. This is accomplished by switching different resistors into the current sources that feed the main and backup batteries, which is done automatically when the particular set of batteries is taken off a C/8 charge.

All the digital integrated circuits of the system of FIG. 15 are regulated at 4.65 volts for normal operation. This is accomplished by operational amplifier U7A, FIG. 16B, pass transistors Q21, Q22 and Q23, and voltage reference Z2 (shown at the central left of FIG. 16B). The regulation circuit 16-6 is designed to run independently off either the charger input voltage at J6 (at the upper left of FIG. 16A), main battery voltage, or backup battery voltage. This is accomplished through PA0 and PA3 of the PIA chip 15-14. In the event that the regulated voltage falls below 4.65 volts, the output of comparator U7B (at the middle right part of FIG. 16B) goes low and brings both the main and backup batteries on line. The output of comparator U7B will also "wake up" the system via the line LP through the gate array 15-19 if the system was previously in a low power mode. Software can also read the state of this signal through port 2 of the gate array 15-19. In the CMOS version of the commercial unit, the 4.65 volt regulation circuit 16-6 can be switched to regulate at 2.5 volts by bringing the LOW PWR signal high, which turns on Q15 (shown at the center left of FIG. 16B) and thus shifts the reference voltage of the regulation circuit. The conductor LOW PWR (which produces the signal LOW PWR-A at Q15) is controlled through the gate array 15-19.

As explained with reference to FIG. 15, the commercial unit has incorporated a serial, differentially configured analog to digital converter and this converter is shown at 15-11 in the lower right corner of FIG. 16B. The parameters measured are main battery voltage, backup battery voltage, charger voltage, and main battery temperature. This information is used by software to control battery charge/discharge cycles and to alert the end user of low battery conditions.

As previously explained, one channel for each parameter is tied directly to the 2.5 volt voltage reference which is shown at Z6 at the lower right of FIG. 16B. With this setup, the voltage span on channels 0, 2, 4, and 6 of converter 15-11 is twice the voltage across Z6 or 5.00 volts, or else the supply voltage of the converter (at VCC), whichever is at a lower voltage. Since the supply to the converter 15-11 is regulated to 4.65 volts, this value becomes the upper limit for all channels.

Converter 15-11 is controlled from the PIA chip 15-14 as previously explained. The $\overline{CS}$ line connects with PB0 of the PIA, while A/D CLK connects to PB1 and DI/DO connects with PB2.

In order to read voltages greater than the regulated supply (VCC) of the converter 15-11, voltage dividers are used to scale down the battery channels and charge voltage channels.

As previously mentioned, the main battery 16-20 and temperature sensor 16-24 are not on the CPU board, certain of the six connector means being designated P3-1, P3-2 and P3-3, these connector means connecting with locations J7-1, J7-2 and J7-3 of the CPU board as indicated diagrammatically at J7 at the lower left of FIG. 16B. The backup battery 16-21 may be readily removable and replaceable from the CPU board in a conventional manner as indicated at JP-1 and JP-2 in FIG. 16B. The temperature sensor may be a LM335AZ and may have a suitable capacitance value connected thereacross as indicated at C1 to filter out noise.

General Discussion of the Embodiment of FIGS. 15, 16A and 16B

The present embodiment of FIGS. 15, 16A and 16B, departs from the initial embodiment of FIGS. 1 through 11 in that all of the circuitry is removed from internal to the battery pack with the exception of the temperature sensing element 16-24. This allows for a considerable decrease in cost of the expendable battery pack 16-23.

Furthermore, in comparison to the embodiment of FIGS. 1 through 11, the present embodiment replaces the several comparators and many precision costly components that were in the battery pack with the analog to digital converter 15-11 on the CPU board.

In the illustrated embodiment, complete isolation is provided of the main and backup batteries for reliable back-up run time and operational life.

A special lower power sensing technique is provided utilizing the operational amplifiers U7A and U7B, FIG. 16B.

The battery charging and power handling algorithms such as represented in FIG. 14 may be embodied in firmware to achieve optimum flexibility, operational run time and battery life. These algorithms have been explained in relation to FIGS. 12-14, and will be further explained in the following.

Unit operation is derived from any one or all three available power sources.

The all electronic isolation and power switching is accomplished through a very low power regulator circuit 16-6. Electronic isolation and switching control provides the unit with the features of reliable back battery run time, and precise charging and discharging control of the main and backup batteries. The same power control circuit is quite flexible and can be used with nickel cadmium, zinc-carbon, lead acid and alkaline batteries, or with capacitors as a power source. Batteries are controlled by their deselection through two bits on the PIA port. The change is essentially always selected.

The first power source is the main battery 16-20 consisting of four 1/2D 2.2 ampere hour rechargable nickel cadmium cells connected in series. This provides an operating voltage range of from 4.65 to 7.5 volts with five volts nominal.

The second power source is the backup battery 16-21 comprised of four ⅓ Af 0.225 ampere hour nickel cadmium cells connected in series. This second power source also has an operating voltage range of from 4.65 to 7.5 volts with five volts nominal.

Last, the charge input source will power the unit and recharge its batteries from a wide voltage range, for example, with a portable unit connected at times into a vehicle electrical system. The wide charge input range, and elimination of the need for large costly heat sinks is made possible by a small size, high efficiency DC/DC converter 16-1 incorporated into the portable unit. A range of 9 to 24 volts input is supported. The current is fifty milliamperes for the 24 volt input and is 650 milliamperes at a nine volt input value.

The heart of the regulator circuit 16-6 is a TLC27L2BC micropower dual operational amplifier (U7A, U7B, FIG. 16B). The regulator circuit itself consumes only thirty microamperes of current but can provide the system with 500 milliamperes of current from either battery or charge input (J6, FIG. 16A). The regulator circuit 16-6 can be operated from four to ten volts and is switchable not only from different supplies but also from a set point value of 4.65 volts to a low power mode set point of 2.5 volts. The regulator has a very low dropout voltage (even for high currents) of only fifty millivolts over the regulated output voltage range. This combined with the low 4.65 volt regulation voltage allows the most power possible to be efficiently removed from a set of four nickel cadmium batteries which have an end-of-discharge voltage of 4.7 volts for GE batteries at the terminal load levels.

There are two major regulation modes of system operation that can be selected under firmware control with several minor modes within them. Normal operation with dynamic RAM as shown at 15-22, FIG. 15, is with the system under power at 4.65 volts. The microprocessor clock is running at various speeds providing refresh to the memory array 15-22. The clock can also be stopped at the 4.65 volts type of regulation mode to use self refreshing dynamic RAM. The other mode of operation is the low power, power down mode which operates with a standby voltage of 2.5 volts. It is used only with CMOS static RAM, as represented by component 15-20, FIG. 15.

Low Power Detection

One of the most unique functions is the method in which low power is detected. The same circuit 16-6 detects low power from either battery power or for the case of power supplied by a charging source connected at J6, FIG. 16A. This lower power condition is sensed by measuring the regulator output voltage of the operational amplifier U7A which is common to all driver sources/switches of FIG. 16B. Under normal operation this voltage is between 0.3 volt and 0.8 volt where the field effect transistors Q16, Q17 and Q18 are implemented as type TNO106N3 N-channel MOS field effect transistors with low gate threshold voltage. When a low power condition is sensed by U7A, its output voltage will rise to a maximum value; for example when the power source that the unit has selected is removed or goes low such as occurs when the unit is taken off its charger, or a battery is going dead with its voltage dropping off. When the output of U7A rises to or above 2.7 volts, the circuit produces a low power logical output signal via U7B of low power detector 16-7. The 2.7 volts produced at the output of U7A is far outside the range of normal operation and provides a simple reliable solution for detecting low battery within the regulator circuit 16-6. This otherwise is a complex problem requiring a low battery voltage sensing circuit with many precision components to make the threshold for sensing the low voltage condition close to the regulation voltage, for optimum utilization of the battery. Such a circuit utilizing many precision components may be plagued by a susceptibility to circuit noise problems causing false triggering of the low voltage detection circuit.

Low Power Select

When operating in the 4.65 volt mode, if a low power condition is detected by regulating circuit 16-6, the output of the detection op-amp U7B will be low. This low signal on Q19 and Q20 will turn them off, in turn switching on both main and backup batteries. At this time all sources are hardware selected regardless of software selections at the PIA ports.

The low power signal is available to the main processor 15-25 through the gate array input port ECN3 which is connected to the signal line $\overline{LP}$ from the power control 15-10. The processor would then interrogate the power sources through A/D converter 15-11, determine what had occurred and make the new selection. In the low power mode, the operation is the same but the processor clock may be stopped. Because of this, the gate array 15-19 (in the particular embodiment illustrated) performs a wake up function started by the low power signal which appears at port $\overline{NMI}$ of the gate array.

Charge And Discharge Circuitry

The unit includes a set of constant current charge and discharge circuits for each battery to provide precise charging, capacity measurement, and battery conditioning functions.

The main battery charge circuit features a special very low dropout (0.5 volt) constant current regulator circuit 16-2 that derives its sensing feedback from the positive side of the main battery 16-20. This low dropout current regulator operating from the DC/DC seven volt REG input gives high efficiency charging, eliminating the need again for large heat sink means in a portable unit. Other low drop out constant current battery charging circuits put the sense resistor in the negative ground leg which floats th battery off ground by the IR voltage drop across the resistor. This voltage drop lowers the effective useful battery voltage. It can be made a small value but then would require precision components to sense the low voltage condition especially at low charging currents. For this reason this technique is prone to noise problems or low precision. The charge rate is software selectable between the C/8 and the C/100 rate.

Backup battery constant current charging is also software selectable between C/8 and C/100 rates. This charging circuit 16-3 senses the current in the positive lead of the backup battery 16-21 for feedback. This feature is accomplished with only six low-cost small-size components.

Both the main and backup batteries have connected to them the same design of constant current discharge circuitry. Each uses a simple three terminal regulator (i.e. regulators 16-4 and 16-5) for controlling the battery discharge cycle. This function is software selectable for doing timed discharges for measuring battery capacity and is also used for deep discharging for conditioning each of the batteries.

Analog To Digital Converter

The unit uses a nine bit resolution converter 15-11 as previously described, connected to the PIA component 15-14. As previously explained, four parameters can be read by the processor 15-25 and the information used to set the operating mode and battery handling algorithm. The precise temperature of the main battery can be measured. Its value is also used to determine the control of the backup battery and system run speed. Charging voltage is measured to detect when a reliable voltage range can be used by the unit for charging of the batteries. Main and backup battery voltage can be accurately measured to +/- twenty millivolts through the A/D converter 15-11. The measured voltages are used for the battery control algorithms to be explained further with reference to FIG. 17 of the drawings.

Operational Description Of The System Of FIGS. 15, 16A and 16B

To provide the user with the longest run time while maintaining functionality, the unit incorporates a sophisticated energy management system. A basic purpose is to reduce the operational power consumption of the unit without hindering the unit's normal intended operation. For the most part the energy mamagement operation is transparent to the user. The operational run time is quite dependent on actual implementation of this function. For DRAM units this is a factor of three, and for CMOS it could be as high as one thousand.

Power conservation in the unit is handled by operating it in the most power efficient manner to accomplish the task. For the most part, run speed is reduced, or functions are turned off when not in use. A special case of this is with the CMOS unit in the sleep mode where the clock is stopped.

For DRAM or CMOS units the object is to maximize the amount of run time at the slowest allowable standby speed which is reduced by a factor of 1/32 for DRAM and by a factor of 1/128 for CMOS. When a task is to be performed it should be done as quickly as possible at 1/1 speed, and the unit then returned to standby speed. If the task requires the unit to be operating at a faster than normal standby speed while waiting for an occurrence then this speed should be as slow as practical for the application.

A very important power conserving mode that is only used for CMOS versions is power down sleep mode. In this mode the CPU clock is stopped with data memory retained. The keyboard 15-16 is active as is the real time clock 15-17. To indicate that the unit is still turned on and in this mode, the shift annuciator of display 15-26 is left on. To wake up the system from this mode and restore normal operation, the user need only to press any key of keyboard 15-16.

The full speed and especially the waiting time from standby to power down must be as short as possible because it can so affect battery run time. This can make the difference between an operational time of the unit of a few hours, and an operational time of over a year. This waiting time requirement is both application and user dependent. A programmable waiting time with a default value of ⅓ of a minute can meet all application and system requirements. Through a shifted key function, the waiting time could be adjusted in seconds on a temporary twenty minute basis by the user; this being the manner in which the back light function is now handled. The default value should also be programmable according to the application.

Functions And Features

All functions and features are implemented from calculations based on five key measured or determined parameters which are as follows:

(1) System Configuration

Upon power up, the type of RAM and size are determined and saved for use with internal loading calculations. External devices which are operated from the unit's battery are accounted for on an as-used basis.

(2) Real Time Clock (15-17, FIG. 15)

The clock is used with internal loading, charging and capacity testing functions.

(3) Temperature Measurement

Main battery temperature is used to calculate charging rates and times, and also controls the setting for the minimum standby run speed for lowest power consumption.

(4) Charge Voltage

The charging voltage at input J6, FIG. 16A, is measured to detect the charging mode and to insure that the charging voltage is in a usable range for battery charging or unit operation.

(5) Battery Voltage

Both main and backup battery voltages are available for use in CPU calculations to determine system status and operation.

Fuel Gauge—As part of normal operation the unit keeps track of remaining capacity. This information can be made available to the user in the form of a run time fuel gauge display on module 15-26. This display is made available to the user through a shifted key function.

Run Time Remaining—This can be calculated from remaining capacity and battery voltage, providing remaining run time until low battery is expected. Ths could be handled as a shifted key function and run time displayed in hours and minutes.

Normal Recharge—A complete recharge is accomplished in eleven hours for the main and backup batteries at room temperature. The normal charge rate for both batteries is at the C/8 rate and is controlled by the CPU component 15-25.

Over-Charge Protection—This feature promotes longer battery life by preventing unnecessary over charge in route accounting where the unit is continually plugged in and out from a charger. Where the unit is removed from charge, it keeps track of the power removed from the battery that is selected. When returned to a charger, the CPU will calculate the power to be returned to the battery. It will then set the charge time based on the amount of charge removed and the recharging temperature.

Over-Under Temperature Protection—As a protection from permanent damage or degradation, the unit at high temperature (seventy degrees centigrade) will cut off charging, and will start to taper off the charge rate at low temperatures below ten degrees centigrade down to minus twenty degrees centigrade, at which temperature charging stops.

Variable Recharge Rate—The wide range of recharge rates is under CPU control for optimum charging under all operating conditions.

Standby Holding Charge—This feature keeps the batteries at full charge ready for use by charging them at C/100 rate controlled by the CPU component 15-25.

Charging Indicator—A positive indication that the unit is plugged into a charger and is charging may be provided as indicated at 15-15 in FIG. 15.

Capacity Test/Periodic Maintenance—The capacity of each battery can be measured to precisely indicate its condition so that the user can determine when batteries should be replaced. The required periodic use of this feature virtually eliminates the memory effects and voltage depression. This preventative maintenance does a complete test of both battery power systems to insure reliable operation and guaranteed run time without loss of RAM data. In addition, its use will extend normal battery service life to approximately one year. This is required every two months to guarantee battery life and run time. This is done by normal recharging being first completed, followed by a timed constant current deep discharge at a C/8 rate. With discharge time and rate known, the processor calculates the capacity. The capacity is displayed in minutes of a normal eight hour rated capacity. If this capacity is less than the entered or the default (eighty percent) of rated value, the unit will start a new capacity test and retry until the minimum value is reached, or until the test has been executed three times. The number of retries can be selected by the user, or can be programmed according to the application. Also, the test can be started by the user, or initiated by automatic programming according to the application.

Low Battery Indicator—When the unit is being charged, the low battery indicator signifies when the recharging process has been completed for both batteries. When the unit is off of charge, the low battery indicator advises the user when the batteries are low and need to be recharged to prevent loss of data. Once in low battery, the user is given ten percent of the backup battery capacity in slow speed operation, after which time the keyboard 15-16 is locked out. In low battery conditon, the unit will activate any internal or external loads to finish a limited transaction such as printing a ticket or doing a charge coupled device reading operation (e.g. by means of a bar code reader). The unit run time in low battery before and after lockout is dependent on system loading and usage. The time before lockout will be about ten minutes and low battery run time before memory loss will be about one hour with DRAM units. With a CMOS unit, the time periods could be ten times the values just given for DRAM units. If the backup battery is low, with the main battery charged, the system will give the user a system error code telling him not to remove the main battery pack, but to get the unit to a charger and download RAM data. The user can expect one hour of standby time after low battery is reached.

Deep Discharge Indicator—During a discharge cycle, the CPU measures the battery voltage and determines when the batteries have been completely discharged.

Overvoltage Indicator—This tells the CPU when the batteries are not accepting a charge; such condition being detected by the presence of a high charge voltage profile across the battery terminals.

Self Diagnostic Battery Testing—The power system testing is available in all units and can be used to identify defective units in manufacturing before delivery. Also battery condition can be easily checked by field service, and most importantly, by the customer.

Transparent conditioning deep discharge—If a battery has gone into low battery condition, the user can be prompted by means of display 15-26 when the unit is returned to charge if a conditioning deep discharge should be performed on that battery since at this time it will take little extra recharging time to effect such conditioning. The conditioning cycle comprises a deep discharge of the battery followed by a normal recharge thereof.

The following tables D, E1, E2 and E3 will summarize operations of the system during recharging and during portable operation with power from the charging source removed.

TABLE D

RECHARGING $$\text{RECHARGING TIME} = \frac{CC - RC}{CE * DC}$$

CC = FULL CHARGED CAPACITY AT TEMPERATURE
RC = REMAINING CAPACITY IN BATTERY
CE = CHARGE EFFICIENCY
DC = CHARGE DUTY CYCLE

RC MAIN = 2.2 AH - POWER REMOVED
BACK = .175 AH - POWER REMOVED

| CC = | 25 C OR LESS | GREATER THAN 25 C |
|---|---|---|
| MAIN | 2.2 AH | 2.2 AH - 1%/C FROM 25 C |
| BACK | .175 AH | .175 AH - 1%/C FROM 25 C |

| CE = | 10 C OR LESS | 10 C-25 C | 25 C-70 C | GREATER 70 C |
|---|---|---|---|---|
| MAIN | .198 AH - 1.94%/C FROM 10 C | .198 AH | .198 AH - 1.6%/C FROM 25 C | 0 |
| BACK | .01575 AH - 1.94%/C FROM 10 C | .01575 AH | .01575 AH - 1.6%/C FROM 25 C | 0 |

| DC = | 10 C OR LESS | 10 C-70 C | GREATER 70 C |
|---|---|---|---|
| MAIN | 3.3% REDUCTION/C FROM 10 C | 100% | 0% |
| BACK | 3.3% REDUCTION/C FROM 10 C | 100% | 0% |

TABLE E

POWER REMOVED

BASE INTERNAL LOADING

| CLOCK SPEED | CMOS *(1) | | | | DRAM *(1) | | | | OPERATIONAL MODE |
|---|---|---|---|---|---|---|---|---|---|
| | 32K | 64K | 128K | 256K | 64K | 128K | 256K | 512K | |
| 1/1 | 75 | 91 | 110 | 130 | 147 | 209 | 184 | 252 | DRAM OR CMOS RUN. |
| 1/2 | 65 | 80 | 95 | 114 | 121 | 167 | 134 | 188 | " |
| 1/4 | 59 | 75 | 87 | 107 | 106 | 142 | 113 | 153 | " |
| 1/8 | 56 | 72 | 82 | 103 | 98 | 130 | 102 | 135 | " |
| 1/16 | 56 | 71 | 82 | 102 | 94 | 124 | 96 | 126 | " |
| 1/32 | 55 | 70 | 81 | 100 | 92 | 120 | 94 | 121 | DRAM STAND BY *(2) |
| 1/64 | 55 | 70 | 81 | 100 | | | | | CMOS STAND BY |
| 1/128 | 54 | 69 | 79 | 99 | | | | | CMOS STAND BY |
| STOP 5V | 20 | 25 | 30 | 35 | | | | | CMOS POWER DOWN *(3) |
| STOP 2V | ½ | ½ | ½ | ½ | | | | | CMOS POWER DOWN *(4) |
| TEMPERATURE | | | | | | | | | |

*(1) ALL RATES IN MAH/HOUR
*(2) MINIMUM VALUE DEPENDENT ON TEMPERATURE SEE "STAND BY RUN SPEED REQUIREMENTS VS.
*(3) LCD DISPLAY IS ON
*(4) DISPLAY OFF BAR ANNUCIATOR IS ON

MINIMUM DRAM STAND BY CLOCK SPEED VS. TEMPERATURE

| TEMPERATURE | MINIMUM CLOCK SPEED | |
|---|---|---|
| 39 C OR LESS | ½ | MALFUNCTION |
| 40 C-45 C | 1/32 | |
| 46 C-55 C | 1/16 | |
| 56 C-65 C | ½ | |
| 66 C-99 C | ½ | |
| 100C OR GREATER | ½ | MALFUNCTION |

INTERNAL LOADING

INTERNAL PIA - THIS MUST BE ENABLED BY THE POWER CONTROL PORT EACH TIME A TRANSMISSION IS TO TAKE PLACE THROUGH THE TERMINALS 15 PIN EIA INTERFACE CONNECTOR. THE INSTALLATION OF THIS HARDWARE IS IDENTIFIED BY INPUT PORT ECN 1 CONNECTED TO LOW.

BACK LIGHT

| FUNCTION | LOADING PER EVENT (MAH) |
|---|---|
| (1) INTERNAL PIA | 18.0/HOUR |
| (2) BACK LIGHT | 25.0/HOUR |
| (3) BUZZER | 15.0/HOUR (100 MAH TIMES 15%) |
| (4) | ./ |

EXTERNAL LOADING

| DEVICE | LOADING PER EVENT (MAH) |
|---|---|
| (1) MARS PRINTER | 0.258/LINE |
| (2) 20/20 | 1.0/READ |
| (3) ACOUSTIC COUPLER | 60.0/HOUR |
| (4) CCD | .75/READ |
| (5) WAND | 100./HOUR |

TABLE E-continued

| POWER REMOVED | |
|---|---|
| (6) PIA | 18./HOUR |

Fuel Gauge—The value to be displayed is remaining capacity (RE) which is known at all times by the system and shown either in ampere-hours or in percent capacity.

Run Time Remaining—Implementation of this feature during portable operation is based on both calculated remaining capacity and the rate of decrease in battery voltage to determine expected run time. If the rate of decrease in battery voltage is declining, then calculated remaining capacity (RC) is used to determine expected run time. If the rate of decrease in voltage is increasing or constant, then the system uses the calculated (RC) value or the measured rate to estimate the time from present battery voltage down to 4.7 volts, whichever is less.

The following tables F1 and F2 summarize the procedure in calculating run time.

TABLE F1

CALCULATING RUN TIME
FROM REMAINING CAPACITY (RE)

REMAINING RUN TIME =

$$\frac{\text{REMAINING CAPACITY (RE)}}{\text{PRESENT AVERAGE LOADING RATE}}$$

(The estimated run time is calculated from remaining capacity and the loading rate. The loading rate is available but is constantly changing and must be averaged for this calculation. This averaging time period should be kept in the range from one to ten minutes.)

TABLE F2

CALCULATING RUN TIME
FROM RATE OF BATTERY VOLTAGE DECREASE

REMAINING RUN TIME =

$$\frac{\text{PRESENT VOLTAGE} - 4.7 \text{ VOLTS}}{\begin{array}{c}\text{PRESENT AVERAGE RATE}\\\text{OF VOLTAGE DECREASE}\end{array}}$$

(The run time is calculated from measured values of battery voltage and the rate of voltage decrease. The rate of decrease is constantly changing and must be averaged with a time period in the range from one to ten minutes.)

Figure 17:
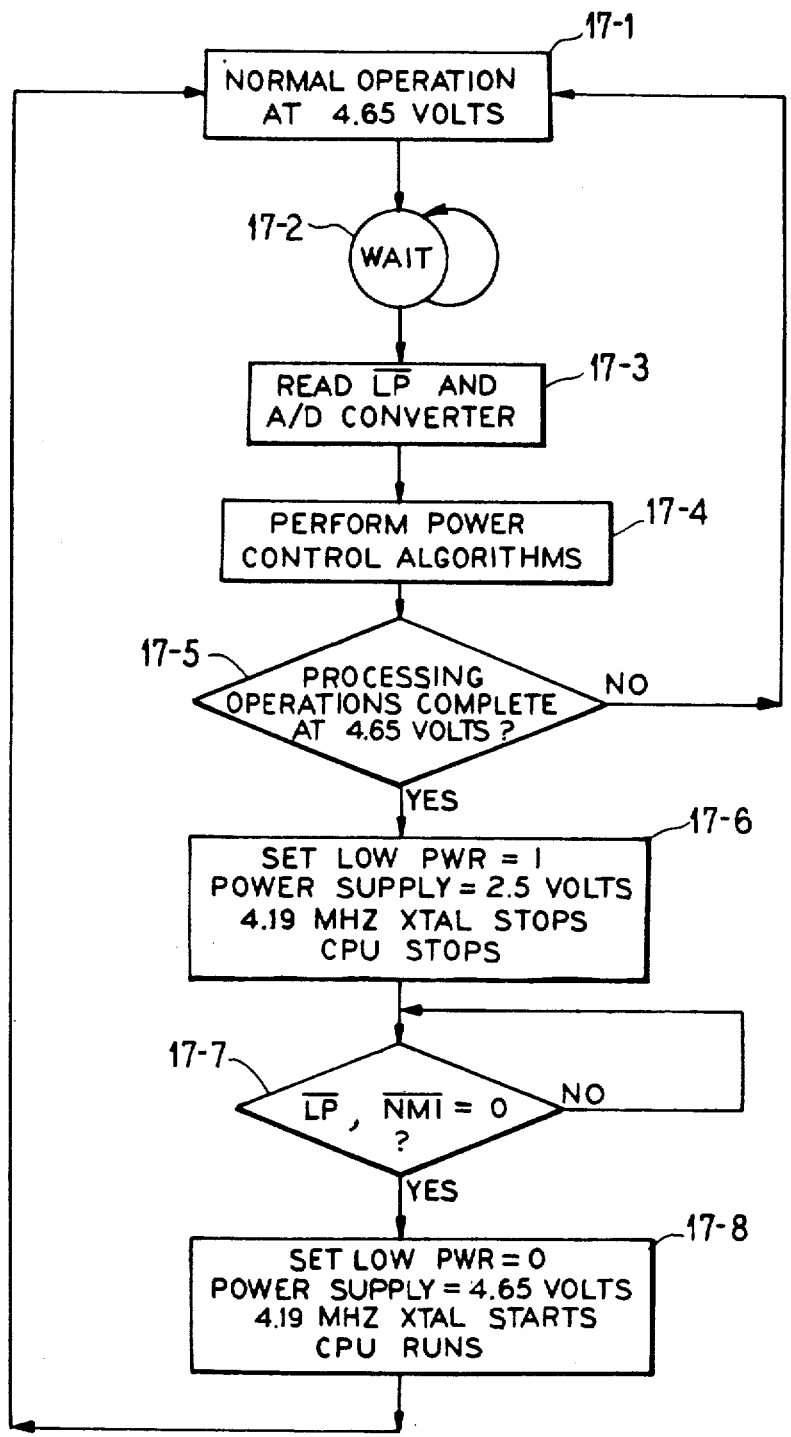
FIG. 17 is a flow diagram for illustrating the manner in which the power control circuitry of FIGS. 16A and 16B interacts with components 15–19 and 15–25 of FIG. 15 during operation of a preferred portable unit under battery power.

Description of FIG. 17

FIG. 17 illustrates the aspects of the overall system of a commercial implementation of FIG. 15 which pertains to the operation of the power control circuitry of FIGS. 16A and 16B.

Block 17-1 shows the commercial unit operating under battery power at the normal regulator output voltage (V+, FIG. 16B) of 4.65 volts.

Referring to processing operation 17-2, the CPU component 15-25 may be programmed to provide a waiting interval for example of one minute between successive executions of step 17-3.

Step 17-3 will be understood from the previous description of the signal line LP which is controlled by the output of operational amplifier U7B, FIG. 16B, of the power regulator circuit 16-6, and from the explanations concerning the analog to digital converter 15-11, FIGS. 15 and 16B. The status of signal LP depends on whether the regulator circuitry 16-6 is able to maintain a desired (setpoint) output voltage or whether this is not the case because of a low power condition of the input power source.

The processing sequence represented by step 17-4 is exemplified by the pseudo code listing found in Appendix A which follows this section.

According to decision block 17-5, the processing loops back to block 17-1 until processing operations requiring the CPU component 15-25 are complete. When the CPU is no longer required, control passes to step 17-6 to execute a "power down" operation.

In the "power down" procedure of step 17-6, the output LOW PWR from component 15-19 establishes operation of the power regulator circuit 16-6 with a setpoint voltage of 2.5 volts. A 4.19 megahertz crystal 15-31, FIG. 15, stops generating its signal, and the CPU component 15-25 also stops, to conserve battery power.

As represented by block 17-7 in FIG. 17, while the system is in power down mode, a check is made periodically to determine if any event occurs which requires CPU operation. So far as relevant to FIGS. 16A and 16B, step 17-7 involves monitoring the line $\overline{\text{LP}}$ from the low power detection circuit 16-7, FIG. 16B. If a low power battery condition develops (with respect to the supply voltage setpoint of 2.5 volts), this will be sensed by automatic regulator circuit 16-6 which in turn will cause switching of operational amplifier U7B to produce a low signal at line $\overline{\text{LP}}$. Referring to block 17-7, the presence of the low signal corresponds to the condition $\overline{\text{LP}}$ equals logical zero and $\overline{\text{NMI}}$ equals logical zero so that control passes to block 17-8.

In block 17-8, the LOW PWR line shown at the center left of FIG. 16A is switched, turning off Q15 and switching the power regular to supply the normal output voltage of 4.65 volts. Since the power regulator 16-6 at the normal setpoint will be expected to again produce the $\overline{\text{LP}}$ signal, the CPU component 15-25 will determine the presence of the condition in due course and alert the user as previously described.

Block 17-7 may also represent a response to other conditions such as user actuation of a key of the keyboard 15-16, but such procedures have not been detailed in FIG. 17 since they are not relevant to the signals supplied to and from the power control circuitry 15-10 (as will be understood from the overall system illustration shown in FIG. 15).

It will be apparent that the power down of CPU component 15-25 may be omitted, in which case the CPU may respond to its own clock and check the condition of line $\overline{\text{LP}}$ at suitable intervals during a low power mode that only affects other components. In this case the lines $\overline{\text{LP}}$ and LOW PWR would extend directly from power control 15-10 to suitable input and output ports of the CPU component 15-25, so that operation of the power control circuitry would be entirely independent of gate array 15-19.

APPENDIX A (Notes on Programming for FIGS. 15, 16A, 16B and 17)

The present section comprises an edited copy of notes on the system programming for the commercial unit of FIGS. 15, 16A, 16B and 17. In this section "121" refers to a model 121 commerical unit generally as shown in FIGS. 12, 13 and 14 herein, while "121XL/141" refers to models according to FIGS. 14, 16A, 16B and 17. The programming monitors for these latter models are designated IPMQNAZ and IMQNAP. (The programming monitor for the model 121 of FIGS. 12-14 is designated IPMONAP.)

APPENDIX A degree centigrade below 10 C., and reduced to 0% when the battery temperature $>70°$ C.

Lock up timer:
  Counts down once every minute until zero is reached.

Main battery timer:
  Counts down for the number of seconds on charge until zero is reached.
  Counts up for every second of battery drain until eleven hours is reached.

Backup battery timer:
  Counts down for the number of seconds on charge until zero is reached.
  Counts up for every second of battery drain until eleven hours is reached.

```
BEGIN PSUEDO CODE FOR BATTERY MAINTENANCE
REPEAT
   LOW BATT FLAG (IN DISPLAY) = OFF
   DESELECT BOTH BATTERIES
   IF NEITHER SELECTED CAUSES LOW POWER INTERRUPT THEN (NO CHARGER)
      RECHARGING FLAG = OFF
      SELECT MAIN BATTERY
      DISCHARGE BOTH BATTERIES = OFF
   ELSEIF CHARGER <20V THEN (GOOD CHARGER)
      RECHARGING FLAG = ON
      FOR EACH BATTERY DO
         IF BATTERY TIME <> 0 THEN (NOT FULLY CHARGED)
            LOW BATT FLAG = ON
            IF TEMPERATURE BASED DUTY CYCLE ALLOWS CHARGER TO BE ON AND
               NOT BATTERY DISCHARGE AND
               BATTERY < 6.2 VOLTS THEN
               BATTERY CHARGE = ON
            ENDIF
         ENDIF
      ENDFOR
   ENDIF
   FOR EACH BATTERY DO
      IF TEMP <-20 DEG C OR
         TEMP >70 DEG C OR
         (BATTERY <3.7 VOLTS AND BATTERY DISCHARGE) OR
         (BATTERY <4.7 VOLTS AND BATTERY CHARGE) OR
         (BATTERY >7.0 VOLTS) OR
         CAN'T PREVENT LOW BATTERY INTERRUPT WHILE BATTERY SELECTED THEN
         BATTERY DISCHARGE = OFF
         BACKLIGHT = OFF
         LOW BATT FLAG = ON
         BEEP
         RESET BATTERY TIMER TO 11 HOURS
         IF OFF CHARGE THEN SELECT OTHER BATTERY
      ENDIF
   ENDFOR
   IF BOTH BATTERIES ARE GOOD OR ON A CHARGER THEN
      LOCKUP TIMER = 10 MINUTES
   ENDIF
   IF LOCKUP TIMER = 0 OR BOTH BATTERIES ARE BAD THEN DELAY 5 SECONDS
UNTIL LOCK UP TIMER <> 0 OR ONE BATTERY IS GOOD
```

NOTES FOR VERSION 1.1 OF IPMQNAZ AND IPMQNAP

BATTERY MAINTENANCE

The PSUEDO code below is representative of the system capsule code executed every five seconds during idle periods. This code determines the condition of the batteries and charger. It reports the condition with the beeper, LCD low batt and recharging 'flags'.

There are three timers being incremented or decremented by a clock interrupt routine to support this routine. The interrupt routine is also responsible for determining the charger duty cycle. (Note: the clock interrupt routine calls the routine described here to update the battery status no less than once a minute.) The charger duty cycle is reduced by 3.3% for every

ADDITIONS TO IPMQNAP PROMPT SEQUENCE

After the version number display, IPMQNAP will attempt to auto-chain to an application (as does the 121 version IPMONAP).

If the chain fails, the 'SET TIME?' sequence will begin followed by the 'RUN PROGRAM?' sequence.

The ability to download programs and/or data files has been added at the end of the loop that inquires which program the user wishes to run.

Following the Telecom function, the updated battery subroutine will be executed. It causes the batteries to be discharged and recharged which will extend their life and run-time.

121XL/141 SYSTEM STATUS SUBROUTINE

The purpose of this subroutine is to provide the user with information regarding system operation. The function will be entered optionally from any prompt where the standard input routine (IPMQGIP, ALIAS "INPUT") is used. The SRCH/FIND key has been selected as the key to cause input to call this routine. If the SRCH/FIND key is allowed by the application, it will perform normally. If it is not allowed by the application, it will initiate the system status function. The subroutine takes no parameters, and may be called from within any application.

All prompts within the subroutine will accept either an enter key to continue, or a skip key to return to the application.

Language customization may be achieved by making a copy of the standard module, changing the prompts, and linking the new module directly to the application with a private copy of input. (However, the English language version will continue to execute at power up and when the monitor 'IPMQNAP' is in control.)

DATE AND TIME DISPLAY

Since a user will be likely to use this function to display the date and time, these have been placed first. They will not be continuously updated as this prevents the unit from powering down to save power. The prompt also will not allow updating of these fields as this may lead to cheating on time stamping during application execution. The month will be displayed as an abbreviation to avoid problems with numeric presentation formats (YY/MM/DD, MM/DD/YY, DD/MM/YY, ...).

<DATA JAN 10, 1985>
<TIME 09:00:00 AM>

Specific information about the batteries is displayed on the next two screens. The current voltage and state are displayed on the first line. The amount of charge time required for a full charge is on the second line.

SCREEN 1
<MAIN 5.2 V STATUS>
<10:32 TO MAX CHG>
Where status is based upon

| BATTERIES SELECTED | DISCHARGE | TIMER =0 | VOLTS >6.2 | VOLTS <4.7 | STATUS | MEANING |
|---|---|---|---|---|---|---|
| BACKUP | ? | ? | ? | ? | LOW | TOO LOW TO USE, NO CHARGER |
| MAIN ONLY | ? | ? | ? | ? | ON | IN USE |
| NEITHER | YES | ? | ? | ? | DISCHG | CYCLING BATTERIES |
| NEITHER | NO | YES | ? | ? | READY | NOT IN USE, FULL CHARGE |
| NEITHER | NO | NO | YES | ? | HIGH | USABLE, TOO HIGH TO CHARGE |
| NEITHER | NO | NO | NO | YES | LOWCHG | TOO LOW TO USE, CHARGING |
| NEITHER | NO | NO | NO | NO | CHARGE | USABLE, CHARGING |

SCREEN 2
<BACK 5.2 V STATUS>
<10:32 TO MAX CHG>
Where status is based upon

| BATTERIES SELECTED | DISCHARGE | TIMER =0 | VOLTS >6.2 | VOLTS <4.7 | STATUS | MEANING |
|---|---|---|---|---|---|---|
| BOTH | ? | ? | ? | ? | LOW | TOO LOW TO USE, NO CHARGER |
| BACK ONLY | ? | ? | ? | ? | ON | IN USE |
| MAIN ONLY | ? | ? | ? | ? | READY | NOT IN USE, NO CHARGER |
| NEITHER | YES | ? | ? | ? | DISCHG | CYCLING BATTERIES |
| NEITHER | NO | YES | ? | ? | READY | NOT IN USE, FULL CHARGE |
| NEITHER | NO | NO | YES | ? | HIGH | USABLE, TOO HIGH TO CHARGE |
| NEITHER | NO | NO | NO | YES | LOWCHG | TOO LOW TO USE, CHARGING |
| NEITHER | NO | NO | NO | NO | CHARGE | USABLE, CHARGING |

The status of the charger is given in the next screen. The status and voltage of the charger are displayed on the first line. The temperature and charge duty cycle is on the second line. The duty cycle is governed by the temperature. When it gets too hot or cold, the duty cycle will drop from 100%. If a duty cycle of 0% is indicated, no charging of the batteries will take place.

<STA CHARGER 15 V>
<20C IS DTY% OK>
Where sta is defined as:
OFF IF VOLTAGE<10
BAD IF VOLTAGE>20
ON OTHERWISE Where DTY% is the allowable charger duty cycle and is a function of the temperature. The function is supplied by electrical engineering and implemented in the system capsule.

The final screens display the status of the memory error correction circuitry. There are three possibilities with this circuitry.

| | |
|---|---|
| (1) NO ERRORS DETECTED. | <NO MEMORY ERRORS> |
| (2) CORRECTABLE MEMORY ERRORS. MAXIMUM COUNT DISPLAYED IF 255 CORRECTABLE ERRORS DETECTED. (TWO SCREENS) | <123 MEMORY ERRS> <(MAXIMUM COUNT)> <LAST ADDR:102343> <CORRECTED> |
| (3) UNCORRECTABLE MEMORY ERRORS. (TWO SCREENS) | <123 MEMORY ERRS> <REPAIR THIS UNIT> <LAST ADDR:102343> <UNCORRECTABLE> |

BATTERY CONDITIONING SUBROUTINE

This subroutine has been based upon PSBAT1P written for the 121. It must however condition the two batteries separately. This causes the information presented on the screen to be in a different format. The subroutine is called by IPMQNAP upon powerup and may be called by an application (no parameters).

The first prompt asks user if he wishes to perform the battery routines.

<BATTERY TEST?>

The skip key will cause the subroutine to return without taking any further action. The enter key will bring the user to the next prompt to ask if capacity is to be measured.

<CAPACITY TEST?>

A skip at this prompt will cause the subroutine to begin with the battery discharge phase for both batteries. If enter is pressed instead, the subroutine will begin with a precharge phase so that the capacity of the completely charged batteries is measured.

Information about both batteries will be placed upon the screen during this phase. The keyboard is disabled at this point to prevent interruption of this critical section of code.

<MN STA 5.2 V TIM> MAIN BATTERY STATUS
<BK STA 5.2 V TIM> BACKUP BATTERY STATUS

Where STA is updated separately for each battery and represents

PRE=precharging battery before the discharge phase
DIS=discharging the battery
RCH=Recharging the battery after the discharge phase Where TIM represents the battery capacity timer kept in minutes by the system capsule. It will count down as the battery obtains capacity, and count up as the battery is being drained. If the unit is removed from the charger during this phase, it will complain for approximately 30 seconds, then abort the test.

<CHARGER> Accompanied by periodic beeping until charger or 30 seconds.
<FUNCTION ABORTED> If no charger after 30 seconds
<NO CHARGER> Enter key here will exit subroutine As each battery completes its discharge, the status line for it will be replaced with a final message. If a capacity test was being performed, the battery capacity timer will be displayed. Otherwise, a message indicating completion will appear. When a final message appears for both batteries, an enter key will return the user to the battery test prompt. (Note: Complete recharging of the batteries has not taken place. Only enough charge to bring the batteries above 4.7 volts has occured. The user should not remove the charger until the low batt flag on the display has been extinguished.)

<MN CAPACITY 621> If capacity test performed
<BK CAPACITY 621>
<MN COMPLETE> If capacity test not performed
<BK COMPLETE>

While several preferred embodiments have been illustrated and described in detail, it will be apparent to those skilled in the art that many changes and modifications may be made without departing from the disclosed invention in its broader aspects; and it is intended that the appended claims cover all such changes and modifications as fall within the true spirit and scope of the contributions to the art made hereby.

What is claimed is:

1. In a system including rechargeable battery means, temperature sensing means for sensing temperature,
battery conditioning means for controlling supply of charging current to the battery means and operable for selectively supplying a relatively high charge rate and a relatively low charge rate,
processing means coupled with said battery conditioning means and controlling said battery conditioning means to selectively supply said relatively high charge rate and said relatively low charge rate at least partially in dependence upon relatively high and relatively low ambient temperature respectively,
charge input means for coupling with the rechargeable battery means for supplying charging current thereto, and
analog to digital converter means coupled with said temperature sensing means and with said charge input means, and coupled with said processing means for supplying measures of ambient temperature and charge input voltage to said processing means.

2. In a battery conditioning system,
rechargeable battery receiving means having rechargeable battery means therein,
control means for coupling with said rechargeable battery means for controlling recharging cycles of said rechargeable battery means,
said control means comprising temperature sensing means for sensing a temperature condition,
further sensing means operatively coupled with said rechargeable battery means for providing a measure of the charge condition of the rechargeable battery means, and
said receiving means comprising a portable battery-operated computer means for containing said rechargeable battery means during a recharging cycle with respect thereto.

3. A battery conditioning system according to claim 2, with said further sensing means comprising battery voltage sensing means operatively coupled with said battery means and operative to sense the output voltage of said battery means in said portable battery-operated computer means.

4. A battery conditioning system according to claim 3 with means operatively coupled with said battery voltage sensing means and operable for signalling a low battery condition based on the voltage of said rechargeable battery means.

5. In a battery conditioning system,
a hand-held battery powered utilization device for operating from battery power during portable operation thereof,
battery means operatively coupled with said utilization device for supplying operating power thereto during portable operation, and
battery conditioning system means operatively coupled with said battery means while said battery means is operatively coupled with said utilization device for controlling recharging cycles of said battery means,
said battery conditioning system means comprising temperature sensing means, and means controlling the rate of charging of said battery means according to the temperature sensed by said temperature sensing means.

6. In a system including a hand held data processing means with rechargeable battery means,
   temperature sensing means for sensing temperature,
   battery conditioning means for controlling supply of charging current to the battery means and operable for selectively supplying a relatively high charge rate and a relatively low charge rate, and
   control means coupled with said battery conditioning means and controlling said battery conditioning means to selectively supply said relatively high charge rate and said relatively low charge rate at least partially in dependence upon the sensed temperature.

7. A battery system comprising
   battery means for supplying operating power to a utilization device, and
   a control circuit carried as a unit with the battery means for assembly with a utilization device and electrical connection therewith to exercise a control function.

8. In a system for association with a battery power receiving device,
   battery means for supplying operating power during battery operation of a battery power receiving device,
   battery system means carried with said battery means and receiving power therefrom during battery operation, and including battery parameter sensing means for sensing a battery parameter,
   said battery system means including operating means comprised of programmed processing means operatively coupled with said battery parameter sensing means and automatically effecting monitoring of said battery means in conjunction with said battery parameter sensing means.

9. In a system according to claim 8, said battery system means having charging voltage supply means for supplying a charging voltage to said battery means under the control of said battery parameter sensing means.

10. In a system according to claim 8, packaging means containing said battery means and said battery system means and being capable of insertion as a unit into a battery power receiving device.

11. In a system in accordance with claim 8, said operating means comprising programmed processing means having a low power "sleep mode" and being connectable with said battery means for energization thereby.

12. In a system in accordance with claim 8, said operating means providing for communication with a battery power receiving device.

13. In a system according to claim 8, said operating means comprising programmed data processing means operatively coupled with said battery means for operation from battery power.

14. In a system according to claim 8, said operating means including memory means electrically powered by said battery means, and said memory means being operable for storing data relating to said battery means under the control of said operating means.

15. In a system according to claim 8, said battery system means comprising battery charge flow control means operatively coupled with said battery means for controlling charge flow from the battery means during a conditioning operation.

16. In a system according to claim 8, said battery system means further comprising control means operatively coupled with said battery means for controlling the charging of said battery means.

17. In a system according to claim 16, said control means being controllable by said operating means to effect selective charging and discharging of said battery means.

18. In a system according to claim 8,
   said battery system means having a battery charging voltage input forming part of a battery charging current path means for said battery means,
   charging current control means operatively coupled with said battery charging voltage input and operative to control the magnitude of the charging current supplied to said battery means via said battery charging current path means, and
   said charging current control means having a control input for receiving a charging level control signal and being operative to control the charging current supplied to said battery means in accordance with said charging level control signal.

19. In a system according to claim 8, said battery parameter sensing means comprising battery voltage sensing means operatively coupled with said battery means for sensing battery voltage of said battery means.

20. In a system according to claim 8, said battery parameter sensing means comprising battery temperature sensing means operatively coupled with said battery means for sensing a temperature in the vicinity of the battery means.

21. In a system according to claim 8, said battery system means comprising battery discharge mode control means capable of being selectively operatively coupled with said battery means for controlling discharge of the battery means prior to recharge thereof.

22. In a system according to claim 21, said battery discharge mode control means comprising discharge current control means operatively coupled with said battery means and providing a battery current discharge path capable of discharging the battery means down to a deep discharge level during a deep discharge cycle.

23. In a system including
   rechargeable battery terminal means for coupling with rechargeable battery means,
   battery conditioning system means coupled with said battery terminal means for effecting discharge and recharging cycles of rechargeable battery means coupled therewith,
   said battery conditioning system means comprising battery discharge means for effecting a discharge cycle of a rechargeable battery means coupled with the terminal means and including battery condition sensing means for sensing a battery discharge condition.

24. In a system according to claim 23, said battery condition sensing means comprising battery voltage sensing means operatively coupled with said battery terminal means and operative to sense the output voltage of rechargeable battery means coupled with said terminal means during discharge cycles thereof.

25. In a system according to claim 23, said battery conditioning system means comprising a microprocessor with memory means operatively coupled with said battery condition sensing means and being operable for controlling said memory means to effect the storage therein of said data based on a discharge cycle of rechargeable battery means coupled with said terminal means.

26. In a system comprising receiving means for operative coupling with battery means,
   battery conditioning system means operatively coupled with said receiving means and operative for automatically effecting a discharge and a recharging of battery means coupled with said receiving means,
   said battery conditioning system means having battery discharge circuit means for selective activation such that battery means coupled with the receiving means may be selectively conditioned by a discharge thereof prior to a recharging operation.

27. In a system in accordance with claim 24, said battery conditioning system means comprising programmed processor means for effecting a discharge cycle of said battery means as a measure of battery capacity.

28. In a system in accordance with claim 24, said battery conditioning system means being operative to sense a battery parameter of battery means coupled with said receiving means.

29. In a system in accordance with claim 24, said battery conditioning system means comprising digital processor means and memory means controlled by said processor means for obtaining a measure of battery capacity of battery means during a discharge cycle of such battery means.

30. In a system for conditioning a battery,
   receiving means for operative coupling with battery means comprising a rechargeable electrochemical energy storage medium, and
   battery conditioning system means operatively coupled with said receiving means and automatically operable for effecting a discharge cycle wherein the battery output voltage of battery means coupled with the receiving means is reduced below a selected voltage value.

31. In a system in accordance with claim 30, said battery conditioning system means comprising digital processor means operatively coupled with said receiving means for sensing when the battery output voltage of battery means coupled with the receiving means is reduced below said selected voltage value so as to terminate the discharge cycle.

32. In a system in accordance with claim 31, display means coupled with said battery conditioning system means for displaying a measure of battery capacity based on a discharge cycle of battery means coupled with said receiving means.

33. In a system according to claim 30, said battery conditioning system means comprising battery circuit means operatively coupled with said receiving means and automatically operable to effect a charging cycle and then a discharge cycle of battery means coupled with said receiving means.

34. In a system according to claim 33, said battery conditioning system means comprising automatic discharge energy determining means operatively coupled with said receiving means for determining a measure of the amount of energy supplied by battery means during a discharge cycle as a measure of the condition of the battery means.

35. In a system in accordance with claim 34, said battery conditioning system means further comprising memory means operatively coupled with said discharge energy determining means to store a battery capacity indication based on the amount of energy supplied by battery means during a discharge cycle thereof.

36. In a system including
   battery means for supplying operating power during portable operation,
   battery conditioning system means operatively coupled with said battery means and automatically operable for effecting charging, discharge and recharging cycles thereof,
   said battery conditioning system means comprising battery condition sensing means for sensing a battery discharge condition of said battery means and comprising memory means operatively coupled with said battery condition sensing means and operative for storing data based on a discharge cycle so as to provide a measure of battery capacity of the battery means.

37. In a system according to claim 36, said battery condition sensing means comprising battery voltage sensing means coupled with said battery means, and said battery conditioning system means being coupled with said battery voltage sensing means for automatically terminating a discharge cycle when the battery voltage of the battery means is reduced to a predetermined value.

38. In a system including rechargeable battery means,
   (a) battery conditioning system means sensing temperature and controlling supply of charge to the rechargeable battery means and operable for selectively supplying a relatively low charge rate and a relatively high charge rate as a function of temperature,
   (b) said rechargeable battery means comprising a nickel-cadmium battery pack of size and weight to be held in one hand along with an associated portable device which is to be operated by the other hand, and having a battery capacity such as to sustain portable operation of an associated portable device for a number of hours and being thereafter rechargeable during a recharging operation while an associated portable device is otherwise supplied with power,
   (c) said battery conditioning system means being automatically operable to effect recharging of the nickel-cadmium battery means after extended periods of active portable operation and automatically supplying a relatively high charge rate where the temperature is in a relatively high temperature range comprising temperatures in the neighborhood of room temperature, and temperatures in a substantial range above room temperature, and automatically supplying a relatively low charge rate substantially less than said relatively high charge rate where the temperature is in a relatively low temperature range extending over a substantial range of temperatures below room temperature.

39. In a system according to claim 38, said battery conditioning system means supplying a relatively high charge rate for temperatures up to about fifty-five degrees centigrade.

40. In a system according to claim 38, said battery conditioning system means supplying a relatively high charge rate for temperatures in the range between ten degrees centigrade and about fifty-five degrees centigrade.

41. In a system according to claim 38, said battery conditioning system means supplying a relatively high charge rate for temperatures extending over a substantial range above ten degrees centigrade.

42. In a system according to claim 38, said battery conditioning system means supplying a relatively high charge rate for a relatively high temperature range comprising temperatures in the neighborhood of room temperature and temperatures extending up to forty-five degrees centigrade.

43. In a system according to claim 38, said battery conditioning system means supplying a relatively high charge rate for temperatures in a range between ten degrees centigrade and forty-five degrees centigrade.

44. In a system according to claim 38, said battery conditioning system means supplying a relatively high charge rate of the order of said battery capacity divided by about eight in a substantial temperature range above room temperature.

45. In a system according to claim 38, said battery conditioning system means automatically discontinuing the relatively high charge rate after the nickel-cadmium rechargeable battery means has been recharged.

46. In a system according to claim 38, said battery conditioning system means automatically monitoring battery terminal voltage and automatically terminating the relatively high charge rate when the battery terminal voltage reaches a preselected value.

47. In a system according to claim 38, said battery conditioning system means automatically monitoring battery terminal voltage and automatically terminating the relatively high charge rate when the battery terminal voltage reaches a preselected value of about six volts.

48. In a battery conditioning system,
(a) a portable battery powered utilization device for operating from battery power during portable operation thereof,
(b) battery means operatively coupled with said utilization device for supplying operating power thereto during portable operation,
(c) said utilization device together with said battery means having a size and weight to be carried by an individual person, and
(d) battery conditioning system means coupled with said battery means during a battery conditioning operation for controlling conditioning of the battery means, and being operable for coupling with a power source for supplying a charging voltage,
(e) said battery means comprising nickel-cadmium rechargeable battery means which is contained within said portable battery powered utilization device during battery conditioning operations, said battery conditioning system means receiving charging voltage during a battery recharging operation and automatically controlling the supply of charge to said nickel-cadmium rechargeable battery means to effect recharging thereof after a period of portable operation of the portable battery powered utilization device, and
(f) said battery conditioning system means automatically sensing a plurality of parameters comprising a temperature which is generally a function of battery temperature and a voltage which is generally a function of the battery terminal voltage of said nickel-cadmium rechargeable battery means, and automatically controlling battery recharging operations according to the sensed parameters so as to automatically avoid detrimental battery conditions.

49. In a battery conditioning system according to claim 48, said battery conditioning system means automatically monitoring temperature during battery charging operations, and effecting a rapid recharging of the nickel-cadmium rechargeable battery means for a substantial range of temperatures above room temperature.

50. In a battery conditioning system according to claim 49, said battery conditioning system means automatically terminating a rapid recharging of the nickel-cadmium rechargeable battery means when a nickel-cadmium rechargeable battery means has been recharged.

51. In a battery conditioning system according to claim 49, said battery conditioning system means supplying a relatively high charge rate for temperatures up to about fifty-five degrees centigrade.

52. In a battery conditioning system according to claim 49, said battery conditioning system means supplying a relatively high charge rate for temperatures in the range between ten degrees centigrade and about fifty-five degrees centigrade.

53. In a battery conditioning system according to claim 49, said battery conditioning system means supplying a relatively high charge rate for temperatures extending over a substantial range above ten degrees centigrade.

54. In a battery conditioning system according to claim 49, said battery conditioning system means supplying a relatively high charge rate for a relatively high temperature range comprising temperatures in the neighborhood of room temperature and temperatures extending up to forty-five degrees centigrade.

55. In a battery conditioning system according to claim 49, said battery conditioning system means supplying a relatively high charge rate for temperatures in a range between ten degrees centigrade and forty-five degrees centigrade.

56. In a battery conditioning system according to claim 49, said battery conditioning system means supplying a relatively high charge rate of the order of said battery capacity divided by about eight in a substantial temperature range above room temperature.

57. In a battery conditioning system,
(a) a portable battery utilization device for operating from battery power during portable operation thereof,
(b) battery means operatively coupled with said utilization device for supplying operating power thereto during portable operation,
(c) said utilization device together with said battery means having size and weight to be carried by an individual person, and to be held in one hand during operation of the utilization device with the other hand,
(d) battery conditioning system means coupled with said battery means during a battery conditioning operation for controlling conditioning of the battery means, and being operable for coupling with a power source for supplying power during a battery recharging operation,
(e) said battery means comprising nickel-cadmium rechargeable battery means, and said portable battery powered utilization device containing said nickel-cadmium rechargeable battery means and receiving power from a power source while said nickel-cadmium rechargeable battery means is receiving charge from the power source during a battery recharging operation under the control of said battery conditioning system means, and (f) said battery conditioning system means when the temperature is relatively low automatically selecting a relatively low battery charge rate and when the temperature is higher automatically selecting a higher battery charge rate from a power source to which it is coupled, and monitoring temperature during respective battery recharging operations and automatically adjusting battery charge rate according to temperature for the sake of rapid recharging without substantial detriment to the useful life span of the nickel-cadmium rechargeable battery means.

58. In a battery conditioning system according to claim 57, said battery conditioning system means supplying a relatively high charge rate for temperature up to about fifty-five degrees centigrade.

59. In a battery conditioning system according to claim 57, said battery conditioning system means supplying a relatively high charge rate for temperature in the range between ten degrees centigrade and about fifty-five degrees centigrade.

60. In a battery conditioning system according to claim 57, said battery conditioning system means supplying a relatively high charge rate for temperatures extending over a substantial range above ten degrees centigrade.

61. In a battery conditioning system according to claim 57, said battery conditioning system means supplying a relatively high charge rate for a relatively high temperature range comprising temperatures in the neighborhood of room temperature and extending up to forty-five degrees centigrade.

62. In a battery conditioning system according to claim 57, said battery conditioning means supplying a relatively high charge rate for temperatures in a range between ten degrees centigrade and forty-five degrees centigrade.

63. In a battery conditioning system according to claim 57, said battery conditioning means supplying a relatively high charge rate of the order of said battery capacity divided by about eight in a substantial temperature range above room temperature.

64. In a system comprising
(a) a hand held portable data storage terminal means having a rechargeable battery compartment,
(b) rechargeable battery means removably received in said rechargeable battery compartment and having a battery capacity for supplying battery power to said data storage terminal means during portable operation over an extended period of many hours,
(c) battery conditioning system means sensing temperature and controlling supply of charge to the rechargeable battery means and operable for selectively supplying a relatively low charge rate and a relatively high charge rate as a function of temperature,
(d) said battery conditioning system means being automatically operable to effect recharging of said rechargeable battery means after extended periods of active portable operation and automatically supplying a relatively high charge rate where the temperature is in a relatively high temperature range and automatically supplying a relatively low charge rate substantially less than said relatively high charge rate where the temperature is in a relatively low temperature range.

65. In a system according to claim 64, said battery conditioning system means supplying a relatively high charge rate for relatively high temperatures up to about fifty-five degrees centigrade.

66. In a system according to claim 64, said battery conditioning system means supplying a relatively high charge rate for temperatures in the range between ten degrees centigrade and about fifty-five degrees centigrade.

67. In a system according to claim 64, said battery conditioning system means supplying a relatively high charge rate for temperatures extending over a substantial range above ten degrees centigrade.

68. In a system according to claim 64, said battery conditioning system means supplying a relatively high charge rate for a relatively high temperature range comprising temperatures in the neighborhood of room temperature and temperatures extending up to forty-five degrees centigrade.

69. In a system according to claim 64, said battery conditioning system means supplying a relatively high charge rate for temperatures in a range between ten degrees centigrade and forty-five degrees centigrade.

70. In a system according to claim 64, said battery conditioning system means supplying a relatively high charge rate of the order of said battery capacity of said rechargeable battery means divided by about eight in a substantial temperature range above room temperature.

71. In a system according to claim 64, said battery conditioning system means automatically discontinuing the relatively high charge rate after the rechargeable battery means has been recharged.

72. In a system comprising
(a) a rechargeable battery pack of size and weight to be held in one hand along with an associated portable device which is to be operated by the other hand, and having a battery capacity such as to sustain portable operation of an associated portable device for a number of hours and being thereafter rechargeable during a recharging operation, and
(b) battery conditioning system means coupled with said battery pack during a battery conditioning operation for controlling conditioning of the battery means, and being operable for coupling with a power source for supplying a charging voltage,
(c) said battery conditioning system means receiving charging voltage during a battery recharging operation and automatically controlling the supply of charge to said rechargeable battery pack to effect recharging thereof after a period of portable operation of the rechargeable battery pack and its associated portable device, and said battery conditioning system means automatically sensing a plurality of parameters comprising a temperature which is generally a function of battery temperature and a voltage which is generally a function of the battery terminal voltage of said rechargeable battery means, and automatically controlling battery recharging operations according to the sensed parameters so as to automatically avoid detrimental operating conditions.

73. In a battery conditioning system according to claim 72, said battery conditioning system means automatically monitoring temperature during battery charging operations, and effecting a rapid recharging of the rechargeable battery pack for a substantial range of temperatures above room temperature.

74. In a battery conditioning system according to claim 73, said battery conditioning system means automatically terminating a rapid recharging of the rechargeable battery means when the rechargeable battery means has been recharged.

75. In a battery conditioning system according to claim 73, said battery conditioning system means effecting said rapid recharging for temperatures above room temperature and up to about fifty-five degrees centigrade.

76. In a battery conditioning system according to claim 73, said battery conditioning system means effecting said rapid recharging for temperatures in the range between ten degrees centigrade and about fifty-five degrees centigrade.

77. In a battery conditioning system according to claim 73, said battery conditioning system means effecting said rapid recharging for temperatures extending over a substantial range above ten degrees centigrade.

78. In a battery conditioning system according to claim 73, said battery conditioning system means effecting said rapid recharging for a relatively high temperature range comprising temperatures in the neighborhood of room temperature and temperatures extending up to forty-five degrees centigrade.

79. In a battery conditioning system according to claim 73, said battery conditioning system means effecting said rapid recharging for temperatures in a range between ten degrees centigrade and forty-five degrees centigrade.

80. In a battery conditioning system according to claim 72, said battery conditioning system means supplying a relatively high charge rate of the order of said battery capacity divided by about eight in a substantial temperature range above room temperature.

* * * * *

(12) EX PARTE REEXAMINATION CERTIFICATE (6573rd)
United States Patent
Koenck et al.

(10) Number: US 4,709,202 C1
(45) Certificate Issued: Dec. 23, 2008

(54) BATTERY POWERED SYSTEM

(75) Inventors: Steven E. Koenck, Cedar Rapids, IA (US); David C. Hacker, Cedar Rapids, IA (US)

(73) Assignee: Unova, Inc., Woodland Hills, CA (US)

Reexamination Request:
No. 90/007,926, Feb. 9, 2006

Reexamination Certificate for:
Patent No.: 4,709,202
Issued: Nov. 24, 1987
Appl. No.: 06/876,194
Filed: Jun. 19, 1986

Related U.S. Application Data

(60) Division of application No. 06/797,235, filed on Nov. 12, 1985, now Pat. No. 4,716,354, which is a continuation-in-part of application No. 06/612,588, filed on May 21, 1984, now Pat. No. 4,553,081, which is a continuation-in-part of application No. 06/385,830, filed on Jun. 7, 1982, now Pat. No. 4,455,523.

(51) Int. Cl.
*H02J 7/00* (2006.01)
*H02J 9/06* (2006.01)
*H01M 10/48* (2006.01)
*H01M 2/10* (2006.01)
*H01M 10/42* (2006.01)
*H01M 6/00* (2006.01)
*H01M 6/50* (2006.01)
*H01M 2/20* (2006.01)
*H01M 10/44* (2006.01)
*G06F 1/26* (2006.01)
*G01R 31/36* (2006.01)

(52) U.S. Cl. .................. 320/112; 320/131; 320/132; 320/149; 320/152; 320/DIG. 16; 320/DIG. 21; 340/636.12; 340/636.15; 340/636.17; 340/636.2

(58) Field of Classification Search .................. None
See application file for complete search history.

(56) References Cited

U.S. PATENT DOCUMENTS

| | | |
|---|---|---|
| 3,599,071 A | 8/1971 | Enghlen et al. |
| 3,683,258 A | 8/1972 | Harbonn |
| 3,740,636 A | 6/1973 | Hogrete |
| 3,754,182 A | 8/1973 | Morris et al. |
| 3,763,416 A | 10/1973 | Jache |
| 3,771,132 A | 11/1973 | Biewer |
| 3,775,659 A | 11/1973 | Carlsen, II |
| 3,823,388 A | 7/1974 | Chadima, Jr. et al. |
| 3,843,967 A | 10/1974 | Mulvany |
| 3,911,350 A | 10/1975 | Swope |
| 3,917,990 A | 11/1975 | Sherman, Jr. |
| 3,921,050 A | 11/1975 | Rowas |
| 3,928,792 A | 12/1975 | Mullersman et al. |
| 3,941,989 A | 3/1976 | McLaughlin et al. |
| 3,956,740 A | 5/1976 | Jones et al. |

(Continued)

*Primary Examiner*—Woo H Choi

(57) ABSTRACT

In an exemplary embodiment, a battery conditioning system monitors battery conditioning and includes a memory for storing data based thereon; for example, data may be stored representative of available battery capacity as measured during a deep discharge cycle. With a microprocessor monitoring battery operation of a portable unit, a measure of remaining battery capacity can be calculated and displayed. Where the microprocessor is permanently secured to the battery so as to receive operating power therefrom during storage and handling, the performance of a given battery in actual use can be accurately judged since the battery system can itself maintain a count of accumulated hours of use and other relevant parameters. Where an embodiment includes a main battery and a backup battery, the voltage of each may be individually measured, and each may be conditioned. Battery capacity of each may be measured. In a unique low voltage sensing circuit applicable to power sources generally, an automatic voltage regulator may itself sense a low power condition without requiring additional precision components. As an example only, such detected low power condition may be utilized to effect switch over to a backup battery or other auxiliary power supply.

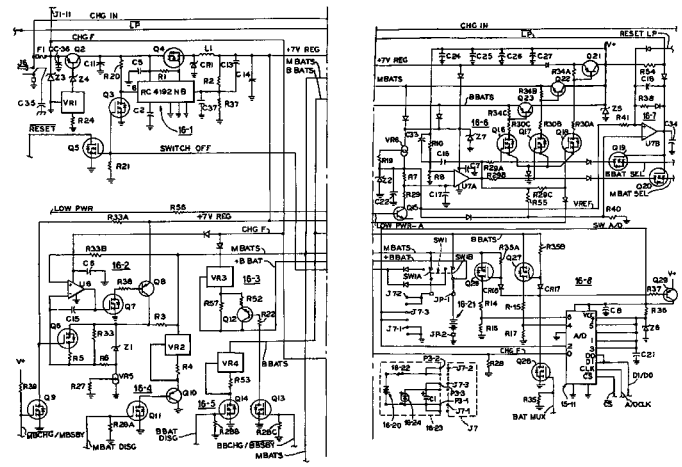

U.S. PATENT DOCUMENTS

| | | | |
|---|---|---|---|
| 3,965,740 A | 6/1976 | Martig, Jr. | |
| 3,969,667 A | 7/1976 | McWilliams | |
| 3,971,980 A | 7/1976 | Jungfer et al. | |
| 3,979,656 A | 9/1976 | Takeda et al. | |
| 3,997,834 A | 12/1976 | Winter et al. | |
| 4,001,550 A | 1/1977 | Schatz | |
| 4,017,725 A | 4/1977 | Roen | |
| 4,030,086 A | 6/1977 | Salem | |
| 4,045,720 A | 8/1977 | Alexandres | |
| 4,061,956 A | 12/1977 | Brown et al. | |
| 4,072,859 A | 2/1978 | McWaters | |
| 4,095,217 A | 6/1978 | Tani et al. | |
| 4,101,072 A | 7/1978 | Weaver et al. | 235/455 |
| 4,118,661 A | 10/1978 | Siekierski et al. | |
| 4,121,115 A | 10/1978 | De Mere | |
| 4,125,802 A | 11/1978 | Godard | |
| 4,127,803 A | 11/1978 | Etienne | |
| 4,140,957 A | 2/1979 | Rapp | |
| 4,143,417 A | 3/1979 | Wald et al. | |
| 4,455,523 A | 6/1984 | Koenck | 320/43 |
| 4,553,081 A | 11/1985 | Koenck | 320/43 |
| 4,716,354 A | 12/1987 | Hacker | 320/39 |

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 1–7, 10, 11, 18 and 22–80 is confirmed.

Claims 8, 9, 12–17 and 19–21 are cancelled.

* * * * *